(12) United States Patent
Someya

(10) Patent No.: US 7,650,128 B2
(45) Date of Patent: Jan. 19, 2010

(54) RADIO WAVE RECEPTION DEVICE, RADIO WAVE CLOCK, AND REPEATER

(75) Inventor: Kaoru Someya, Kiyose (JP)

(73) Assignee: Casio Computer Co., Ltd., Tokyo (JP)

( * ) Notice: Subject to any disclaimer, the term of this patent is extended or adjusted under 35 U.S.C. 154(b) by 488 days.

(21) Appl. No.: 11/581,206

(22) Filed: Oct. 13, 2006

(65) Prior Publication Data

US 2007/0032212 A1     Feb. 8, 2007

Related U.S. Application Data

(60) Division of application No. 10/831,642, filed on Apr. 23, 2004, now Pat. No. 7,215,937, which is a continuation-in-part of application No. PCT/JP03/13257, filed on Oct. 16, 2003.

(30) Foreign Application Priority Data

| Oct. 16, 2002 | (JP) | ............................. 2002-301897 |
| Oct. 24, 2002 | (JP) | ............................. 2002-309733 |
| Nov. 27, 2002 | (JP) | ............................. 2002-343534 |
| Feb. 7, 2003 | (JP) | ............................. 2003-030857 |
| Feb. 7, 2003 | (JP) | ............................. 2003-030868 |

(51) Int. Cl.
*H04B 7/00* (2006.01)

(52) U.S. Cl. ............... 455/234.2; 455/234.1; 455/232.1; 455/247.1; 455/250.1; 455/251.1; 455/313; 455/315; 375/326; 375/327

(58) Field of Classification Search ... 455/232.1–253.2, 455/313–334, 136–139, 219, 355; 375/345, 375/326, 327, 338, 339; 330/254, 278, 129–142
See application file for complete search history.

(56) References Cited

U.S. PATENT DOCUMENTS 4,334,185 A * 6/1982 Turney et al. ............... 323/280

(Continued)

FOREIGN PATENT DOCUMENTS

EP          1 168 114 A2     1/2002

(Continued)

OTHER PUBLICATIONS

Japanese Office Action dated Jun. 19, 2007 (2 pages), issued in counterpart Japanese Application Serial No. 2002-343534.

(Continued)

*Primary Examiner*—Edward Urban
*Assistant Examiner*—Junpeng Chen
(74) *Attorney, Agent, or Firm*—Frishauf, Holtz, Goodman & Chick, P.C.

(57) ABSTRACT

A received low-frequency standard radio wave, which is an amplitude modulation signal, is converted to an intermediate frequency signal Sa, and is output to a detection circuit and an AGC circuit. The detection circuit and AGC circuit generates an RF control signal Sf1 and IF control signal Sf2 from the input intermediate frequency signal Sa, and controls an RF control circuit and IF control circuit by outputting the generated RF control signal Sf1 and IF control signal Sf2 to the RF control circuit and IF control circuit. By this a radio wave reception device can speed up AGC operation.

9 Claims, 31 Drawing Sheets

U.S. PATENT DOCUMENTS

| | | | |
|---|---|---|---|
| 5,150,075 A | 9/1992 | Hietala et al. | |
| 5,263,196 A | 11/1993 | Jasper | |
| 5,465,406 A | 11/1995 | Whitecar et al. | |
| 5,548,594 A * | 8/1996 | Nakamura | 370/347 |
| 5,745,847 A | 4/1998 | Matsuo | |
| 5,946,607 A | 8/1999 | Shiino et al. | |
| 5,974,040 A * | 10/1999 | Kimura | 370/337 |
| 6,088,583 A | 7/2000 | Shimizu et al. | |
| 6,101,373 A * | 8/2000 | Samuels | 455/234.1 |
| 6,122,331 A * | 9/2000 | Dumas | 375/345 |
| 6,169,585 B1 | 1/2001 | Hafemeister | |
| 6,311,049 B1 | 10/2001 | Yoshizawa | |
| 6,330,290 B1 | 12/2001 | Glas | |
| 6,392,479 B2 | 5/2002 | Miura | |
| 6,408,168 B1 | 6/2002 | Sessink | |
| 6,542,202 B2 | 4/2003 | Takeda et al. | |
| 6,650,878 B1 * | 11/2003 | Abe et al. | 455/232.1 |
| 6,745,016 B2 | 6/2004 | Iwata et al. | |
| 6,771,719 B1 * | 8/2004 | Koyama et al. | 375/345 |
| 6,965,656 B2 * | 11/2005 | Koizumi | 375/345 |
| 7,415,247 B1 | 8/2008 | Vaeisaenen | |
| 2002/0141513 A1 | 10/2002 | England | |
| 2002/0141517 A1 | 10/2002 | Hayashi | |
| 2002/0160733 A1 * | 10/2002 | Kajita | 455/234.1 |
| 2004/0127234 A1 * | 7/2004 | Gerrits et al. | 455/462 |
| 2004/0202051 A1 * | 10/2004 | Ihara et al. | 368/47 |
| 2005/0186928 A1 | 8/2005 | Miura | |
| 2006/0040630 A1 | 2/2006 | Mostov et al. | |
| 2007/0032212 A1 | 2/2007 | Someya | |
| 2007/0032214 A1 | 2/2007 | Someya | |
| 2007/0037537 A1 | 2/2007 | Someya | |

FOREIGN PATENT DOCUMENTS

| | | |
|---|---|---|
| EP | 1 172 932 A2 | 1/2002 |
| JP | 57-147336 A | 9/1982 |
| JP | 61-129924 A | 6/1986 |
| JP | 8-84084 A | 3/1996 |
| JP | 11-177358 A | 7/1999 |
| JP | 2000-40978 A | 2/2000 |
| JP | 2001-108770 A | 4/2001 |
| JP | 2001-244765 A | 9/2001 |
| JP | 2002-218338 A | 8/2002 |
| JP | 2002-290178 A | 10/2002 |
| WO | WO 92/22135 A1 | 12/1992 |

OTHER PUBLICATIONS

Japanese Office Action dated Sep. 24, 2008 (2 pages), issued in counterpart Japanese Application Serial No. 2002-309733.

* cited by examiner

FIG. 5A  SIGNAL Sa 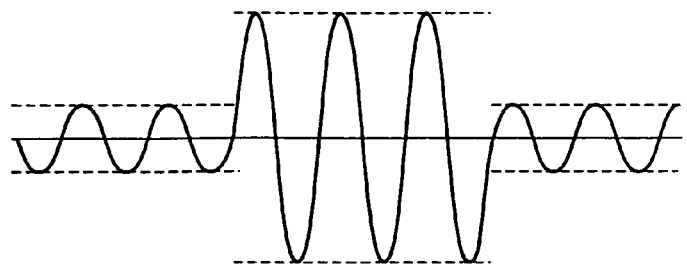
FIG. 5B  SIGNAL Sb 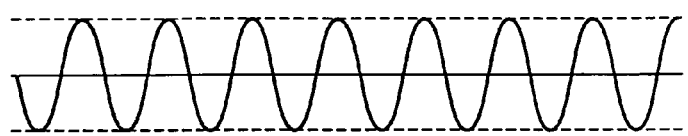
FIG. 5C  SIGNAL Sc' 
FIG. 5D  SIGNAL Sd 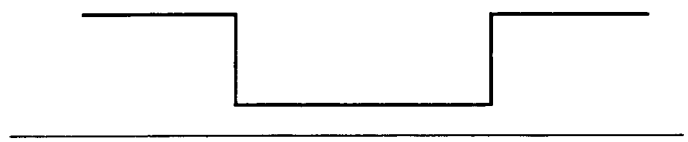
FIG. 5E  SIGNAL Se 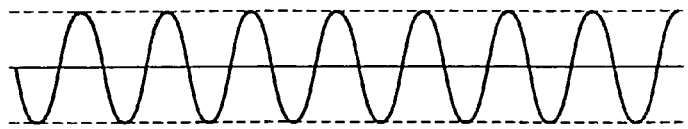

SIGNAL Sa

SIGNAL Sb

SIGNAL Sd1

SIGNAL Sd2

SIGNAL Se

FIG. 15A SIGNAL Sa 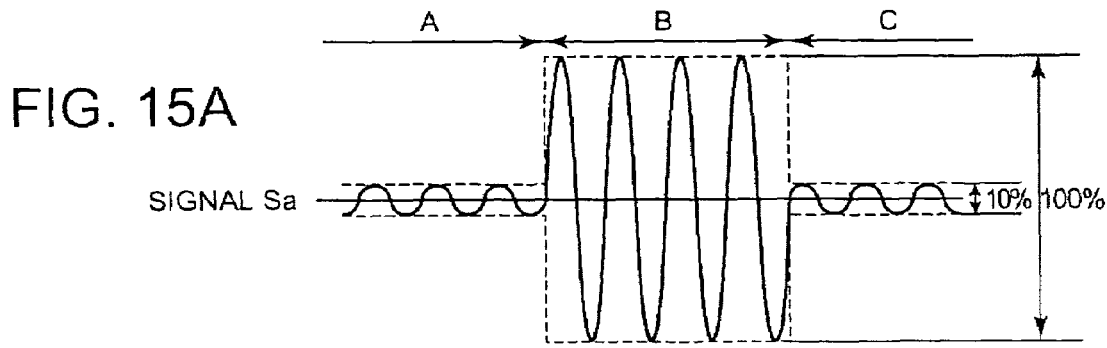
FIG. 15B SIGNAL Sb' 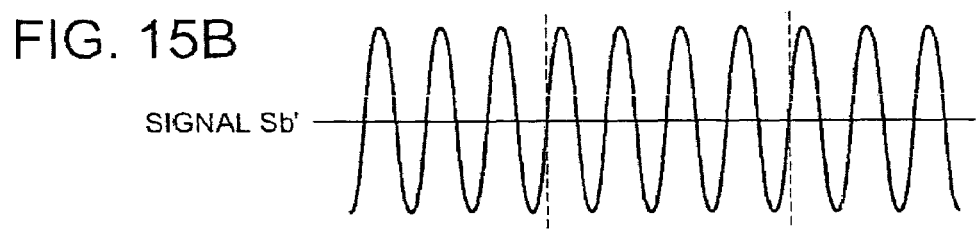
FIG. 15C SIGNAL Sc 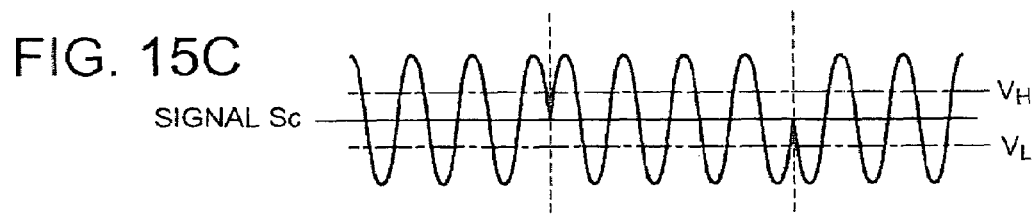
FIG. 15D SIGNAL Sd 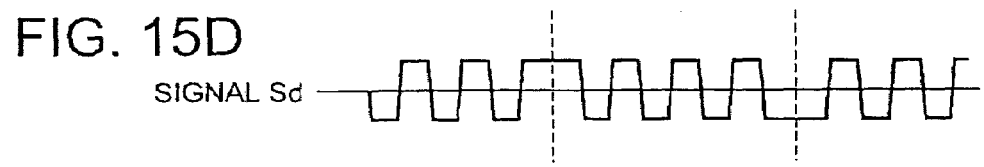
FIG. 15E SIGNAL Se 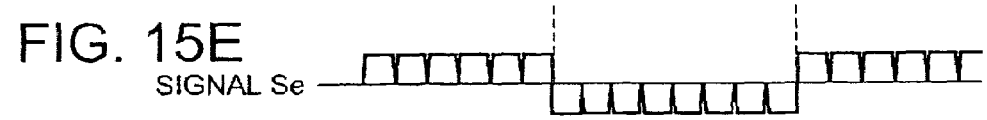
FIG. 15F SIGNAL Sf 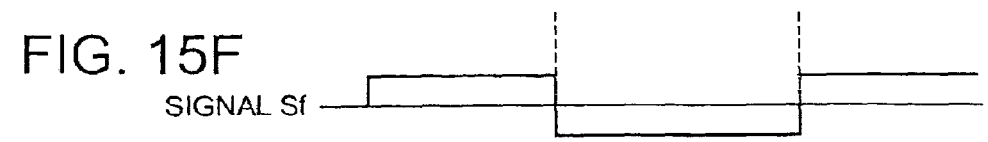

SIGNAL Sa

SIGNAL Sb'

SIGNAL Sc

SIGNAL Sd

SIGNAL Se

SIGNAL Sf

RADIO WAVE RECEPTION DEVICE, RADIO WAVE CLOCK, AND REPEATER

CROSS-REFERENCE TO RELATED APPLICATIONS

This application is a Divisional Application of application Ser. No. 10/831,642 filed Apr. 23, 2004, now U.S. Pat. No. 7,215,937, which is a Continuation-in-Part Application of International Application No. PCT/JP03/13257 filed Oct. 16, 2003. This application is also based upon and claims the benefit of priority from the prior Japanese Patent Application No.2002-301897, filed Oct. 16, 2002, Japanese Patent Application No.2002-309733, filed Oct. 24, 2002, Japanese Patent Application No.2003-343534, filed Nov. 27, 2002, Japanese Patent Application No.2003-030857, filed Feb. 7, 2003, and Japanese Patent Application No.2003-030868, filed Feb. 7, 2003. The entire contents of all of said prior applications are incorporated herein by reference.

TECHNICAL FIELD

The present invention relates to a radio wave reception device, radio wave clock, and repeater.

BACKGROUND ART

Nowadays, low-frequency standard radio wave containing time data (that is, a time code) are transmitted in various countries (for example, Germany, the United Kingdom, Switzerland, Japan, and so forth). In Japan, 40-kHz and 60-kHz low-frequency standard radio wave that have been subjected to amplitude modulation using a time code having a format shown in FIG. 11, are transmitted from two transmission facilities (located in Fukushima Prefecture and Saga Prefecture). The time code comprises a plurality of frame is defined to have a time cycle of 60 seconds. According to FIG. 11, the time code is transmitted in a frame every time the figure representing the minute of an accurate time is updated (that is every minute).

A radio wave clock that receives a time code, and corrects time data of a time circuit by the time code, is known. In this kind of radio wave clock, there is comprised an AGC (Auto Gain Control) circuit that controls a gain of an amplification circuit, according to the intensity of the signal level after the amplification of the signal, output from the amplification circuit, so that the precise time can be corrected in an internal circuit even though the signal level of the received radio wave fluctuates.

In this AGC circuit, gain control of the amplification circuit was carried out by filtering the amplified signal. Therefore, a filter having a large enough time constant than the cycle of the modulation signal. Namely, because the cycle of the low-frequency standard radio wave is one second, a filter with a large time constant is necessary, and by this, a problem of a large delay until the transient operation of the AGC circuit becomes constant, occurs.

Furthermore, at a stage of actually constructing the whole circuit, the circuit needs to be designed, taking into consideration, several tens of seconds of delay, to prevent occurrence of ripples. By this, reduction in delay by contriving the filter included in the AGC circuit, namely, speeding up the AGC operation is difficult.

In a case where a weak radio wave is received by the radio wave reception device, it is difficult to carry out stable detection, due to noise, etc. included in the radio wave.

Furthermore, it is general that a filter for emitting noise is applied when carrying out detection for radio waves. Because a filter has a constant pass band, the filter allows noise components that are close to the frequencies that are to be allowed to pass through, to also pass through. If the pass band is narrowed, time delay occurs, and effected the signal processing, etc., thereafter.

DISCLOSURE OF INVENTION

One object of the present invention is to speed up the AGC operation in the radio wave reception device, etc.

Another object of the present invention is to provide a radio wave reception device that can stably receive weak radio waves.

Still another object of the present invention is to provide a radio wave reception device and radio wave clock, that reduces noise and delay time.

BRIEF DESCRIPTION OF DRAWINGS

These objects and other objects and advantages of the present invention will become more apparent upon reading of the following detailed description and the accompanying drawings in which:

FIG. 5A is a diagram showing the outline wave shape of a signal in the radio wave reception device of the first embodiment;

FIG. 5B is a diagram showing the outline wave shape of a signal Sb in the radio wave reception device of the first embodiment;

FIG. 5C is a diagram showing the outline wave shape of a signal Sc in the radio wave reception device of the first embodiment;

FIG. 5D is a diagram showing the outline wave shape of a signal Sd in the radio wave reception device of the first embodiment;

FIG. 5E is a diagram showing the outline wave shape of a signal Se in the radio wave reception device of the first embodiment;

FIG. 15A is a diagram showing the outline wave shape of the signal Sa in the radio wave reception device of the third embodiment;

FIG. 15B is a diagram showing the outline wave shape of the signal Sb' in the radio wave reception device of the third embodiment;

FIG. 15C is a diagram showing the outline wave shape of the signal Sc in the radio wave reception device of the third embodiment;

FIG. 15D is a diagram showing the outline wave shape of the signal Sd in the radio wave reception device of the third embodiment;

FIG. 15E is a diagram showing the outline wave shape of the signal Se in the radio wave reception device of the third embodiment;

FIG. 15F is a diagram showing the outline wave shape of the signal Sf in the radio wave reception device of the third embodiment;

BEST MODE FOR CARRYING OUT THE INVENTION

The embodiments of the present invention will be described below with reference to the drawings. In the embodiments of the present invention, a case where the present invention is applied to a radio wave clock and a translator will be described. However, the present invention is not limited to a radio wave clock and a repeater, and any device that receives a radio wave can be applied.

First Embodiment

First, the first embodiment of the present invention will be described below with reference to FIGS. 1 to 5E.

Figure 1:
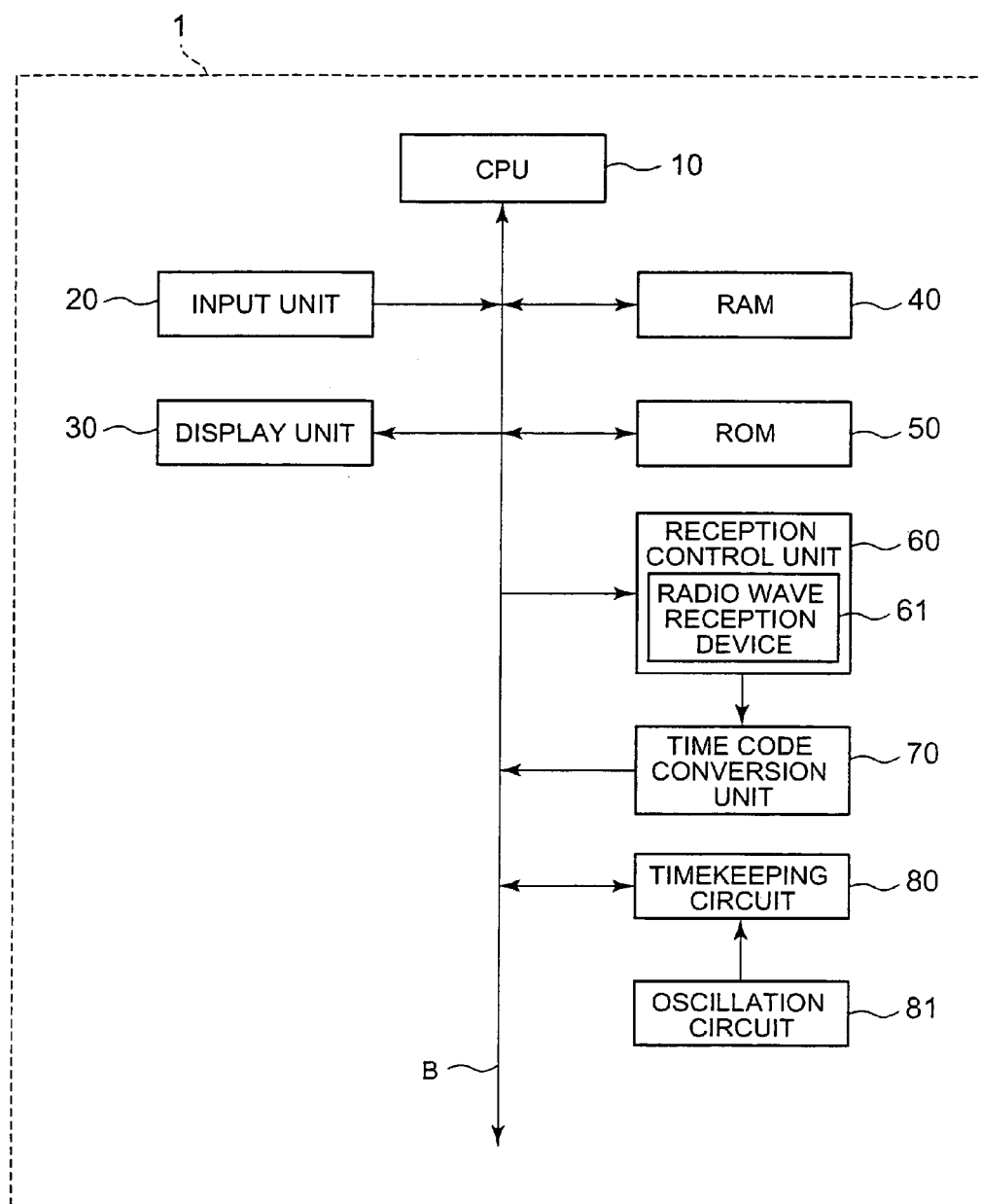
FIG. 1 is a diagram showing the circuit structure of a radio wave clock.

FIG. 1 is a diagram showing an example of a circuit structure of a radio wave clock 1, of this embodiment. According to FIG. 1, the radio wave clock 1 comprises a CPU (Central Processing Unit) 10, an input unit 20, a display unit 30, a RAM (Random Access Memory) 40, a ROM (Read Only Memory) 50, a reception control unit 60, a timekeeping circuit 80, an oscillation circuit 81, and a time code conversion unit 70. Each unit except for the oscillation circuit unit 81 is connected to a bus B. The oscillation circuit 81 is connected to the timekeeping circuit 80.

The CPU 10 reads out various programs stored in the ROM 50 at a predetermined timing or in accordance with an operation signal or the like input from the input unit 20, and develops the read-out programs in the RAM 40 in order to give instructions and supply data to each unit. Particularly, the CPU 10 performs various control, such as controlling the reception control unit 60 at every predetermined interval to perform an operation for receiving a standard radio wave, correcting data representing a current time which is kept by the timekeeping circuit 80 based on a standard time code input by the time code conversion unit 70, and outputting a display signal based on the corrected current time data to the display unit 30 to make the displayed time updated.

The input unit 20 comprises switches for controlling the radio wave clock 1 to perform various functions. When any of these switches is operated, an operation signal is output to the CPU 10.

The display unit 30 is constituted by a compact liquid crystal display or the like, and digitally displays data from the CPU 10, for example, the current time data kept by the time keeping circuit 80.

The RAM 40 stores the data processed by the CPU 10, and outputs the stored data to the CPU 10, under the control of the CPU 10.

The ROM 50 mainly stores system programs and application programs relating to the radio wave clock 1.

The reception control unit 60 comprises a radio wave reception device 61. The radio wave reception device 61 cuts off unnecessary frequency components from a low-frequency standard radio wave received by an antenna to pick out a targeted frequency signal and converts and outputs the target frequency signal to an intermediate frequency signal.

The timekeeping circuit 80 counts signals input from the oscillation circuit 81, and obtains the current time data and the like. The timekeeping circuit 80 outputs the obtained current timed data to the CPU 10. The oscillation circuit 81 outputs a signal having a constant frequency all the time.

The time code conversion unit 70 generates a standard time code including data necessary to function as a clock, such as a standard time code, a count-up code, a day code, etc., based on the signal output from the radio wave reception device, and outputs the generated standard time code to the CPU.

Figure 2:
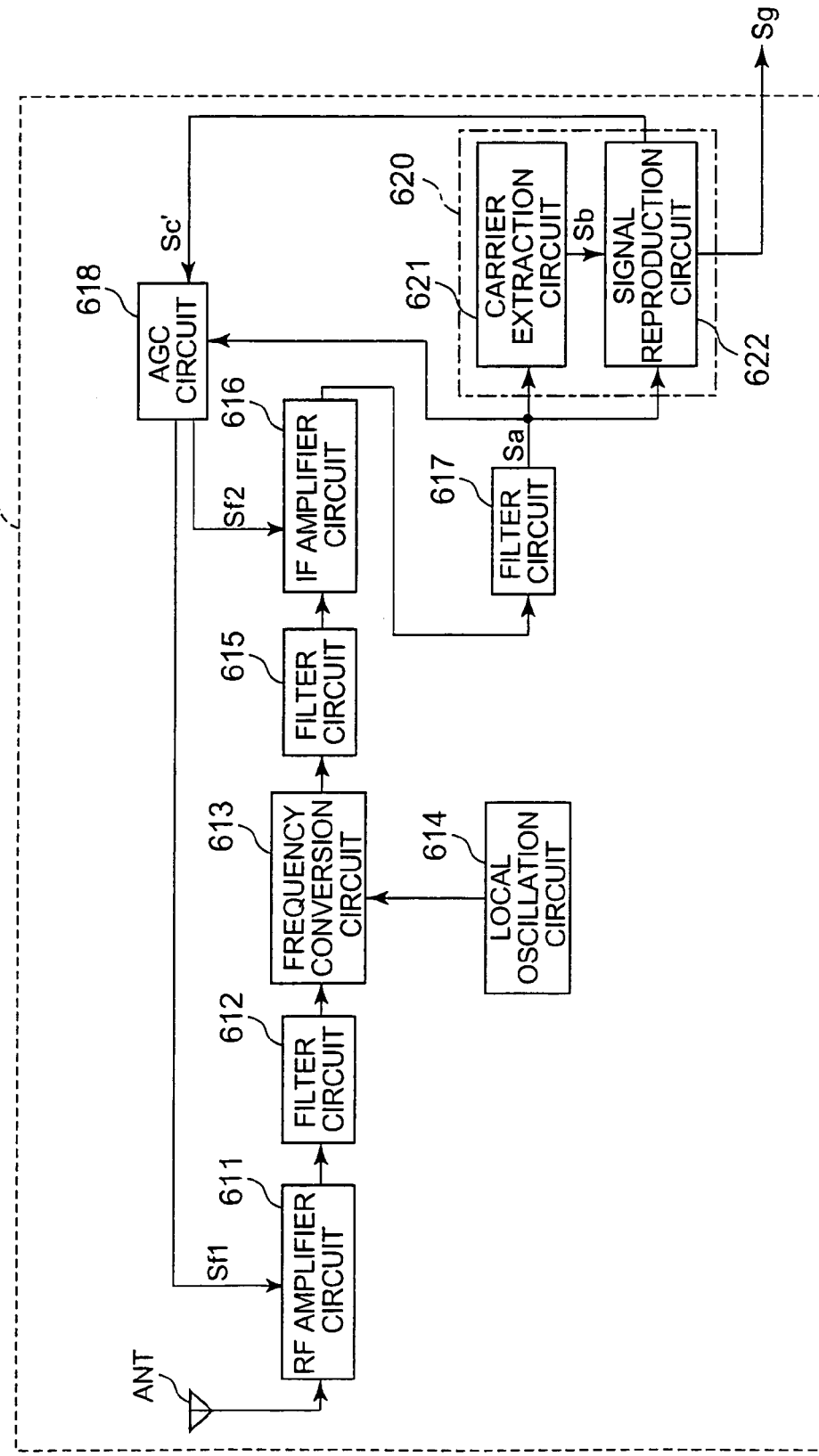
FIG. 2 is a block diagram showing the circuit structure of the radio wave reception device, of the first and second embodiment.

FIG. 2 is a block diagram showing a circuit structure of the radio wave reception device 61 employing a super heterodyne type according to the first embodiment. According to FIG. 2, the radio wave reception device 61 comprises an antenna ANT, an RF amplifier circuit 611, filter circuits 612, 615, 617, a frequency conversion circuit 613, a local oscillation circuit 614, an IF amplifier circuit 616, an AGC (Auto Gain Control) circuit 618, and a detection circuit 620.

The antenna ANT can receive low-frequency standard radio wave, and is constituted by, for example, a bar antenna. A received radio wave is converted into an electric signal and then output.

The electric signal output from the antenna ANT, and an RF control signal Sf1 output from the AGC circuit 618, are input to the RF amplifier circuit 611. The RF amplifier circuit 611 amplifies, and outputs the electric signal input from the antenna ANT, in accordance with the RF control signal Sf1.

The signal output from the RF amplifier circuit 611 is input to the filter circuit 612. The filter circuit 612 allows a predetermined range of frequencies to pass through, relating to the input signal, i.e. outputs the signal, cutting off frequency components that are outside the range.

The signal output from the filter circuit 612, and the signal output from the local oscillation circuit 614 is input to the frequency conversion circuit 613. The frequency conversion circuit 613 mixes the two signals that are input, and outputs the signals as an intermediate frequency signal. The local oscillation circuit 614 generates and outputs the signal of the local oscillation frequency.

The intermediate frequency signal output from the frequency conversion circuit 613 is input to the filter circuit 615. Then, the filter circuit 615 allows signal components having frequencies of a predetermined range to pass through, where the intermediate frequency of the intermediate frequency signal is placed in the center, i.e. outputs the signal cutting off the frequency components that are out of the range.

The signal output from the filter circuit 616 and an IF control signal Sf2 output from the AGC circuit 618 is input to the IF amplifier circuit. The IF amplifier circuit 616 amplifies and outputs the signal input from the filter circuit 615m in accordance with the IF control signal Sf2.

The signal output from the IF amplifier circuit 616 is input to the filter circuit 617. Then, the filter circuit 617 allows signal components having a predetermined range of frequencies to pass through, relating to the input signal, i.e. outputs the signal Sa, cutting off frequency components that are out of the range.

The detection circuit 620 comprises a carrier extraction circuit 621 and a signal reproduction circuit 622.

The carrier extraction circuit is comprised of for example a PLL (Phase Locked Loop) circuit. The signal Sa, output from the filter circuit 617, is input to the carrier extraction circuit 621. Then, a signal Sb wherein the signal level is a fixed standard signal that has the same frequency and phase of signal Sa, is output.

The signal Sa output from the filter circuit 617, and the signal Sb output from the carrier extraction circuit 621 are input to the signal reproduction circuit 622. Then, the signal reproduction circuit 622 outputs a signal Sc and a signal Sg, that corresponds to a baseband signal of signal Sa (namely, the signal that reproduces the signal Sa).

The signal Sa output from the filter circuit 617, and the signal Sc output from the signal reproduction circuit 622 are input to the AGC circuit 618. The AGC circuit 618 outputs RF control signals f1 and f2 that control the amplification of the gain of the RF amplifier circuit 611 and IF amplifier circuit 616, in accordance with the intensity (signal level) of the signal Sa.

Figure 3:
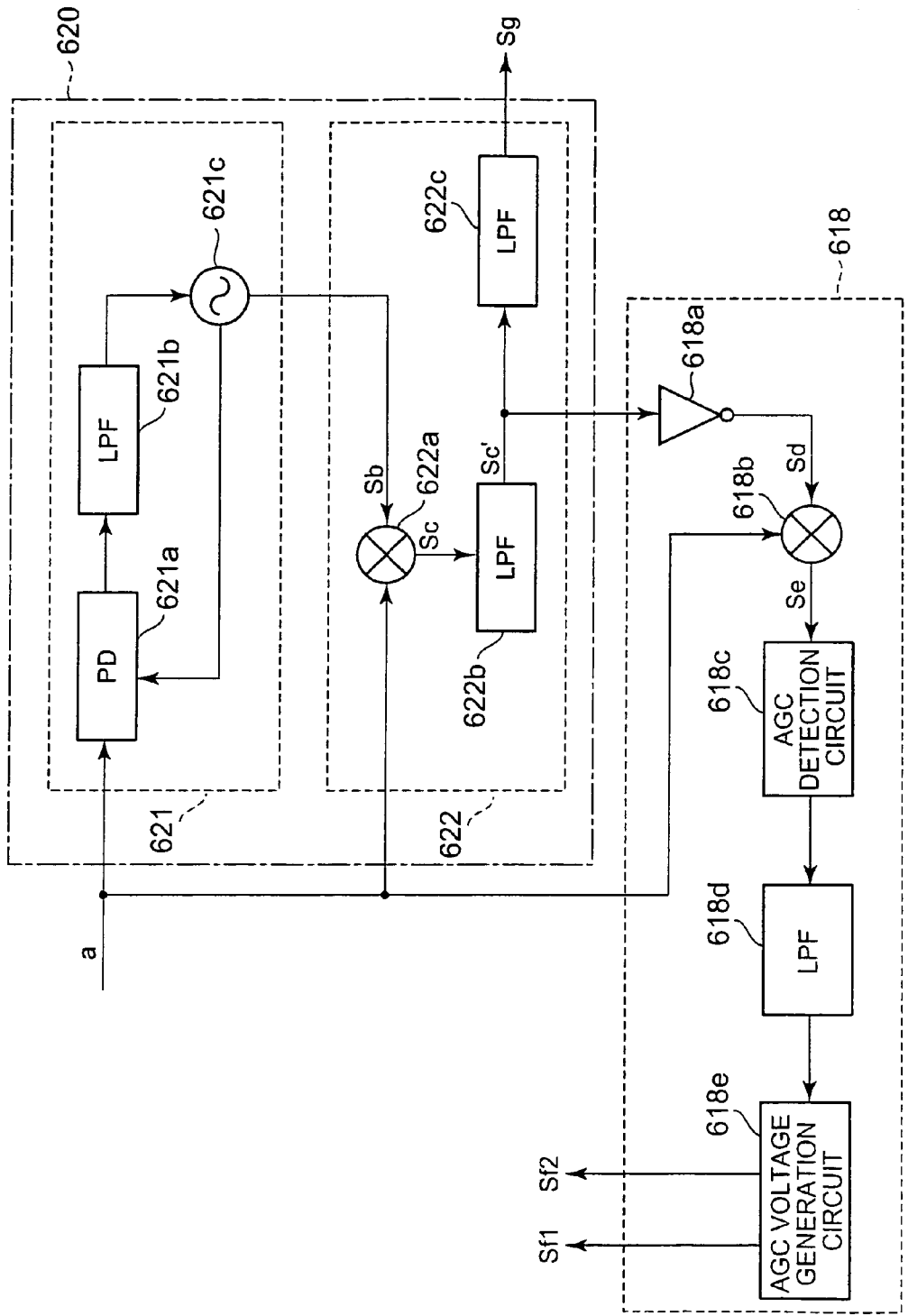
FIG. 3 is a block diagram showing the circuit structure of the detection circuit and AGC circuit, of the first embodiment.

FIG. 3 is a circuit block diagram showing an example of the circuit structure of the AGC circuit 618 and the detection circuit 620 that constitutes the radio wave reception device 61. According to FIG. 3, the carrier extraction circuit 621 comprises a PD (Phase Detector) 621a, an LPF (Low Pass Filter) 621b, and an oscillator 621c.

The signal Sa output from the filter circuit 617 and the signal output from the oscillator 621c are input to the PD 621a. The PD 621a compares the phases of the two input signals, and outputs a phase-difference signal having a signal level corresponding to the detected phase difference.

The phase-difference signal output from the PD 621a, is input to the LPF 621b. The LPF 621b allows signal components having frequencies of a predetermined low frequency range (low pass) to pass through, i.e. outputs the signal, cutting off the frequency components that are out of the range.

The signal output from the LPF 621b is input to the oscillator 621c. The oscillator 621c adjusts the oscillation frequency difference of the signal that is to be amplified, based on the input signal, so that the phase of the signal that is to be amplified becomes the same phase as the signal Sb of the carrier. After the adjustment, the oscillator 621c outputs the adjusted signal as signal Sb.

The signal reproduction circuit 622 comprises a multiplier 622a, and LPFs 622b, 622c.

The signal Sa output from the filter circuit 617 and the signal Sb output from the oscillator 621c are input to the multiplier (mixer) 622a. The multiplier 622a multiplies the signal Sa and the signal Sb, and outputs the multiplied signal as Sc.

The signal Sc output from the multiplier 622a is input to the LPF 622b. The LPF 622b allows a predetermined range (low pass) of frequencies of the signal Sc to pass through, i.e. outputs a signal Sc' that cuts off the frequency components that are out of the range. By the LPF 622b, the high frequency components of the signal Sa is cut off, and a signal (reproduced signal) that is nearly equal to the baseband signal of signal Sa is gained.

The signal Sc' output from the LPF 622b is input to the LPF 622c. Then, the LPF 622c allows a predetermined range (low pass) of frequencies, relating to the signal Sc', and outputs a signal Sg that cuts off the frequency components that are out of the range. The signal Sg corresponds to the data signal of the low-frequency standard radio wave (reproduced signal) gained by the radio wave reception device 61.

The AGC circuit 618 comprises an inverting amplifier 618a, a multiplier 618b, an AGC detection circuit 618c, an LPF 618d, and an AGC voltage generation circuit 618e.

The signal Sc' output from the LPF 622b is input to the inverting amplifier 618a. The inverting amplifier 618a inverts and amplifies the signal Sc' and outputs the inverted and amplified signal as signal Sd.

The signal Sa output from the filter circuit 617 and the signal Sd output from the inverting amplifier 618a are input to the multiplier 618b. Then, the multiplier 618b multiplies the signal Sa and signal Sd, and outputs the multiplied signal as signal Se.

The signal Se output from the multiplier 618b is input to the AGC detection circuit 618c. Then, the AGC detection circuit 618c detects the input signal Se (for example, by peak detection), and outputs a signal after detection.

The signal output from the AGC detection circuit 618c is input to the LPF 618d. Then, the LPF 618d allows signal components having a predetermined range (low pass) of frequencies, relating to the input signal, to pass through, i.e. outputs a signal, cutting off the frequencies that are out of the range.

The signal output from the LPF 618d is input to the AGC voltage generation circuit 618e. Then, in accordance with the input level of signal, the AGC voltage generation circuit 618e outputs an RF control signal Sf1 and IF control signal Sf2 respectively controlling the amplification of the RF amplification circuit 611 and the IF amplification circuit 616.

Figure 4:
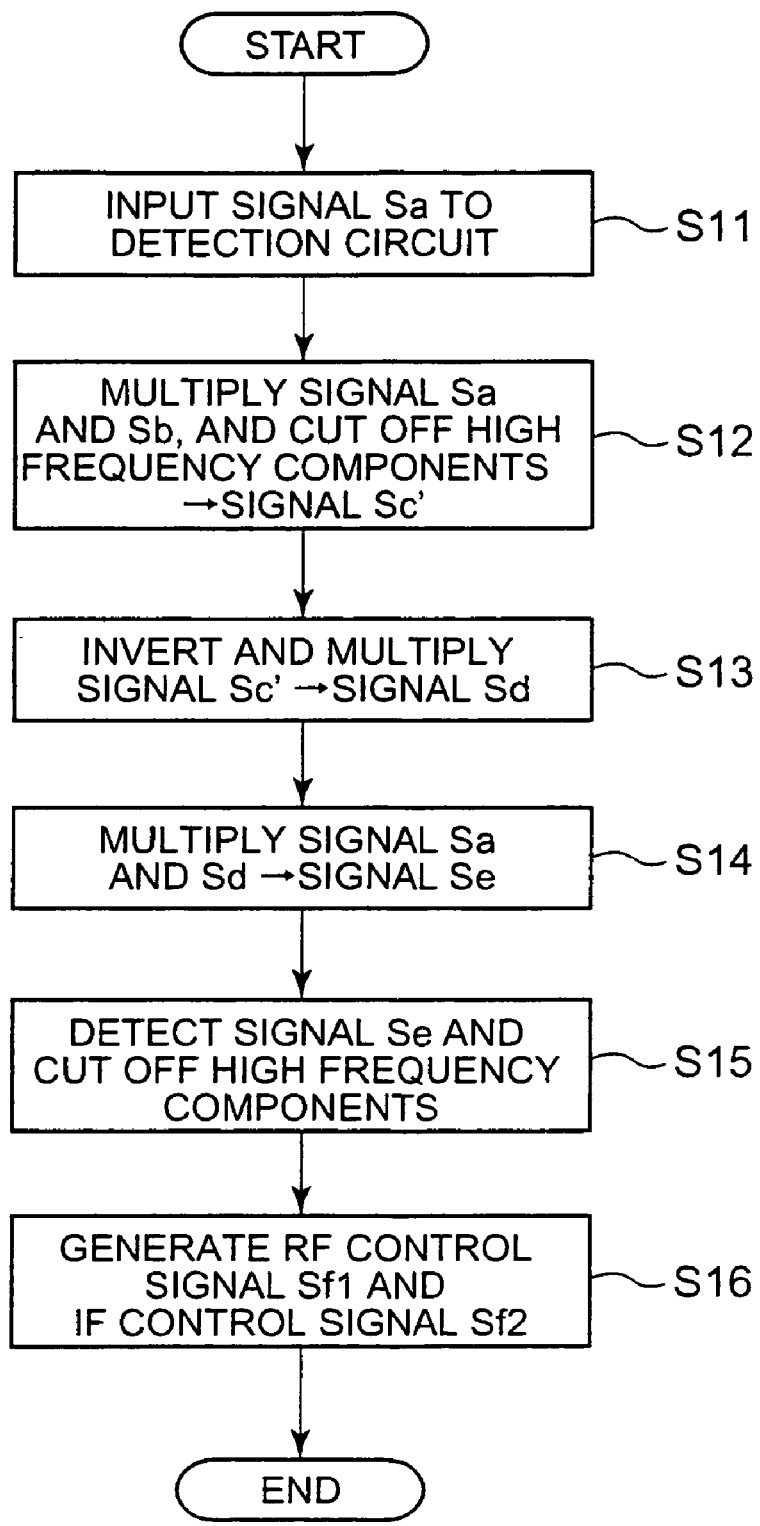
FIG. 4 is a flow chart showing the processing of the radio wave reception device of the first embodiment.

Next, the operation of the radio wave reception device 61 will be described. FIG. 4 is a flowchart showing the processing of the radio wave reception device 61 of the present embodiment, and FIGS. 5A to 5E are diagrams showing an outline wave shape of each signal that goes through the radio wave reception device 61.

According to FIG. 4, firstly, the low-frequency standard radio wave received by the antenna ANT is converted to an electric signal and output to the RF amplifier circuit 611. The RF amplifier circuit 611 amplifies (attenuates) the input electric signal, in accordance with the RF control signal Sf1 input from the AGC circuit 618, and outputs the amplified (attenuated) signal to the frequency conversion circuit 613 via the filter circuit 612.

Next, the frequency conversion circuit 613 converts the input signal to a predetermined intermediate frequency signal and outputs the signal to the IF amplifier circuit 616 via the filter circuit 615. The IF amplifier circuit 616 amplifies (attenuates) the input signal, in accordance with the IF control signal Sf2 input from the AGC circuit 618, and outputs the amplified (attenuated) signal as the signal Sa, to the detection circuit 20 via the filter circuit 612 (Step S11). Here, as shown in FIG. 5A, the signal Sa is a signal that has an amplitude modulation of 10% and 100%.

Then, in the detection circuit 620, the carrier extraction circuit 621 outputs the signal Sb that is synchronized with the phase of the carrier of signal Sa. Then, the multiplier 622a of the signal reproduction circuit 622 multiplies the signal Sa and signal Sb, and outputs the multiplied signal as signal Sc.

The signal Sc is cut off the high frequency components by the LPF 622b, and as shown in FIG. 5C, is output as the signal Sc' that is nearly equal to the baseband signal of signal Sa (Step S12).

The inverting amplifier 618a of the AGC circuit 618, inverts and amplifies the signal Sc', and outputs the signal as signal Sd (Step S13). Then, the multiplier 618b multiplies the signal Sa and the signal Sd, and outputs the multiplied signal as signal Se (Step S14). Namely, as shown in FIG. 5E, the signal Se is output as a signal where the peak magnitude of the signal Sa is approximately constant.

Next, the AGC detection circuit 618c detects (for example peak detects) the signal Se, and the detected signal is output to the LPF 618d. The high-frequency components are cut off, and is output to the AGC voltage generation circuit 618e (Step S15).

The AGC voltage generation circuit 618c generates and outputs the RF control signal Sf1 for controlling the amplification of the RF amplifier circuit 611 and IF control signal Sf2 for controlling the amplification of the IF amplifier circuit 616, in accordance with the signal level of the input signal.

In this way, the radio wave reception device 61 multiplies the signal Sa that is an intermediate frequency signal and signal Sd that inverted and amplified the signal Sc' (more accurately, the signal Sg is a reproduced signal and the signal Sc' is approximately equivalent to a reproduced signal), namely, the radio wave reception device 61 modulates (inverse modulates) the signal Sa at the signal Sc', and generates the RF control signal Sf1 that controls the amplification of the RF amplifier circuit 611 and the IF control signal Sf2 that controls the amplification of the IF amplifier circuit 616. In other words, ideally, because the AGC detection circuit 618c detects the signal Se that has only the intermediate frequency components, it is not necessary to place a filter having a larger time constant than the cycle of the received amplitude modulation signal to perform the AGC operation, and a high speed AGC operation, without relying to the cycle of the amplitude modulation signal is realized.

Second Embodiment

Next, the second embodiment will be described with reference to FIGS. 6 to 8E.

Figure 6:
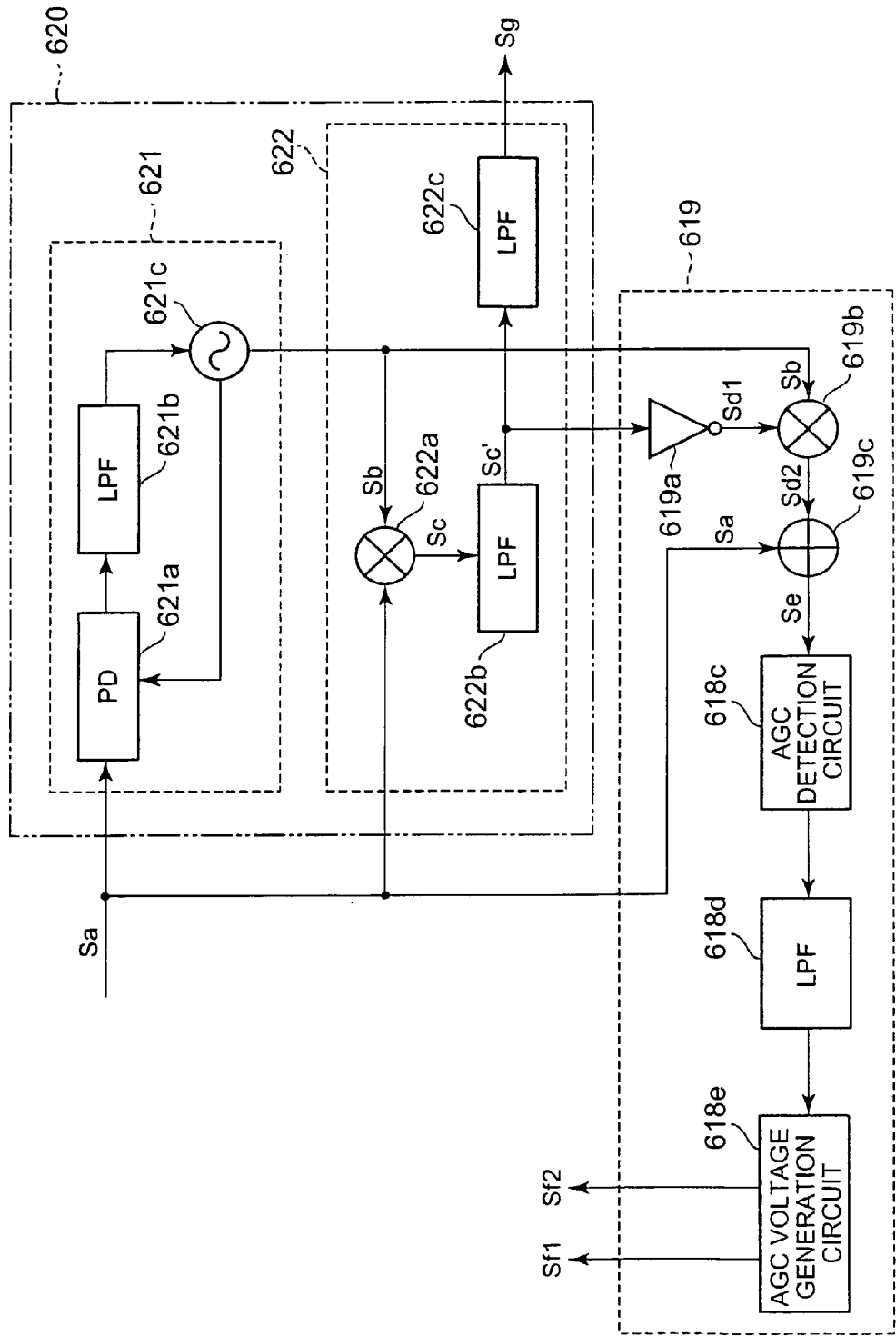
FIG. 6 is a block diagram showing the circuit structure of the detection circuit and the AGC circuit of the second embodiment.

The structure of the radio wave clock 1 of the second embodiment, is the same structure except for the AGC circuit 618 of the radio wave reception device 61 in the first embodiment, being replaced with an AGC circuit 619 shown in FIG. 6. Therefore, descriptions for the overlapping parts will be omitted by putting the same reference numerals.

FIG. 6 is a block diagram showing an example of a circuit structure of the carrier extraction circuit 621, signal reproduction circuit 622, and AGC circuit 619 of the present embodiment. According to FIG. 6, the AGC circuit 619 comprises an inverting amplifier 619a, a multiplier 619b, an adder 619c, an AGC detection circuit 618c, an LPF 618d, and an AGC voltage generation circuit 618e.

The signal Sc' input from the LPF 622b is input to the inverting amplifier 619a. Then, the inverting amplifier 619a inverts and amplifies the signal Sc' and outputs the inverted and amplified signal Sd1.

The signal Sb output from the oscillator 621c and the signal Sd1 output from the inverting amplifier are input to the multiplier 619b. Then, the multiplier 619b multiplies the signal Sb and signal Sd1, and outputs the multiplied signal Sd2.

The signal Sa output from the filter circuit 617 and the signal Sd2 output from the multiplier 619b, are input to the adder 619c. Then, the adder 619c adds the signal Sa and the signal Sd2, and outputs the added signal Se.

Figure 7:
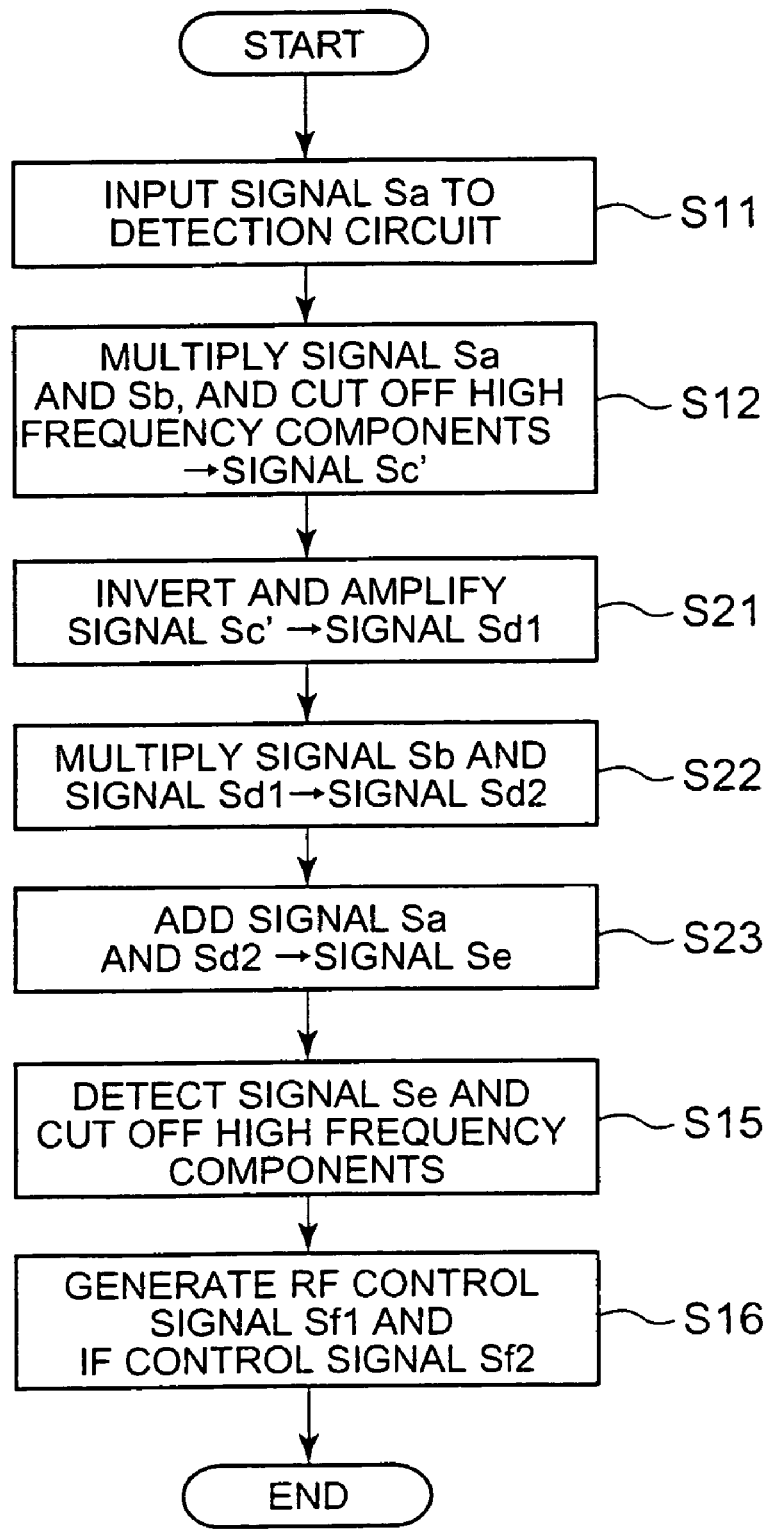
FIG. 7 is a flow chart showing the processing of the radio wave reception device of the second embodiment.

Next, the operation of the radio wave reception device of the present embodiment will be described. FIG. 7 is a flowchart showing the process of the radio wave reception device 61 of the present embodiment, and FIGS. 8A to 8E are diagrams showing an outline wave shape of each signal that goes through the radio wave reception device 61. Additionally, only the operation of the AGC circuit 619 of the operation of the radio wave reception device 61 of the present embodiment, differs from the above first embodiment. Therefore, in FIG. 7, the same steps as FIG. 4 will be put the same step number as FIG. 4, and will be described focusing on the different parts.

Figure 8A:
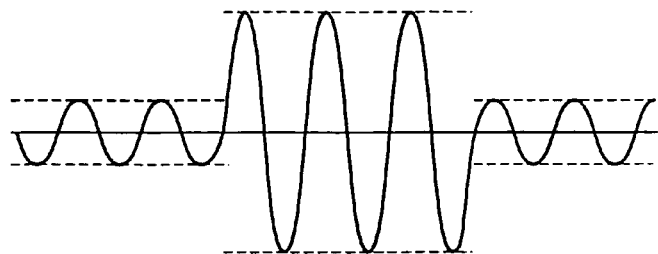
FIG. 8A is a diagram showing the outline wave shape of the signal Sa that goes through the radio wave reception device of the second embodiment.
Figure 8B:
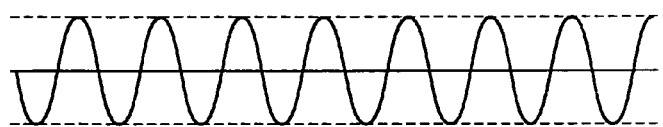
FIG. 8B is a diagram showing the outline wave shape of the signal Sb that goes through the radio wave reception of the second embodiment.
Figure 8C:
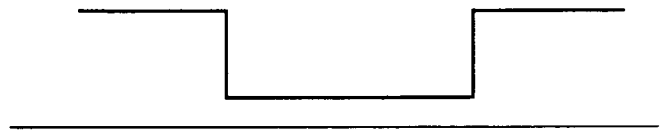
FIG. 8C is a diagram showing the outline wave shape of the signal Sd1 that goes through the radio wave reception device of the second embodiment.
Figure 8D:
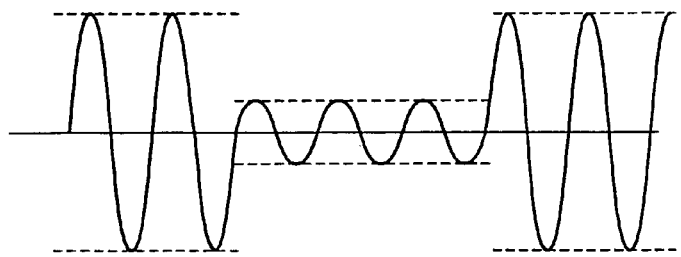
FIG. 8D is a diagram showing the outline wave shape of the signal Sd2 that goes through the radio wave reception device of the second embodiment.

Namely, when the signal Sc' is output from the LPF 622b (Step S11 to S12), the inverting amplifier 619a of the AGC circuit 619, inverts and amplifies the signal Sc', and outputs the inverted and amplified signal Sd1 (Step S21). As shown in FIG. 8C, the signal Sd1 is a signal that almost corresponds to the inverted baseband signal of signal Sa.

Figure 8E:
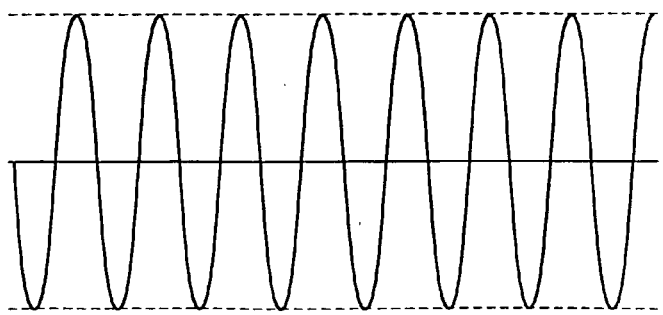
FIG. 8E is a diagram showing the outline wave shape of the signal Se that goes through the radio wave reception device of the second embodiment.

Next, the multiplier 619b multiplies the signal Sb and signal Sd1, and outputs the multiplied signal Sd2 (Step S22). Sequentially, the adder 619c adds the signal Sa and signal Sd2, and outputs the added signal Se (Step S23). Namely, as shown in FIG. 8E, the signal Se is output as a signal that has a constant signal level, and has the same frequency and same phase as the signal Sa.

Then, the AGC detection circuit 618 detects the signal Se, and the detected signal is output to the AGC voltage generation circuit 618e via the LPF 618d, and the AGC voltage generation circuit 618e generates and outputs the RF control signal Sf1 and IF control signal Sf2 (Step S15 to S16).

In this way, the radio wave reception device 61 multiplies the signal Sb that is the standard signal and the signal Sd1 that inverted and amplified the signal Sc' that was regenerated by the signal Sd1, namely, the signal Sb is modulated at the signal Sd1, and the modulated signal Sd1 is added to the signal Sa that is the intermediate frequency signal and according to the signal level of the added signal Se, the RF control signal Sf1 that controls the amplification of the RF amplifier circuit 611 and the IF control signal Sf2 that controls the amplification of the IF amplifier circuit, can be generated. Namely, ideally, because the AGC detection circuit 618c detects the signal Se that has only the intermediate frequency components, it is not necessary to place a filter having a larger time constant than the cycle of the received amplitude modulation signal to perform the AGC operation, and a high speed AGC operation, without relying to the cycle of the amplitude modulation signal is realized.

The first and second embodiment is not limited to the above embodiments, and various embodiments and changes may be made thereunto without departing from the broad spirit and scope of the invention.

Figure 10:
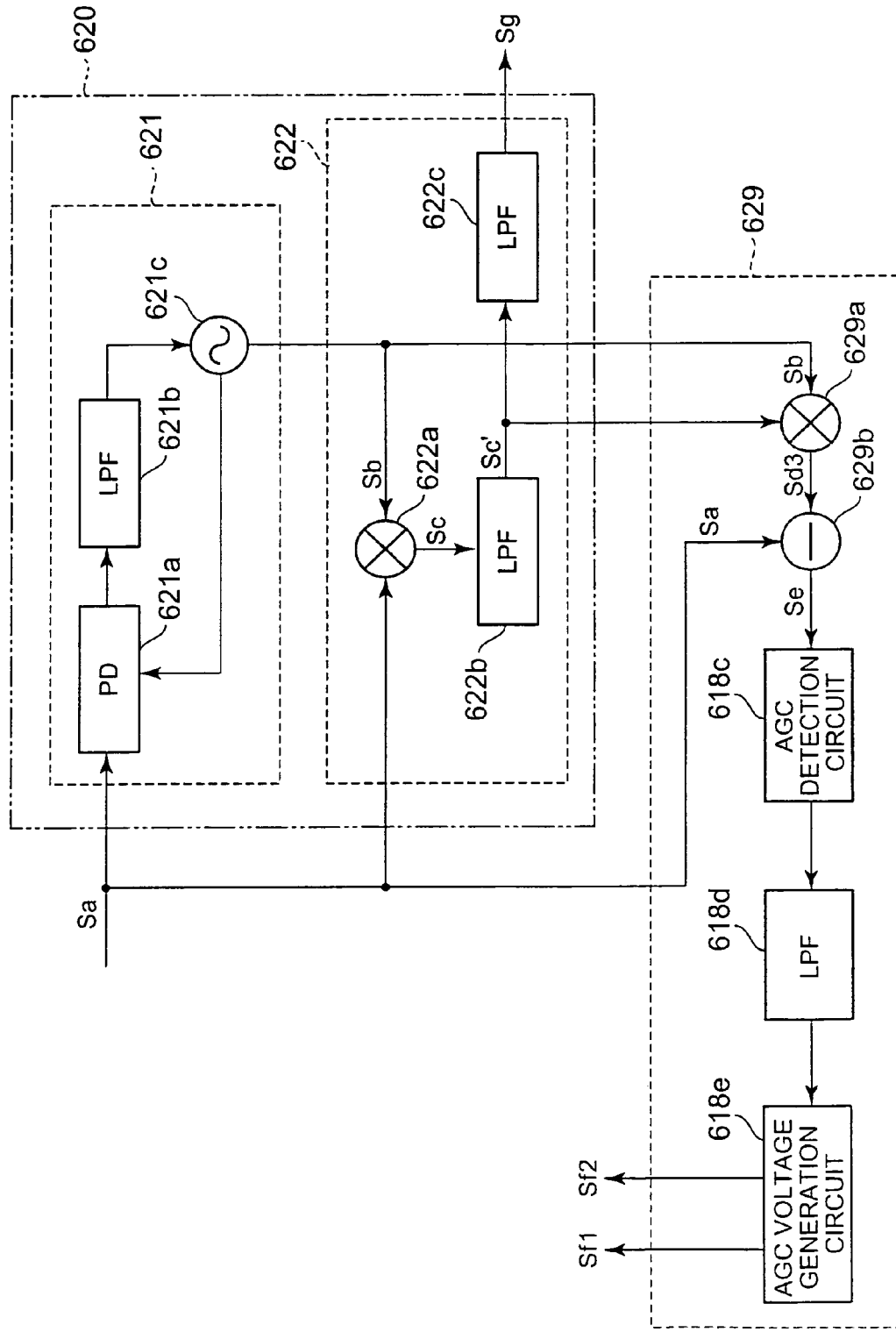
FIG. 10 is a block diagram showing the detection circuit and AGC circuit, as a modification example of the first and second embodiment.

For example, an AGC circuit shown in FIG. 10 may be comprised instead of the AGC circuit 618 of FIG. 3 and AGC circuit 619 of FIG. 6. Namely, according to FIG. 10, the AGC circuit 629 comprises a multiplier 629a, a subtracter 629b, an AGC detection circuit 618c, an LPF 618d, and an AGC voltage generation circuit 618e.

The signal Sb output from the oscillator 621c and the signal Sc' output from the LPF 622b is input to the multiplier 629a. Then, the multiplier 629a multiplies the signal Sb and signal Sc', and outputs a multiplied signal Sd3.

The signal Sa output from the filter circuit 617 and the signal Sd3 output from the multiplier 629a are input to the subtracter 629b. Then, the subtracter 629b subtracts the signal Sd3 from the signal Sa, and outputs the subtracted signal Se.

Here, ideally, the signal Sa and the signal Sd3 have the same wave shape. Therefore, by adequately adjusting the signal level of the signal Sd3 (for example, amplifying at a predetermined amplification), in a similar way as the signal Se shown in FIG. 5E, a signal Se where the peak amplitude is approximately constant can be gained.

In this case, the radio wave reception device 61 multiples the standard signal Sb and signal Sc' that is regenerated by the signal regeneration circuit 622, namely, the signal Sb is modulated at the signal Sc', and the modulated signal Sd3 is added to the signal Sa that is an intermediate frequency signal and according to the signal level of the added signal Se, generates the RF control signal Sf1 that controls the amplification of the RF amplifier circuit 611 and the IF control signal Sf2 that controls the amplification of the IF amplifier circuit 616. In other words, ideally, because the AGC detection circuit 618c detects the signal Se that has only the intermediate frequency components, it is not necessary to place a filter having a larger time constant than the cycle of the received amplitude modulation signal to perform the AGC operation, and a high speed AGC operation, without relying to the cycle of the amplitude modulation signal is realized.

Third Embodiment

Figure 12:
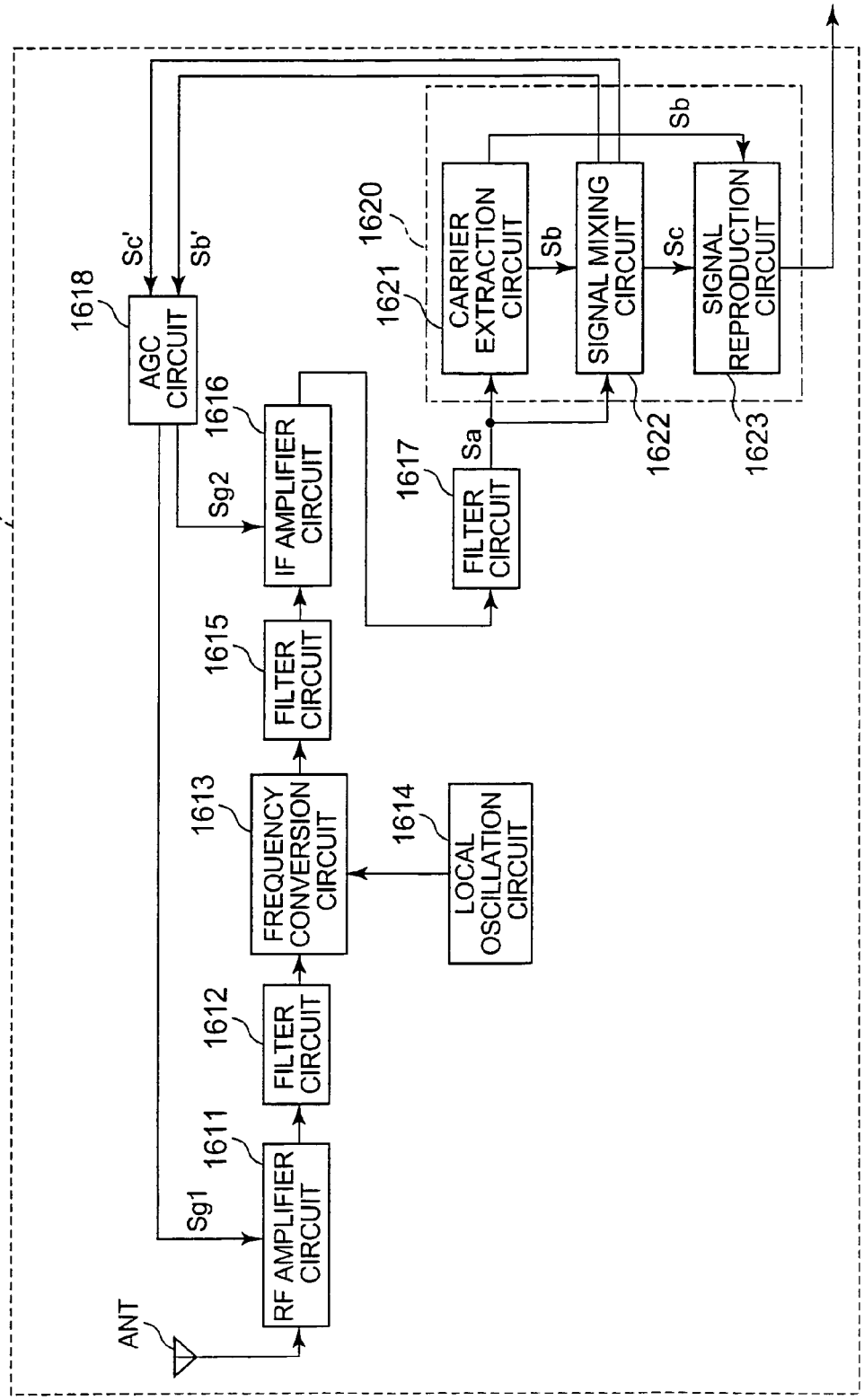
FIG. 12 is a block diagram showing the radio wave reception device of the third embodiment.

FIG. 12 is a block diagram showing a radio wave reception device 1061, replacing the radio wave reception device 61 that comprises the radio wave clock in the first embodiment. According to FIG. 12, the radio wave reception device 1061 is constituted comprising an antenna ANT, RF amplifier circuit 1611, filter circuits 1612, 1615, 1617, frequency conversion circuit 1613, local oscillation circuit 1614, IF amplifier circuit 1616, detection circuit 1620, and an AGC (Auto Gain Control) circuit 1618.

The antenna ANT can receive low-frequency standard radio wave, and is comprised of for example a bar antenna. The received radio wave is converted to an electric signal and is output.

The signal output from the antenna ANT and an RF control signal Sg1 output from the AGC circuit 1618 are input to the RF amplifier circuit 1611. The RF amplifier circuit 1611 outputs the signal input from the antenna ANT at amplification (or attenuation) in accordance with the RF control signal Sg1.

The signal output from the RF amplifier circuit 1611 is input to the filter circuit 1612. The filter circuit 1612 allows signal components having a predetermined range of frequencies to pass through, relating to the input signal, i.e. outputs the signal, cutting off the frequency components that are out of the range.

The signal output from the RF amplifier circuit 1612 and the signal output from the local oscillation circuit 1614 are input to the frequency conversion circuit 1613. The frequency conversion circuit 1613 mixes the two input signals, and outputs the mixed signal as an intermediate frequency signal. The local oscillation circuit 1614 generates and outputs the signal of the local oscillation frequencies.

The intermediate frequency signal output from the frequency conversion circuit 1613 is input to the filter circuit 1615. The filter circuit 1615 allows a predetermined range of frequencies, placing the intermediate frequencies in the center, relating to the intermediate frequency signal and outputs the signal cutting of the frequency components that are out of the range.

The signal output from the filter circuit 1615 and an IF control signal Sg2 output from the AGC circuit 1618 are input to the IF amplifier circuit 1616. The IF amplifier circuit 1616 amplifies (or attenuates) and outputs, in accordance with the amplification of the IF control signal Sg2.

The signal output from the IF amplifier circuit 1616 is input to the filter circuit 1617. Then, the filter circuit 1617 allows signal components having a predetermined range of frequencies, concerning the input signal to pass through, i.e. outputs the signal as signal Sa, cutting off the frequency components that are out of the range.

The detection circuit 1620 comprises a carrier extraction circuit 1621, a signal mixing circuit 1622, and a signal reproduction circuit 1623.

The carrier extraction circuit 1621 is comprised of for example a PLL (Phase Locked Loop) circuit. The signal Sa output from the filter circuit 1617 is input to the carrier extraction circuit 1621. Then, a signal Sb that has a signal level that is a constant standard signal and has the same frequency and the same phase as the signal is output.

The signal Sa output from the filter circuit 1617 and the signal Sb output from the carrier extraction circuit 1621 are input to the signal mixing circuit 1622. The signal mixing circuit 1622 outputs a signal Sb' that amplified the signal Sb, and a signal Sc that subtracted the signal Sb' from the signal Sa.

The signal Sb output from the carrier extraction circuit 1621 and the signal Sc output from the signal mixing circuit 1622 are input to the signal reproduction circuit 1623. The signal reproduction circuit 1623 outputs a signal Sf as a baseband signal.

The signal Sb' and signal Sc output from the signal mixing circuit 1622 are input to the AGC circuit 1618. The AGC circuit 1618 outputs the RF control signal Sg1 for controlling the amplification of the RF amplifier circuit 611 and IF control signal Sg2 for controlling the amplification of the IF amplifier circuit 1616, in accordance with the intensity (power of the signal level) of the signal Sb' and Sc. Here, the amplification of the RF amplifier circuit 1611 and the IF amplifier circuit 1616 is adjusted according to the intensity of the radio wave that the antenna ANT received. For example, firstly, the AGC circuit 1618 controls the intensity of the IF amplifier circuit 1616 by the IF amplifier signal Sg2. However, in a case where the signal level input in the IF amplifier 1616 is high, and attenuation in the IF amplifier circuit is not enough, the amplification of the RF amplifier circuit 1611 is adjusted by the RF control signal.

Figure 13:
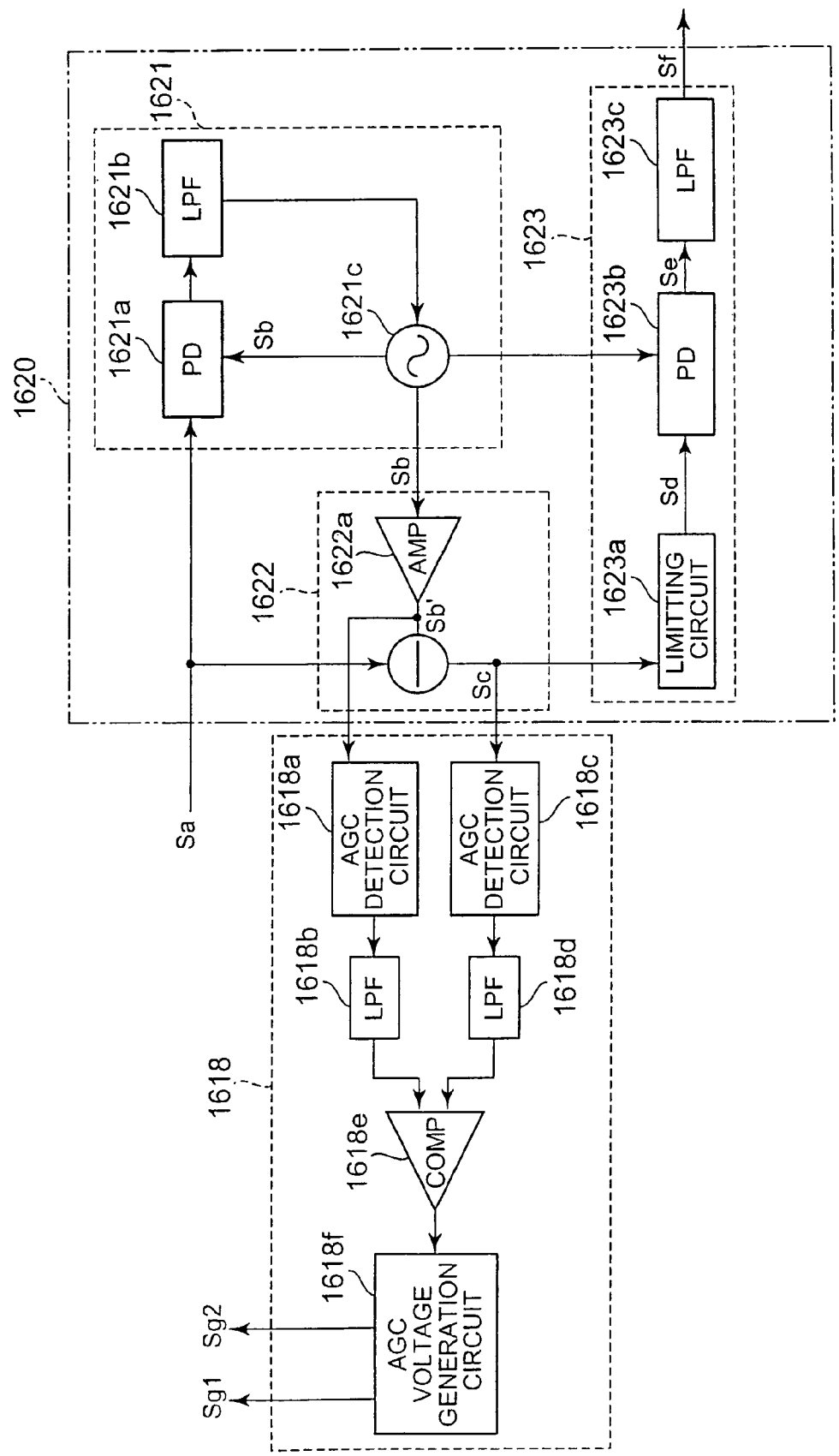
FIG. 13 is a block diagram showing the detection circuit and AGC circuit of the third embodiment.

FIG. 13 is a block diagram showing an example of a circuit structure of the carrier extraction circuit 1621, the signal mixing circuit 1622, the signal reproduction circuit 1623, and the AGC circuit 1618 in FIG. 12. According to FIG. 13, the carrier extraction circuit 1621 comprises a PD (Phase Detector) 1621a, an LPF (Low Pass Filter) 1621b and an oscillator 1621c.

The signal Sa output from the filter circuit 1617 and the signal output from the oscillator 1621c are input to the PD 1621a. The PD 1621a compares the phase of the two input signals, and outputs a phase-difference signal having a signal level corresponding to the detected phase difference.

The signal output from the LPF 1621b is input to the oscillator 1621b. The LPF 1621b allows signal components having a predetermined range (low pass) of frequencies, relating to the input to signal, to pass through, i.e. outputs a signal cutting off the frequency components that are out of the range.

The signal output from the PD 1621a is input to the oscillator 1621c. The oscillator 1621c adjusts the phase difference of the signal that is to be oscillated, based on the input signal, so that the phase of the oscillated signal synchronizes with the phase of the carrier wave of signal Sa, and outputs the adjusted signal as signal Sb.

The signal mixing circuit 1622 comprises an amplifier 1622a and a subtracter 1622b. The signal Sb output from the oscillator 1621c is input to the amplifier 1622a. The amplifier 1622a, as will be described later, amplifies the signal Sb so that the amplitude of signal Sc output from the subtracter 1622b is constant, and outputs the signal as signal Sb'.

The signal Sa output from the filter circuit 1617 and the signal Sb' output from the amplifier 1622a are input to the subtracter 1622b. The subtracter 1622b subtracts signal Sb' from the signal Sa, an outputs the subtraction result as signal Sc.

The amplification of signal Sb by the amplifier 1622a that regulates the amplification of the signal Sc, output from the subtracter 1622b, will be described. The low-frequency standard radio wave has an amplitude modulation of 10% and 100%. Therefore, the signal Sa has the same amplification, and when a maximum amplification of the signal Sa is represented as X, the minimum amplification is 0.1X. It is also assumed that the amplification of signal Sb' is represented as Y. To make the absolute value of the amplification of signal Sc constant, wherein the signal Sc is gained by subtracting signal Sb' from signal Sa by the subtracter 622b, the below relation needs to be:

$$|X-Y|=|0.1X-Y|$$

$$Y=0.55X$$

Namely, by setting the amplification of signal Sb' to 55% of the maximum amplification of signal Sa, the amplification of signal Sc output from the subtracter 1622b, becomes constant.

The signal reproduction circuit 1623a comprises limiting circuit 1623a, a PD 1623b, and a LPF 1623c.

The signal Sc output from the subtracter 1622b is input to the limiting circuit 1623a. The limiting circuit 1623a limits the amplification of signal Sc to a predetermined range of upper limit and lower limit, and outputs the signal as signal Sd. By the limiting circuit 1623a, noise that is included in the signal Sc can be eliminated to a certain extent.

The signal Sb output from the oscillator 1621c and the signal Sd output from the limiting circuit 1623a is input to the PD 1623b. The PD 1623b compares the phase of the signal Sb and Sd, and outputs a phase-difference signal Se having a signal level corresponding to the detected phase difference. In the present embodiment, if the two signals have the same phase, the PD 1623b commutates the wave shape of signal Sd to a plus direction, and outputs the signal, and if the two signals have a negative phase, commutates the wave shape of signal Sd to a minus direction, and outputs the signal.

The phase difference signal Se output from the PD 1623b is input to the LPF 1623c. The LPF 1623c allows signal components having a predetermined range (low pass) relating to the signal Se to pass through, i.e. outputs a signal Sf that cuts off frequency components that are out of the range.

The AGC circuit 1618 comprises AGC circuits 1618a, 1618c, LPFs 1618b, 1618d, and a comparator 1618e.

The signal Sb' output from the amplifier 1622a is input to the AGC detection circuit 1618a. The AGC detection circuit 1618a detects the signal Sb', and outputs a detected signal.

The signal output from the AGC detection circuit 1618a is input to the LPF 1618b. The LPF 1618b allows a predetermined range (low pass) of frequencies to pass, relating to the input signal, and outputs a signal cutting off the frequency components that are out of the range.

The signal Sc output from the subtracter 1622b is input to the AGC detection circuit 1618c. The detection circuit 1618c detects the signal Sc and outputs the detected signal.

The signal output from the AGC detection circuit 1618c is input to the LPF 1618d. The LPF 1618d allows signal components having a predetermined rage (low pass) of frequencies, relating to the input signal, to pass through, i.e. outputs a signal, cutting off the frequency components that are out of the range.

The signal output from the LPF 1618b and the signal output from the LPF 1618d are input to the comparator 1618e. The comparator 1618e compares the level of the two input signals, and outputs a signal having a signal level corresponding to a phase-difference of the detected phase difference.

The signal output from the comparator 1618e is input to an AGC voltage generation circuit 1618f. The AGC voltage generation circuit 1618f generates and outputs the RF control signal Sg1 and IF control signal Sg2 based on the input signal.

Figure 14:
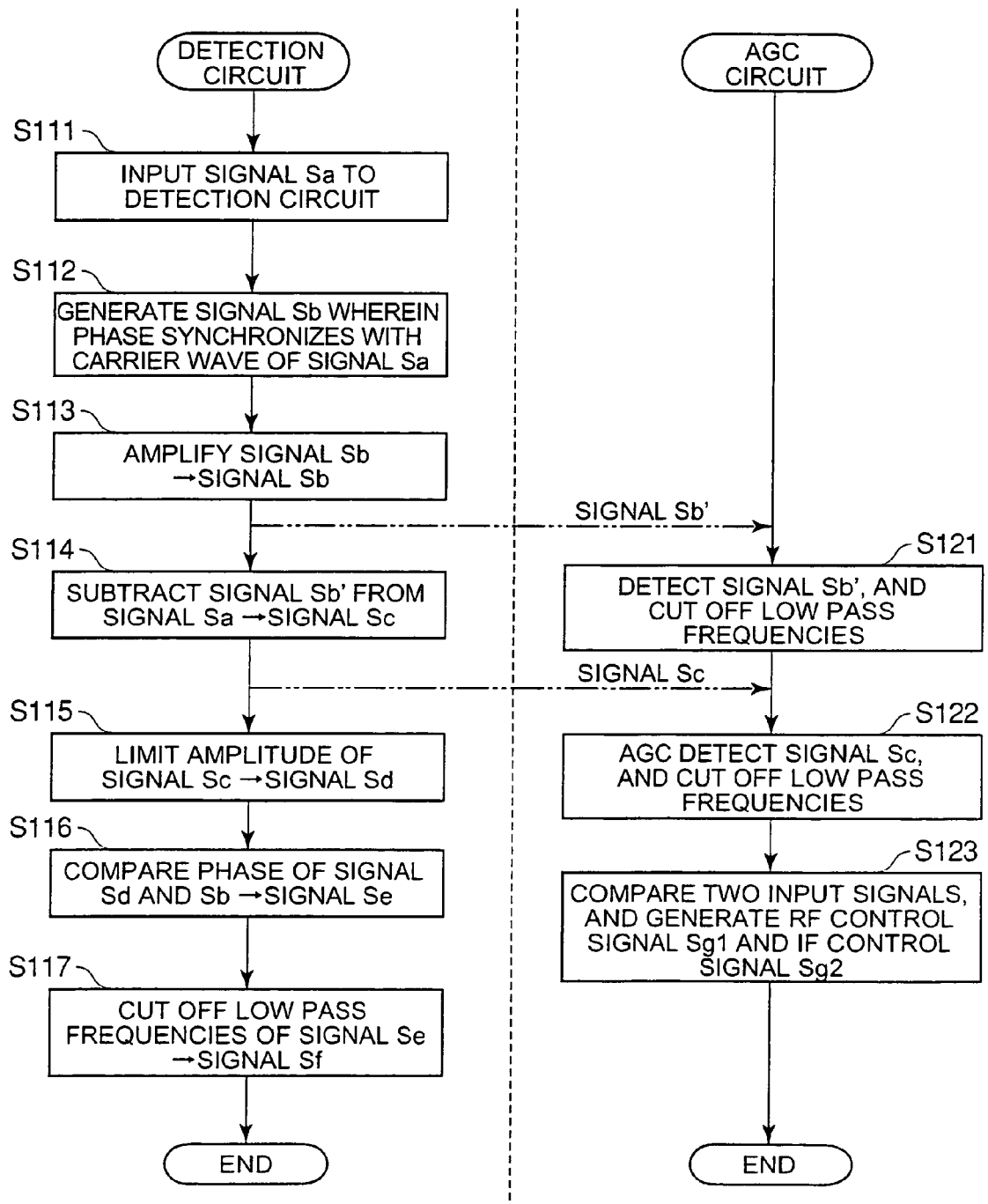
FIG. 14 is a flow chart showing the processing of the radio wave reception device of the third embodiment.

Next, the operations of the radio wave reception device 1061 will be described. FIG. 14 is a flowchart showing the processing of the radio wave reception device 1061, and FIGS. 15A to 15F are figures showing the approximate wave shape of each signal that passes through the radio wave reception device 1061.

According to FIG. 14, firstly, the low-frequency standard radio wave received by the antenna ANT is converted to an electric signal, and output to the RF amplifier circuit 1611. The RF amplifier circuit 1611 amplifies (attenuates) the input signal, in accordance with the RF control signal Sg1 output from the AGC circuit 1618, and outputs the amplified (attenuated) signal to the frequency conversion circuit via the filter circuit 1612.

Next, the frequency conversion circuit 1613 converts the input signal to a signal of a predetermined intermediate frequency, and outputs the converted signal to the IF amplifier circuit 1616 via the filter circuit 1615. The IF amplifier circuit 1616 amplifies (attenuates) the input signal, in accordance with the IF control signal Sg2 input from the AGC circuit 1618, and outputs the amplified (attenuated) signal as the signal Sa, to the detection circuit 1620 via the filter circuit 1617 (Step S111). Here, as shown in FIG. 15A, the signal Sa is a signal that has an amplitude modulation of 10% (corresponding to time zone A, C) and 100% (corresponding to time zone B).

Then, in the detection circuit 1620, the carrier extraction circuit 1621 outputs a signal Sb that has the same frequency and same phase as signal Sa, and constant amplitude (Step S112). In the signal mixing circuit 1622, the amplifier 1622a outputs the signal Sb as amplified signal Sb'. At this time, the amplifier 1622a amplifies the signal Sb so that the amplification of signal Sb' becomes 55% of the maximum amplification of signal Sa (Step S113).

Next, the subtracter 1622b outputs the signal Sc, which is signal Sb' subtracted from signal Sa. Namely, as shown in FIG. 15C, in time zones A or B, wherein the modulation of the amplification of signal Sa is 10%, signal Sc has a reversed phase as signal Sb', and in time zone B, wherein the modulation of the amplification of signal Sa is 100%, signal Sc has the same phase as signal Sb' (Step S114).

Then, in the signal regeneration circuit 1623, the limiting circuit 1623a outputs a signal Sd, cutting off greater or equal to VH and lesser or equal to VL, of the amplification of signal Sc (Step S115). The PD 1623b compares the phase of the signal Sb and Sd, and outputs the signal as Se. Concretely, in a case where the signal Sb and the signal Sd have the same phase, (time phase A and time phase C), a signal Se, wherein signal Sd commutates to a plus direction is output. In a case where the signal Sb and the signal Sd have a negative phase, (time phase B), a signal Se, wherein signal Sd commutates to a minus direction is output (Step S116).

Furthermore, the LPF 1623c allows signal components having a predetermined range (low pass) of frequencies relating to signal Se, to pass through, i.e. outputs a signal Sf, cutting off the frequency components that are out of the range (Step S117). Namely, as shown in FIG. 15F, the signal Sf is output as a signal that is nearly equal to the baseband signal of signal Sa.

In the AGC circuit 1618, the AGC detection circuit 1618a detects the signal Sb', and outputs the detected signal to the comparator 1618e via the LPF 1618d (Step S121). The AGC detection circuit 1618c detects the signal Sc, and outputs the detected signal to the comparator 1618e via the LPF 1618d (Step S122).

Then, the comparator 1618e compares the level of the two input signals, and outputs a signal to the AGC voltage generation circuit 1618f. The AGC voltage generation circuit 1618f generates and outputs an RF control signal Sg1 and an IF control signal Sg2 (Step S123).

The radio wave reception device 1061 detects the signal Sc (the signal after subtracting signal Sb', which has the same frequency and phase as signal Sa and a constant amplification, from signal Sa) and the signal Sb', and by comparing the signal levels of the two signals, RF control signal Sg1 that controls the amplification of the RF amplifier circuit 1611 and IF control signal Sg2 that controls the amplification of the IF amplifier circuit 1616 can be generated. Namely, the AGC detection circuit 1618c detects the signal Sc that has only the intermediate frequency components. Because of this, the LPF 1618d needs not to be a filter having a time constant equal to or larger than the cycle of the received standard radio wave (amplitude modulation signal). Accordingly, speeding up of the AGC operation of the radio wave reception device 1061 can be realized.

Furthermore, the radio wave reception device 1061 converts the amplification modulation of signal Sa to a phase modulation, and by determining whether the signal Sd has a same phase or a reversed phase of signal Sb (namely, a signal synchronized with the phase of the carrier wave of signal Sa), a signal Sf that corresponds to the baseband signal of signal Sa is gained. Namely, because detection is carried out placing the phase of the signal Sa as a standard, a stable detection can be carried out even when there is a deformation in radio wave shape, such as the amplification of the signal Sa becoming smaller by receiving a weak radio wave.

In the third embodiment, the signal Sb is amplified so that the amplitude of signal Sb' becomes 55% the maximum amplitude of signal Sa. However, it may be that the amplitude of signal Sb' is 10% the maximum amplitude of signal Sa. Namely, when a signal that has amplitude of 10% of the maximum amplitude of signal Sa is subtracted from the signal Sa, there is a signal at a modulation of 100%, but at a modulation of 10%, the signal is erased. Therefore, by determining whether there is a signal or not based on the subtraction result by the subtracter 1622b, it is possible to detect the signal Sa.

The third embodiment is not limited to the above embodiment, and various embodiments and changes may be made thereunto without departing from the broad spirit and scope of the invention.

For example, in the AGC circuit 1618, the signal Sb' and signal Sc are detected, and after the high frequency wave components are cut off, the two signals are compared. However, the signal level of signal Sc may be compared to a predetermined signal level, and the RF control signal Sg1 and IF control signal Sg2 may be generated in accordance with the comparison result.

Fourth Embodiment

Figure 16:
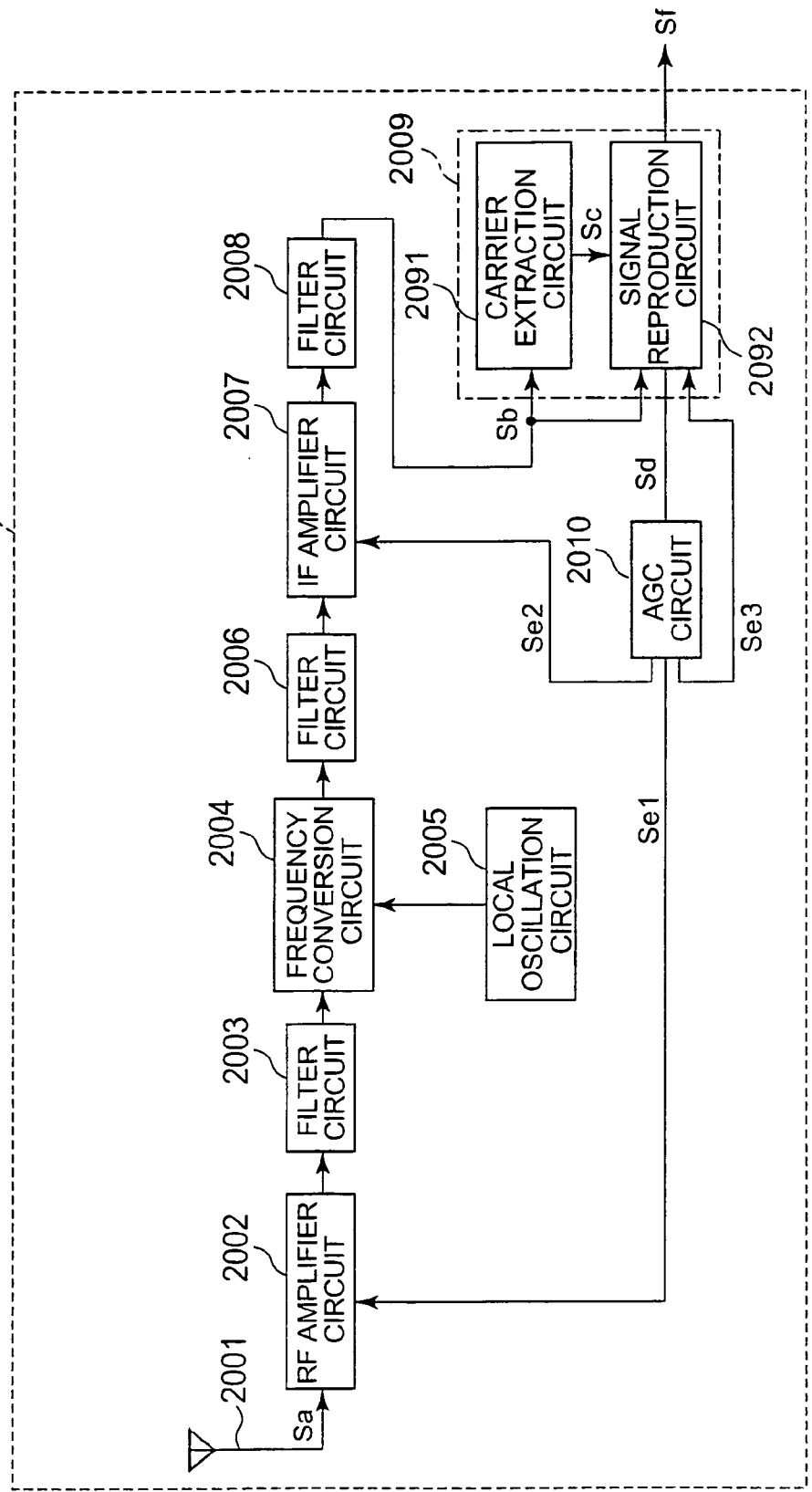
FIG. 16 is a circuit block diagram of the radio wave reception device of the fourth embodiment.

FIG. 16 is a block diagram showing a radio wave reception device 2061, employing a super heterodyne type, replacing the radio wave reception device 61 that comprises the radio wave clock 1 in the first embodiment. According to FIG. 16, the radio wave reception device 2061 is constituted comprising an antenna 2001, RF amplifier circuit 2002, filter circuits 2003, 2006, 2008, frequency conversion circuit 2004, local oscillation circuit 2005, IF amplifier circuit 2007, detection circuit 2009, and an AGC circuit 2010.

The antenna 2001 can receive low-frequency standard radio wave, and is constituted by, for example, a bar antenna. A received radio wave is converted into an electric signal and then output as signal Sa. The signal Sa and RF control signal Se1 output from the AGC circuit 2010 is input to the RF amplifier circuit 2002. The RF amplifier circuit 2002 amplifies and outputs the signal Sa, which was input according to the RF control signal Se1.

The signal output from the RF amplifier circuit 2002 is input to the filter circuit 2003. Signal components having a predetermined range of frequencies, relating to the input signal, are allowed to pass through, and the frequency components that are out of the range are cut off. A signal of local oscillation frequencies is generated in the local oscillation circuit 2005. The signal output from the signal filter circuit 2003 and the signal output from the local oscillation circuit 2005 are input to the frequency conversion circuit 2004. The two signals are mixed, and output as an intermediate frequency signal.

The intermediate frequency signal output from the frequency conversion circuit 2004 is input to the filter circuit 2006. The filter circuit 2006 allows signal components having a predetermined range of frequencies to pass through, where the intermediate frequency of the intermediate frequency signal is placed in the center, i.e. outputs a signal, cutting off frequency components that are out of the range.

The signal output from the filter circuit 2006 and an IF control signal Se2 output from the AGC circuit 2010 are input to the IF amplifier circuit 2007. The IF amplifier circuit 2007 amplifies and outputs the input signal, in accordance with the IF control signal Se2. The signal output from the IF amplifier circuit is input to the filter circuit 2008. Then, signal components having a predetermined range of frequencies are allowed to pass through, i.e. signal Sb is output, cutting off the frequency components that are out of the range.

The detection circuit 2009 comprises a carrier extraction circuit 2091 and a signal reproduction circuit 2092. The carrier extraction circuit 2091 is comprised of for example a PLL (Phase Locked Loop) circuit. The signal Sb, output from the filter circuit 2008, is input to the carrier extraction circuit 2091. Then, a signal that is synchronized with the carrier wave of signal Sb, is output.

The signal Sb output from the filter circuit 2008, the signal Sc output from the carrier extraction circuit 2091', and the signal Se3 output from the AGC circuit 2010 are input to the signal reproduction circuit 2092. Then, the signal Sd and detection signal Sf are output based on these three signals.

The signal Sd output from the signal reproduction circuit 2092 is input to the AGC circuit 2010. Then, RF amplifier signal Se1, IF amplifier signals Se2 and Se3 are output as gain control signals. Concretely, the signal Sd and standard voltage are compared, and signal Se3 is output a phase-difference signal having a signal level corresponding to the detected phase difference. Based on the signal Se3, RF amplifier signal Se1 and IF amplifier signal Se2 are output.

Figure 17:
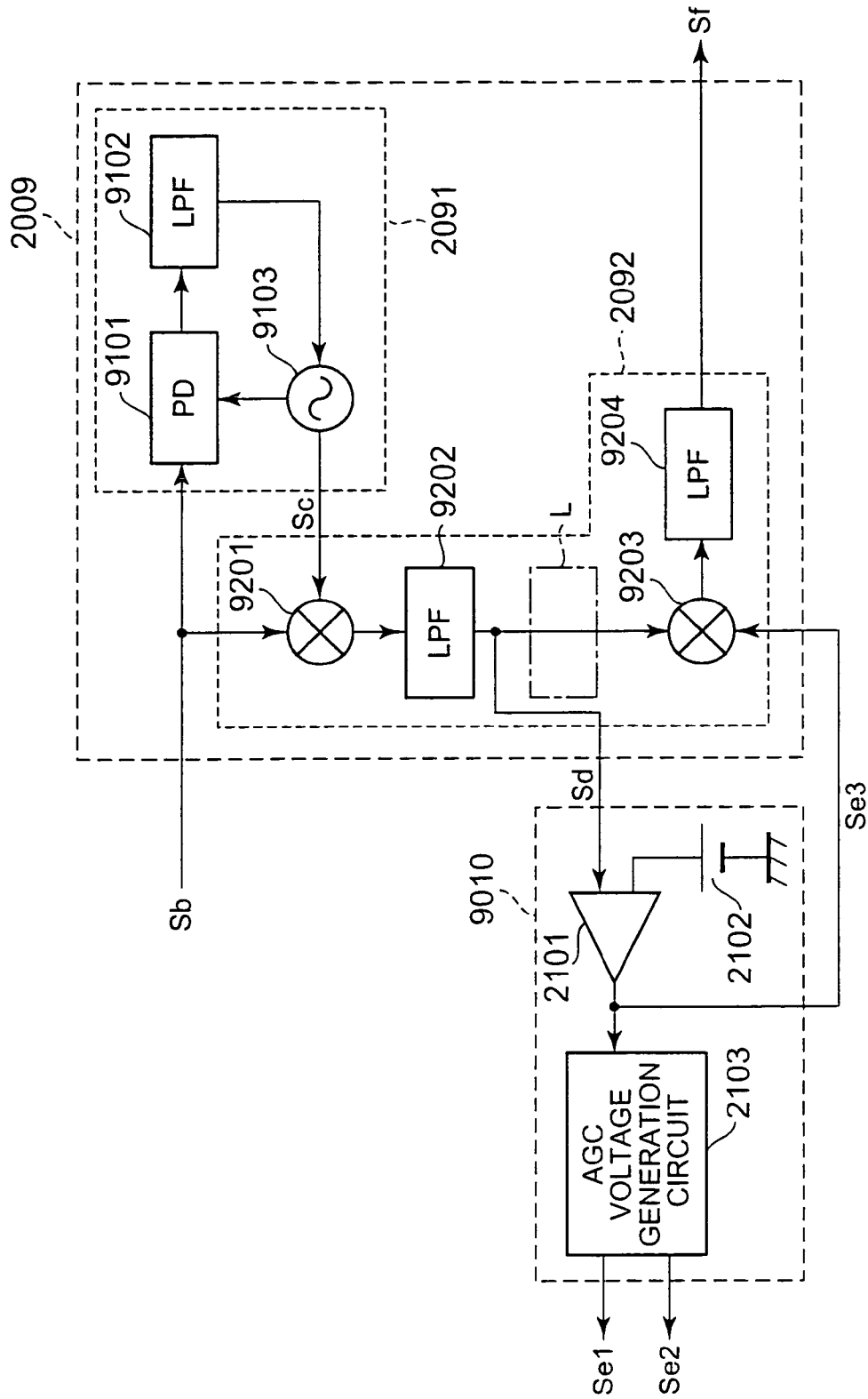
FIG. 17 is a circuit block diagram showing the detection circuit and AGC circuit of the fourth embodiment.

FIG. 17 is a circuit block diagram showing the structure of the carrier extraction circuit 2091, signal reproduction circuit 2092, and AGC circuit 2010 in FIG. 16. The carrier extraction circuit 2091 comprises a PD (Phase Detector) 9101, an LPF (Low Pass Filter) 9102, and an oscillator 9103.

The signal Sb output from the filter circuit 2008 and the signal output from the oscillator 9103 are input to the PD 9101. The two signals are compared by the PD 9101, and outputs a phase-difference signal having a signal level corresponding to the detected phase difference. The signal output from the PD 9101 is input to the LPF 9102. The signal components having a predetermined range (low pass) of frequencies is allowed to pass through, i.e. a signal is output, cutting off frequency components that are out of the range.

The signal output from the LPF 9102 is input to the oscillator 9103. The oscillator 9103 adjusts the phase of the signal to be oscillated, based on the signal output from the LPF 9102, so that the signal to be oscillated is synchronized with the phase of carrier wave of signal Sb. The signal Sc that is synchronized with the phase of the carrier wave of signal Sb is output from the oscillator 9103.

The signal reproduction circuit 2092 comprises multiplication circuits 9201, 9203, and LPFs 9202 and 9204. The signal Sb output from the filter circuit 2008 and signal Sc output from the oscillator 9103 are input to the multiplication circuit 9201. The two signals are output after being multiplied.

The signal output from the multiplier circuit 9201 is input to the LPF 9202. A predetermined range (low pass) relating to the signal is allowed to pass through, and cutting off the frequency components that are out of the range, the signal Sd is output. The signal Sd output from the LPF 9202 and the signal Se3 output from the AGC circuit 2010 are input to the multiplication circuit 9203. The two signals are output multiplied. The signal output from the multiplication circuit 9203 is input to the LPF 9204. Then, signal components having a predetermined range (low pass) relating to the signal is allowed to pass through, i.e. the detection signal Sf is output, cutting of the frequency components that are out of the range.

The AGC circuit 2010 comprises a comparison circuit 2101, a standard power source 2102 and an AGC voltage generation circuit 2103. The signal Sd output from the LPF 9202 and a standard voltage supplied by the standard power source 2102 are input to the comparison circuit 2101. Then, the signal level of signal Sd and the standard voltage are compared, and outputs a phase-difference signal Se3 having a signal level corresponding to the detected phase difference.

The signal Se3 is input to the AGC voltage generation circuit 2103, and based on the signal Se3, RF control signal Se1 and IF control signal Se2 is output. The amplification of the RF amplification circuit 2002 and IF amplification circuit 2007 are adjusted based on the intensity of the radio wave that the antenna 2001 receives. For example, the amplification of the IF amplification circuit 2007 is adjusted by the IF control signal Se2. However, in a case where the level of the signal input to the IF amplification circuit is high, and the attenuation in the IF amplification circuit 2007 is not enough, the amplification of the RF amplification circuit 2002 is also adjusted by the RF control signal Se1.

FIGS. 18A to 18E are drawings showing the outline wave shape of each signal that passes through the radio wave reception device 2061. Below, the circuit operation of the radio wave reception device 2061 will be described with reference to FIGS. 18A to 18E.

Firstly, a signal Sa is received by the antenna 2001. The signal Sa is amplified by the RF amplification circuit 2002. Here, the signal Sa input to the RF amplification circuit 2002, in accordance with the RF control signal Se1 output from the AGC voltage generation circuit 2103, is amplified (or attenuated).

The signal output from the RF amplification circuit 2002 is input to the IF amplification circuit 2007 via the frequency conversion circuit 2004 and filter circuit 2006, and amplified. Here, the signal input to the IF amplification circuit 2007, in accordance with the IF control signal Se2 output from the AGC voltage generation circuit 2103, is amplified (or attenuated).

Figure 18A:
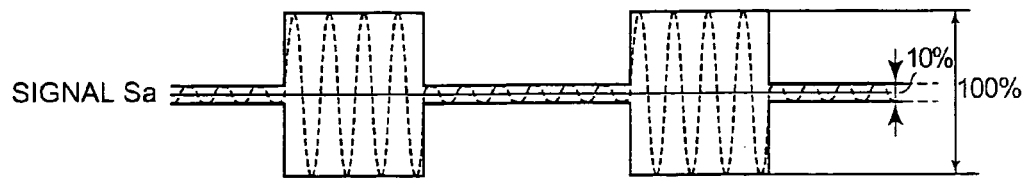
FIG. 18A is a diagram showing the wave shape of the signal Sa in the radio wave reception device of the fourth embodiment.
Figure 18B:
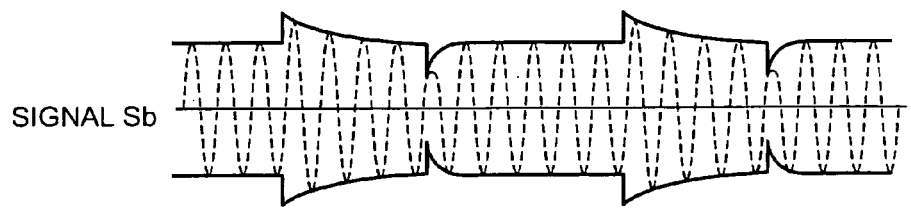
FIG. 18B is a diagram showing the wave shape of the signal Sb in the radio wave reception device of the fourth embodiment.
Figure 18C:
FIG. 18C is a diagram showing the wave shape of the signal Sc in the radio wave reception device of the fourth embodiment.
Figure 18D:
FIG. 18D is a diagram showing the wave shape of the signal Sd in the radio wave reception device of the fourth embodiment.
Figure 18E:
FIG. 18E is a diagram showing the wave shape of the signal Se in the radio wave reception device of the fourth embodiment.

The signal output from the IF amplification circuit 2007 is input to the filter circuit 2008. Then, the filter circuit 2008 outputs a signal Sb. As shown in FIGS. 18A and 18B, the signal Sa received by the antenna 2001, is converted to the signal Sb that has a small amplitude modulation, by the RF amplification circuit 2002 and IF amplification circuit 2007. Namely, the RF amplification circuit 2002 and IF amplification circuit 2007 amplifies (attenuates) so that the level of the input signal is retained at a predetermined level, and output.

A transitional amplitude fluctuation occurs at the point where the amplitude changes, to the signal Se3 output from the comparison circuit 2101, by the delay of the loop circuit comprised of the RF amplification circuit 2002, filter circuit 2003, frequency conversion circuit 2004, filter circuit 2006, IF amplification circuit 2007, and AGC circuit 2010 and the LPF 9202. The RF control signal e1 and If control signal e2 are generated based on the signal Se3, and the signal b that was adjusted the amplification by the RF amplification circuit 2 and the IF amplification circuit 7 is converged to a steady value.

The signal Sb and signal Sc are multiplied by the multiplication circuit 9201. Because the signal Sc is a signal that is synchronized with the carrier wave of signal Sb, a modulation component, and a frequency component that is twice the carrier wave is made.

The signal output from the multiplication circuit 9201 takes out only the frequency components that are input to the LPF 9202, and is output as signal Sd. As shown in FIG. 4, by the delay of the time constant of the LPF 9202, the signal Sd becomes a signal that oscillates, rises and falls, at the point where the amplification of the signal output from the multiplication circuit 9201 (direct current of signal Sb) changes.

In the LPF 9202, a harmonic component included in the signal output from the multiplication circuit 9201 is reduced. Concretely, for example, a signal of twice the frequency of the carrier wave of signal Sb is reduced. If the intermediate frequency is 50 [kHz], the LPF 9202 is a signal that eliminates a signal of 100 [kHz]. Namely, compared with the cycle of the modulation signal of the low-frequency standard radio wave, because the time constant of the LPF 9202 becomes quite small, delay by the time constant can be reduced. Namely, a high-speed AGC operation can be realized.

Sequentially, the signal Sd is input to the comparison circuit 2101. The signal level of signal Sd and the standard voltage output from the standard power source 2102, and a signal Se3 is output.

The signal Sd and signal Se3 are input to the multiplication circuit 9203. The signal output from the multiplication circuit 9203 is output as a detection signal Sf10. By inputting the signal Sd and signal Se3 to the multiplication circuit 9203, the detection signal Sf10 can be adequately reproduced. Then, the detection signal Sf10 is input to a time code generation unit 2910.

As the above, by the RF amplification circuit 2002 and IF amplification circuit 2007 that amplifies the input signal according to the RF control signal e1 and If control signal e2 output from the AGC circuit 2010, the amplitude fluctuation of the amplitude modulation signal that was received in the antenna 2001, can be retained at a situation close to a certain level. Therefore, it is not necessary to place a filter having a larger time constant than the cycle of the amplitude modulation signal to perform the AGC operation. Namely, a high speed AGC operation is operated without relying to the cycle of the amplitude modulation signal.

Therefore, fluctuation of the received radio wave, by transferring, etc., the radio wave clock, can be responded to at once, and time correction by the internal circuit of the radio wave clock can be precisely conducted.

Fifth Embodiment

Figure 19:
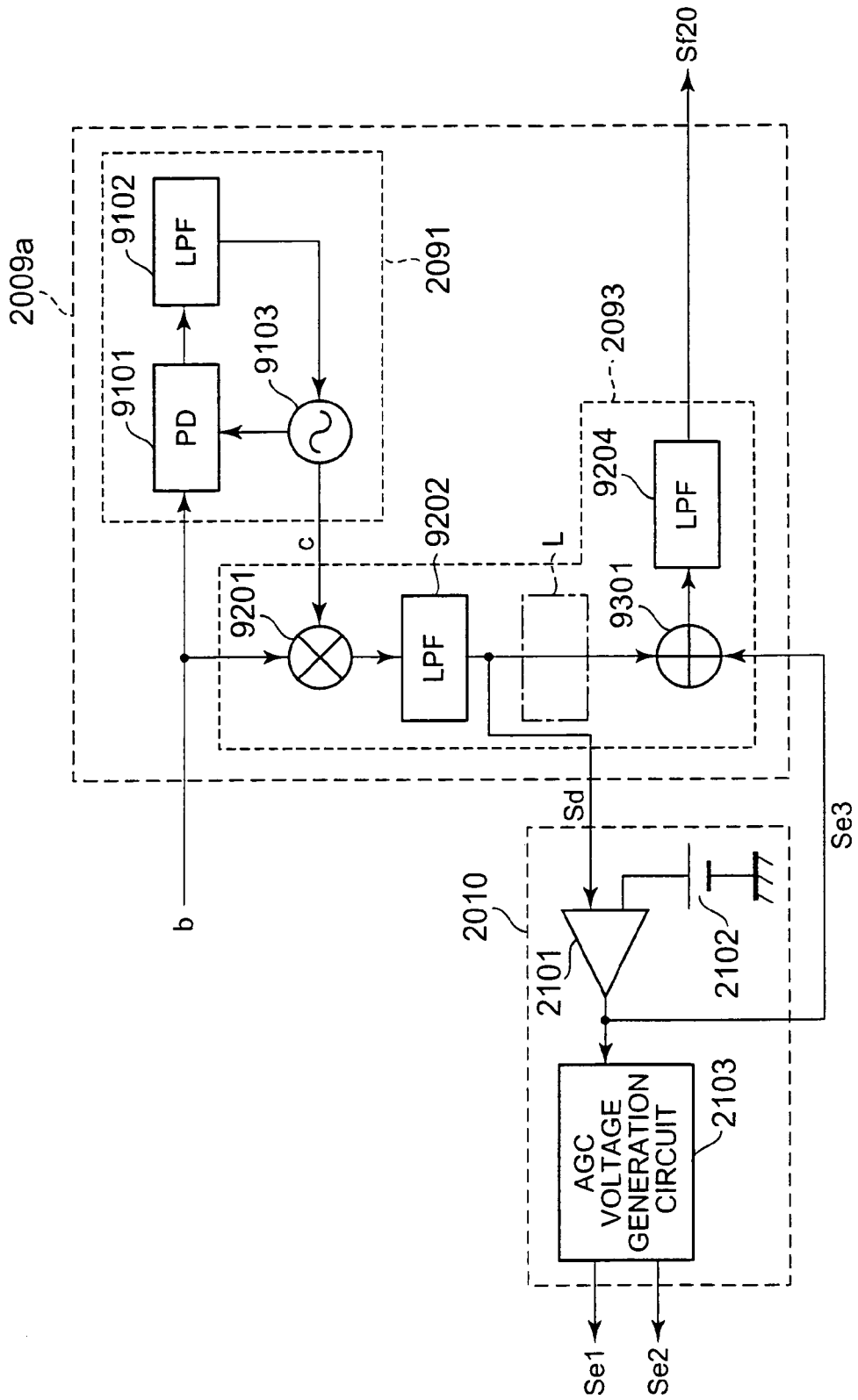
FIG. 19 is circuit block diagram of the detection circuit and the AGC circuit of the fifth embodiment.

In the fourth embodiment, the radio wave reception device that applies the multiplication circuit 9203, and comprises the signal reproduction circuit 2092 is described. In this embodiment, as shown in FIG. 19, a radio wave reception device that applies an addition circuit 9301, and comprises a signal reproduction circuit 2093 will be described.

The structure of the radio wave clock in the fifth embodiment, is the same as the radio wave clock 1 in FIG. 1. The structure of the radio wave reception device is the same structure replacing the signal reproduction circuit 2092 of the detection circuit 2009 that comprises the radio wave reception device 2061 of FIG. 16 to a signal reproduction circuit 2093 of a detection circuit 2009a shown in FIG. 19. Furthermore, the structure of the AGC circuit 2010 of FIG. 19 has the same structure as the AGC circuit 2010 of FIG. 16. Therefore, descriptions for the overlapping parts will be omitted by putting the same reference numerals.

In the signal reproduction circuit 2093, the signal Sb output from the filter circuit 2008 and the signal Sc output from the carrier extraction circuit 2091 are input to the multiplication circuit 9201. The signal output from the multiplication circuit 9201 is input to the LPF 9202.

The signal Sd output from the LPF 9202 and the signal Se3 output from the comparison circuit 2101 are input to the addition circuit 9301. The two signals are added by the addition circuit 9301, and a detection signal Sf20 is output via the LPF 9204. The detection signal Sf20 has almost the same wave shape as detection signal Sf10, and becomes a wave shape that is biased a predetermined level by the direct current component.

The detection signal Sf20 is input to the time code generation unit 2910. The time code generation unit 2910 generates a standard time code based on the pulse width from the rising edge to the falling edge of the detection signal Sf20. Therefore, there is no problem that the signal level of the detection signal Sf20 is biased a predetermined level, compared to the detection signal Sf10.

By the above, the fifth embodiment has the same effects as the fourth embodiment. Namely, by the RF amplification circuit 2002 and IF amplification circuit 2007 that amplifies (attenuates) the input signal according to the RF control signal Se1 and IF control signal Se2 output from the AGC circuit 2010, the amplitude fluctuation of the amplitude modulation signal that was received in the antenna 2001, can be retained at a situation close to a certain level. Therefore, it is not necessary to place a filter having a larger time constant than the cycle of the amplitude modulation signal to perform the AGC operation. Namely, a high speed AGC operation is operated without relying to the cycle of the amplitude modulation signal.

Therefore, fluctuation of the received radio wave, by transferring, etc., the radio wave clock, can be responded to at once, and time correction by the internal circuit of the radio wave clock can be precisely conducted.

Sixth Embodiment

Figure 20:
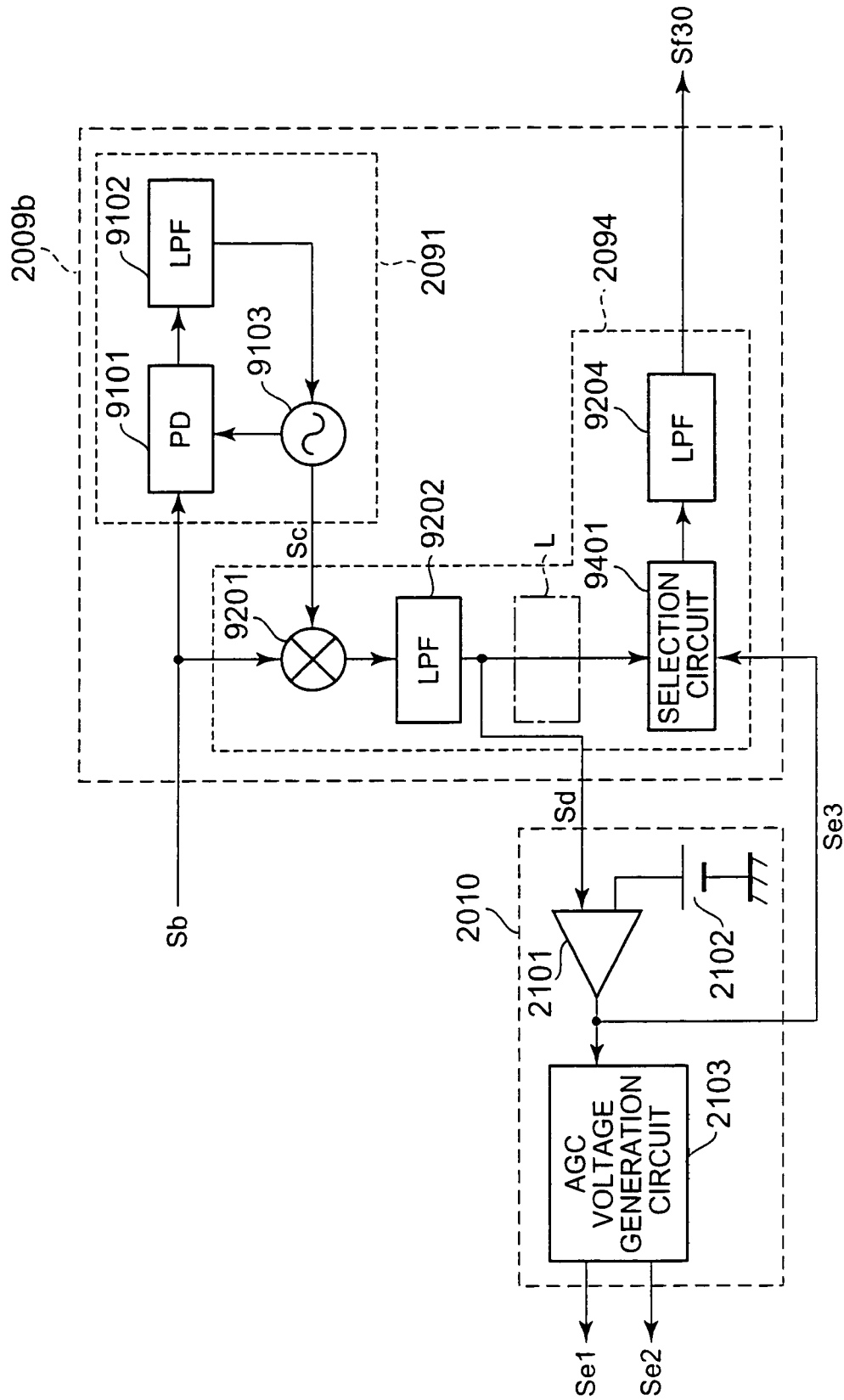
FIG. 20 is a circuit block diagram of the detection circuit and the AGC circuit of the sixth embodiment.

In the fifth embodiment, the radio wave reception device that applies the addition circuit 9301 and comprises the signal reproduction circuit 2093 is described. In the present embodiment, as shown in FIG. 20, a radio wave reception device that applies a selection circuit 9401 and comprises a signal reproduction circuit 2094 will be described.

The structure of the radio wave clock in the sixth embodiment, is the same as the radio wave clock 1 in FIG. 1. The structure of the radio wave reception device is the same structure replacing the signal reproduction circuit 2092 of the detection circuit 2009 that comprises the radio wave reception device 2061 of FIG. 16 to a signal reproduction circuit 2094 of a detection circuit 2009b shown in FIG. 20. Therefore, descriptions for the overlapping parts will be omitted by putting the same reference numerals.

In the signal reproduction circuit 2094, the signal Sb output from the filter circuit 2008, and the signal Sc output from the carrier extraction circuit 2091, are input to the multiplication circuit 9201. The signal output from the multiplication circuit 9201 is input to the LPF 9202.

The signal Sd output from the LPF 9202 and the signal Se3 output from the comparison circuit 2101 are input to the selection circuit 9401. The selection circuit 9401 selects either the signal Sd or Se3, and outputs the signal as detection circuit Sf30 via the LPF 9204.

Concretely, in a case where the amplification of the RF amplification circuit 2002 and IF amplification circuit 2007, which are determined according to the RF control signal Se1 and If control Se2, are in a predetermined range, and the amplitude fluctuation of the signal Sd is small, (Signal Sd of FIG. 18C), signal Se3 is selected by the selection circuit 9401. On the other hand, in a case where the amplification of the RF amplification circuit 2002 and the IF amplification circuit 2007 are not in a predetermined range, and the signal Sd fluctuates to a certain extent, being synchronized with the amplitude fluctuation of signal Sa.

As the above, by the RF amplification circuit 2002 and IF amplification circuit 2007 that amplifies the input signal according to the RF control signal Se1 and IF control signal Se2 output from the AGC circuit 2010, the amplitude fluctuation of the amplitude modulation signal that was received in the antenna 2001, can be retained at a situation close to a certain level. Therefore, it is not necessary to place a filter having a larger time constant than the cycle of the amplitude modulation signal to perform the AGC operation. Namely, a high speed AGC operation is operated without relying to the cycle of the amplitude modulation signal.

Therefore, fluctuation of the received radio wave, by transferring, etc., the radio wave clock, can be responded to at once, and time correction by the internal circuit of the radio wave clock can be precisely conducted.

Seventh Embodiment

The seventh embodiment will be described with reference to FIG. 9.

In the above first to sixth embodiment, a radio wave clock applying the present invention is described. In the present embodiment, a repeater will be described. A repeater is for example placed at the window of steel framed house, etc., where it is difficult to receive radio waves in the interior. The repeater receives a low-frequency standard radio wave and obtains correct time information, and sends this time information to the radio wave clock. The radio wave clock that is placed indoors, etc., receives the time information sent from the repeater, and conducts time correction.

Figure 9:
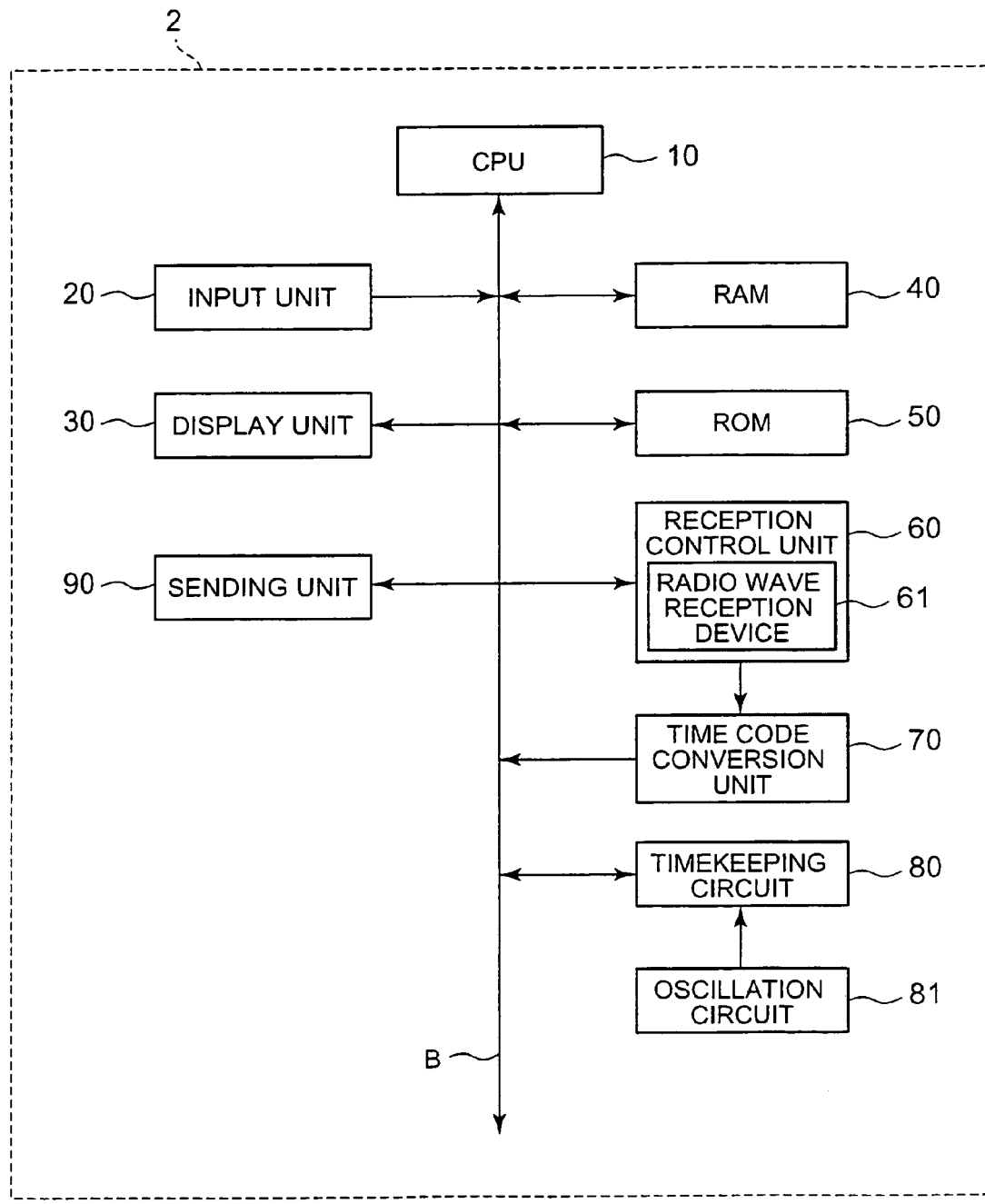
FIG. 9 is a block diagram showing the circuit structure of a repeater of the seventh and ninth embodiment.

FIG. 9 is a block diagram showing an example of a circuit structure of a repeater 2 applied in the present invention. The structure of the repeater 2 is the same structure as the radio wave clock 1 in FIG. 1, except that a sending unit is added. Therefore, descriptions for the overlapping parts will be omitted by putting the same reference numerals.

The sending unit 90 sends the standard time code input from the CPU 10, by a predetermined carrier wave, as an intermediate radio wave, by an antenna, etc. The carrier wave may be the same as the low-frequency standard radio wave that is to be received, or a dedicated radio wave as an intermediate radio wave. In a case where the carrier wave is the same as the low-frequency standard radio wave, the radio wave clock place indoors, etc., may be an ordinary radio wave clock. In a case where the carrier wave is a dedicated radio wave as an intermediate radio wave, it is necessary for the radio wave clock to comprise a means for receiving the radio wave.

As the above, by the Rf amplification circuit 2002 and IF amplification circuit 2007 that amplifies the input signal according to the RF control signal Se1 and If control signal Se2 output from the AGC circuit 2010, the amplitude fluctuation of the amplitude modulation signal that was received in the antenna 2001, can be retained at a situation close to a certain level. Therefore, it is not necessary to place a filter having a larger time constant than the cycle of the amplitude modulation signal to perform the AGC operation. Namely, a high speed AGC operation is operated without relying to the cycle of the amplitude modulation signal.

Therefore, even in a case where a repeater receives a standard radio wave signal, where the signal level fluctuates by obstacles, or weather, etc., AGC operation can be speedily performed. As a result, time correction by the internal circuit of the repeater can be precisely conducted. Furthermore, it is not necessary to design a circuit taking into consideration, the delay by the AGC operation, and complexity of radio reception devices can be prevented.

The first and second embodiment is not limited to the above embodiments, and various embodiments and changes may be made thereunto without departing from the broad spirit and scope of the invention.

Figure 21:
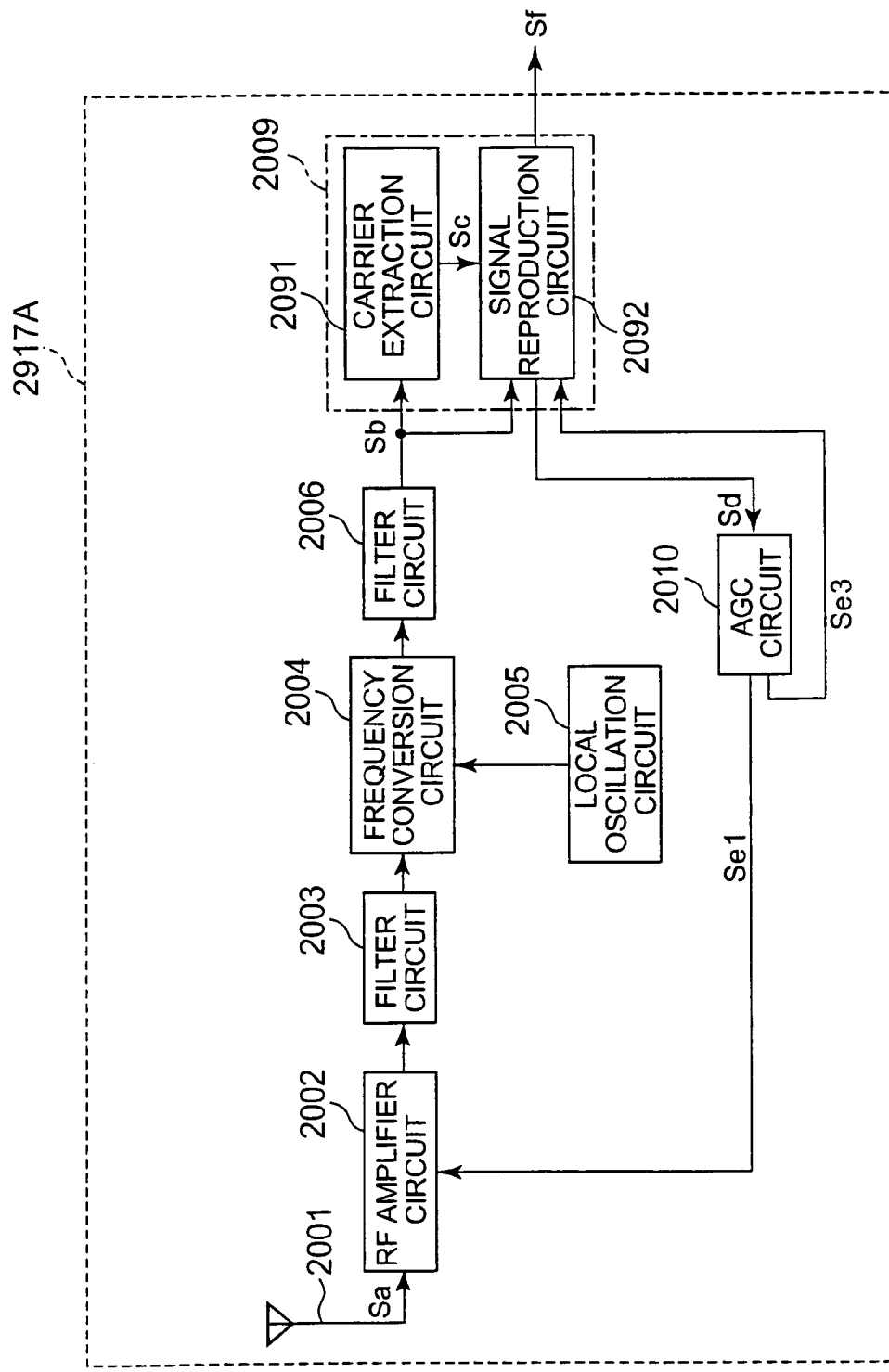
FIG. 21 is a circuit block diagram showing a modification example of the radio wave reception device.
Figure 22:
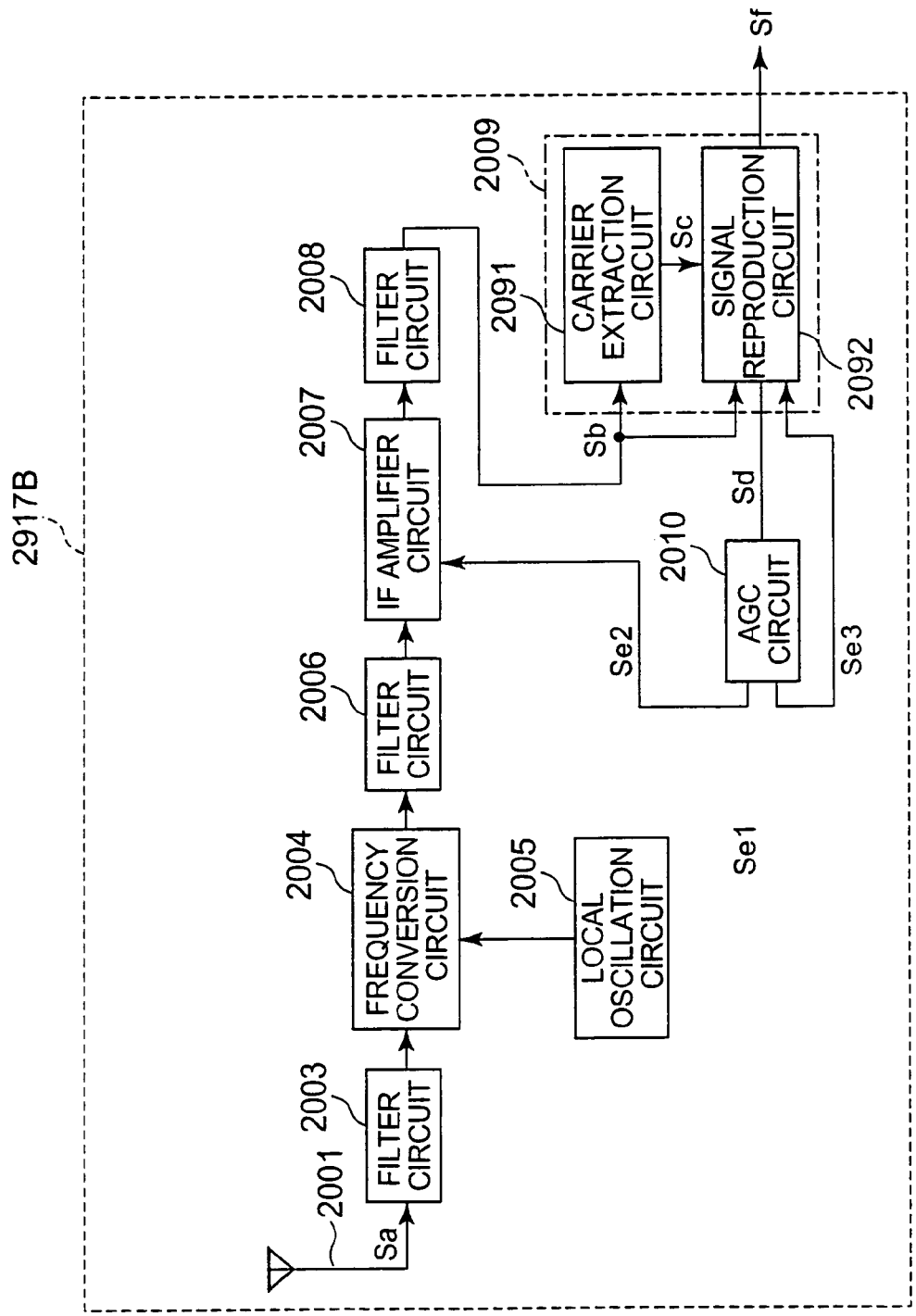
FIG. 22 is a circuit block diagram showing a modification example of the radio wave reception device.

For example, the radio wave reception device 2061 comprises an RF amplification circuit 2002 and IF amplification circuit 2007. However, the radio wave reception device 2061 may comprise either the RF amplification circuit 2002 or the IF amplification circuit 2007. Namely, the radio wave reception device may be a device such as the radio wave reception device 2971A, shown in FIG. 21. The radio wave reception device 2971A comprises an RF amplification circuit 2002, and does not comprise an IF amplification circuit 2007. The radio wave reception device may be a device such as the radio wave reception device 2971B, shown in FIG. 22. The radio wave reception device 2971B does not comprise an RF amplification circuit 2002, but comprises an IF amplification circuit 2007. The same effects as above are obtained by replacing the radio wave reception device 2061 that the radio wave clock 1 and the repeater 2 comprises, to the radio wave reception device 2971A or 2971B.

The LPFs 9204 in the signal reproduction circuits 2092, 2093, and 2094 may be placed where code L is located.

Eighth Embodiment

Figure 23:
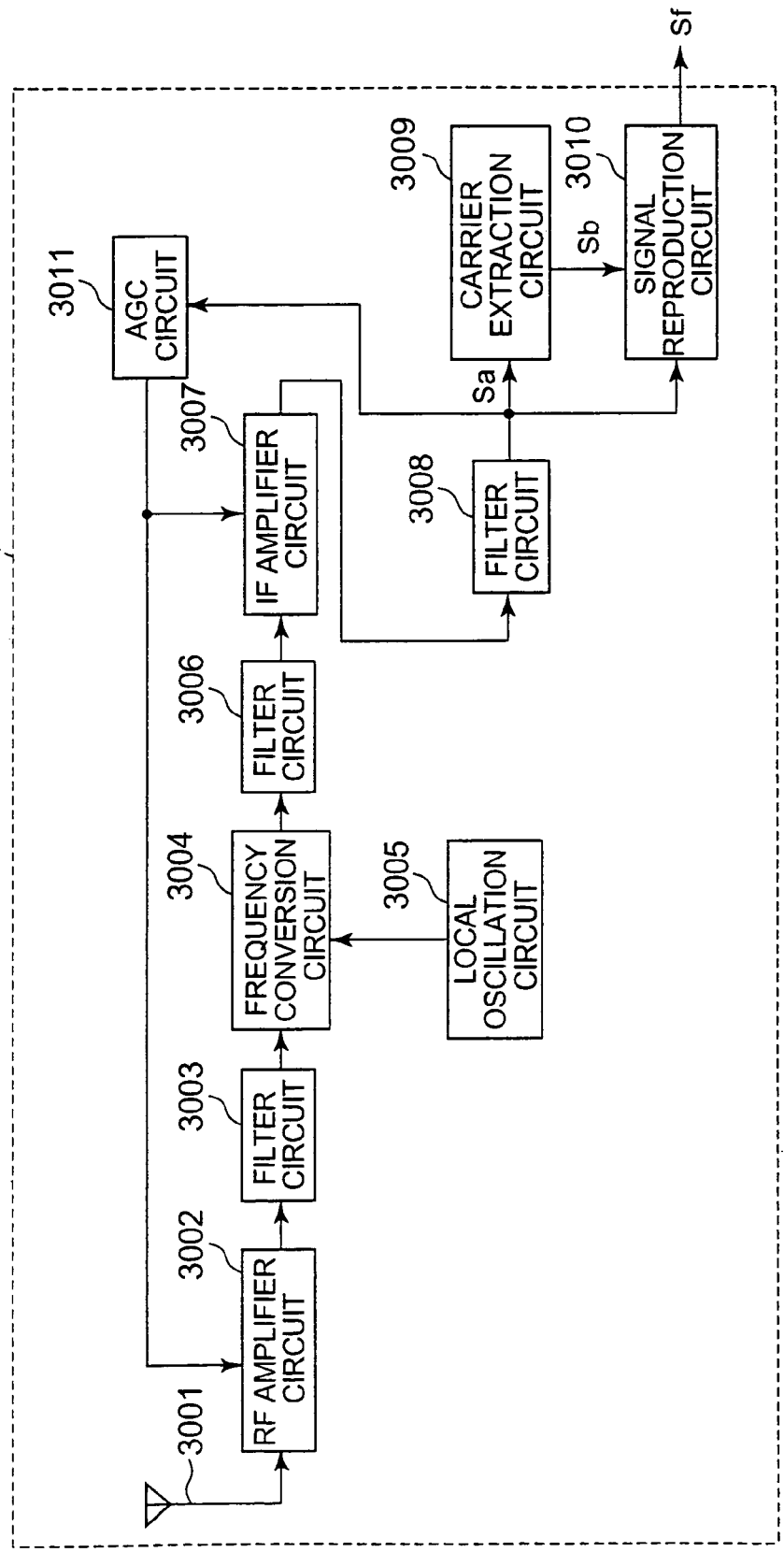
FIG. 23 is a circuit block diagram of the radio wave reception device of the eighth embodiment.

FIG. 23 is a block diagram showing a radio wave reception device 3917, employing a super heterodyne type, replacing the radio wave reception device 61 that comprises the radio wave clock 1 in the first embodiment. According to FIG. 23, the radio wave reception device 3917 is constituted comprising an antenna 3001, RF amplifier circuit 3002, filter circuits 3003, 3006, 3008, frequency conversion circuit 3004, local oscillation circuit 3005, IF amplifier circuit 3007, carrier extraction circuit 3009, signal reproduction circuit 3010, and an AGC circuit 3011.

The antenna 3001 can receive long wave standard waves, and is comprised of for example, a bar antenna, etc. The received radio wave is output, converted to an electric signal. The RF amplification circuit 3002 amplifies and outputs the signal input from the antenna 3001.

The filter circuit 3003 allows a predetermined range of frequencies relating to the signal input from the RF amplification circuit 3002, and outputs the signal, cutting off the frequency components that are out of the range. The frequency conversion circuit 3004 mixes the signal input from the filter circuit 3003 and the signal input from the local oscillation circuit 3005, and outputs the signal converting the signal to a signal of intermediate frequency. The local oscillator 3005 generates a signal of local oscillation frequency, and outputs the signal to the frequency conversion circuit 3004.

The filter circuit 3006 allows signal components having frequencies of a predetermined range to pass through, relating to the signal input from the frequency conversion circuit 3004, and cuts off frequency components that are out of the range. The IF amplification circuit 3007 amplifies and outputs the signal input from the filter circuit 3006. The filter circuit 3008 allows signal components having frequencies of a predetermined range to pass through, relating to the signal input from the IF amplification circuit 3007, i.e. outputs the signal as Sa, cutting off frequency components that are out of the range.

The carrier extraction circuit 3009 is comprised by for example a PLL (Phase Locked Loop) etc., and outputs the signal Sb that has the same frequency and same phase as the carrier (carrier wave). The signal reproduction circuit 3010 inputs the signals Sa and Sb from the filter circuit 3008 and carrier extraction circuit 3009, and outputs the signals as a baseband signal Sf. The AGC circuit 3011 outputs the control signal that adjusts the amplification of the RF amplification circuit 3002 IF amplification circuit 3007, according to the intensity of the signal Sa input from the filter circuit 3008.

Figure 24:
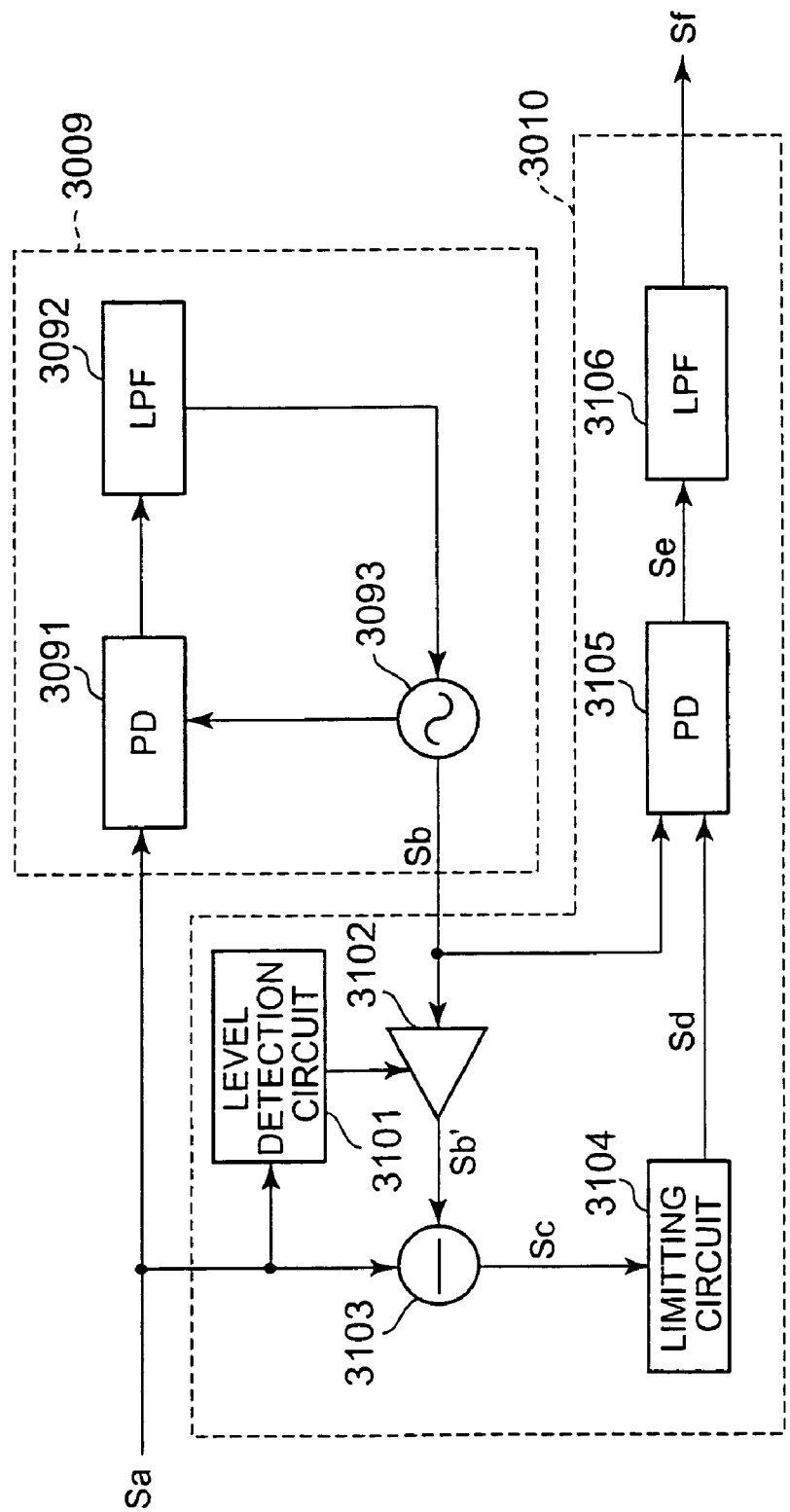
FIG. 24 is a circuit block diagram of the signal reproduction circuit of the eighth embodiment.
Figure 25A:
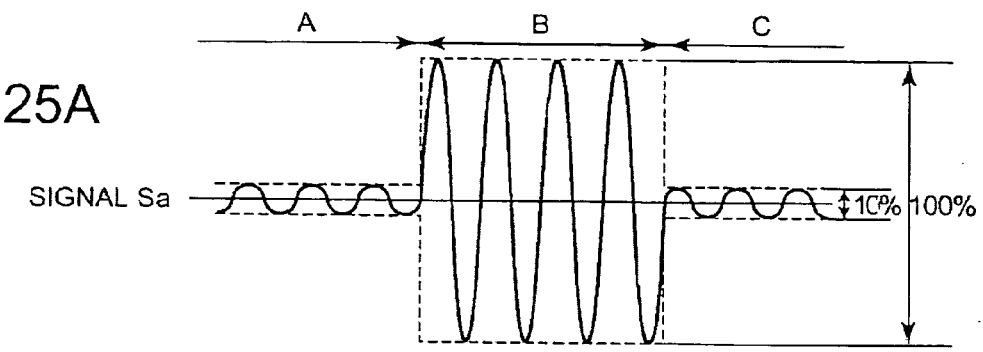
FIG. 25A is a diagram showing the wave shape of the signal Sa in the radio wave reception device of the eighth embodiment.
Figure 25B:
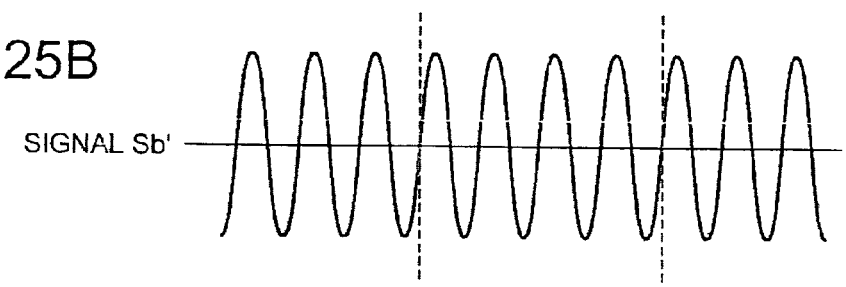
FIG. 25B is a diagram showing the wave shape of the signal Sb in the radio wave reception device of the eighth embodiment.
Figure 25C:
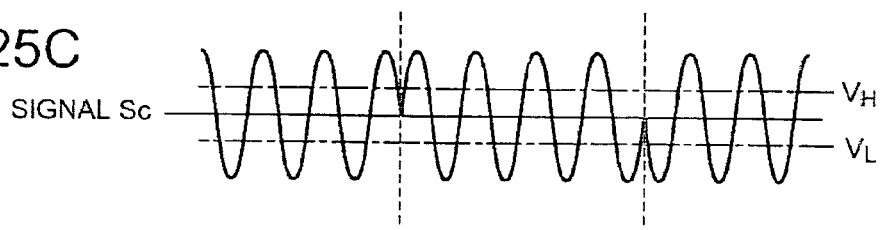
FIG. 25C is a diagram showing the wave shape of the signal Sc in the radio wave reception device of the eighth embodiment.
Figure 25D:
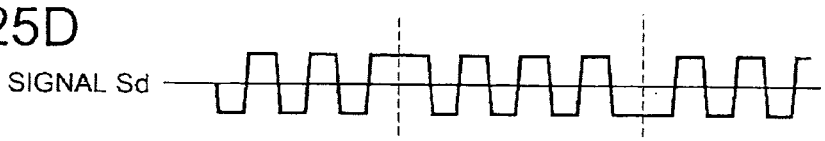
FIG. 25D is a diagram showing the wave shape of the signal Sd in the radio wave reception device of the eighth embodiment.
Figure 25E:
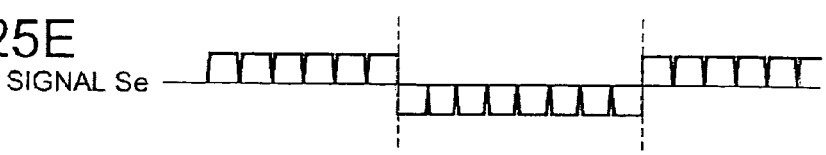
FIG. 25E is a diagram showing the wave shape of the signal Se in the radio wave reception device of the eighth embodiment.
Figure 25F:
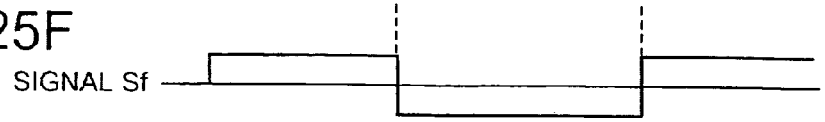
FIG. 25F is a diagram showing the wave shape of the signal Sf in the radio wave reception device of the eighth embodiment.

FIG. 24 is a block diagram showing the structure of the carrier extraction circuit 3009 and signal reproduction circuit 3010. The carrier extraction circuit 3009 comprises a PD (Phase Detector) 3091, an LPF (Low Pass Filter) 3092, and an oscillator 3093.

The PD 3091 compares the phase of the signal Sa input from the filter circuit 3008, and the phase of the signal input from the oscillator 3093, and outputs a phase-difference signal having a signal level corresponding to the detected phase difference. The PD inputs a signal based on the phase comparison result to the LPF 3092, and the LPF 3092 allows signal components having frequencies of a predetermined range (low pass), relating to the signal, to pass through, i.e. outputs a signal, cutting off the frequency components that are out of the range. The oscillator 3093 adjusts the signal that is to be oscillated based on the signal output from the LPF 3092, to output a signal that is in accordance with the phase difference of the carrier wave of signal Sa, and outputs the adjusted signal as signal Sb.

The signal reproduction circuit 3010 comprises a level detection circuit 3101, an amplifier 3102, a subtracter 3103, a limiting circuit 3104, a PD 3105 and an LPF 3106, etc. The level detection circuit 3101 detects for example, the maximum amplitude of signal Sa, and outputs a signal based on the detection result to the amplifier 3102. The amplifier 3102 amplifies the signal Sb input from the oscillator 3093 based on the signal input from the level detection circuit 3101 so that the amplitude of the signal Sc output from the subtracter 3103, which will be described later, is constant, and outputs the signal as signal Sb'.

The subtracter 3103 inputs the signal Sa from the filter circuit 3008, and the signal Sb' from the amplifier 3102, and outputs the signal Sc, subtracting the signal Sb' from the signal Sa. The limiting circuit 3104 limits the amplification of signal Sc to a predetermined range of upper limit and lower limit, and outputs the signal as signal Sd. By the limiting circuit 3104, noise that is included in the signal Sc can be eliminated to a certain extent.

The PD 3105 compares the phase of the signal Sb input from the oscillator 3193, and the phase of the signal Sd input from the limiting circuit 3104, and outputs a phase-difference signal Se having a signal level corresponding to the detected phase difference. In the present embodiment, in a case where the phase of the signal Sb input from the oscillator 3193 has the same phase as the phase of signal Sd, the PD 3105 commutates the wave shape of signal Sd to a plus direction, and outputs the signal, and in a case where the two signals have a negative phase, commutates the wave shape of signal Sd to a minus direction, and outputs the signal. The signal Se is input from the PD 3105 to the LPF 3106, and the LPF 3106 allows signal components having frequencies of a predetermined range (low pass), relating to the signal, to pass through, i.e. outputs a signal cutting off the frequency components that are out of the range.

The amplification of signal Sb' that regulates the amplification of the signal Sc, output from the subtracter 3103, will be described. The low-frequency standard radio wave has an amplitude modulation of 10% and 100%. Therefore, the signal Sa has the same amplification, and when a maximum amplification of the signal Sa is represented as X, the minimum amplification is 0.1X. It is also assumed that the amplification of signal Sb' is represented as Y. To make the absolute value of the amplification of signal Sc constant, wherein the signal Sc is gained by subtracting signal Sb' from signal Sa by the subtracter 3103, the below relation needs to be:

$$|X-Y|=|0.1X-Y|$$

$$Y=0.55X$$

Namely, by setting the amplification of signal Sb' to 55% of the maximum amplification of signal Sa, the amplification of signal Sc output from the subtracter 3103 becomes constant.

Figure 26:
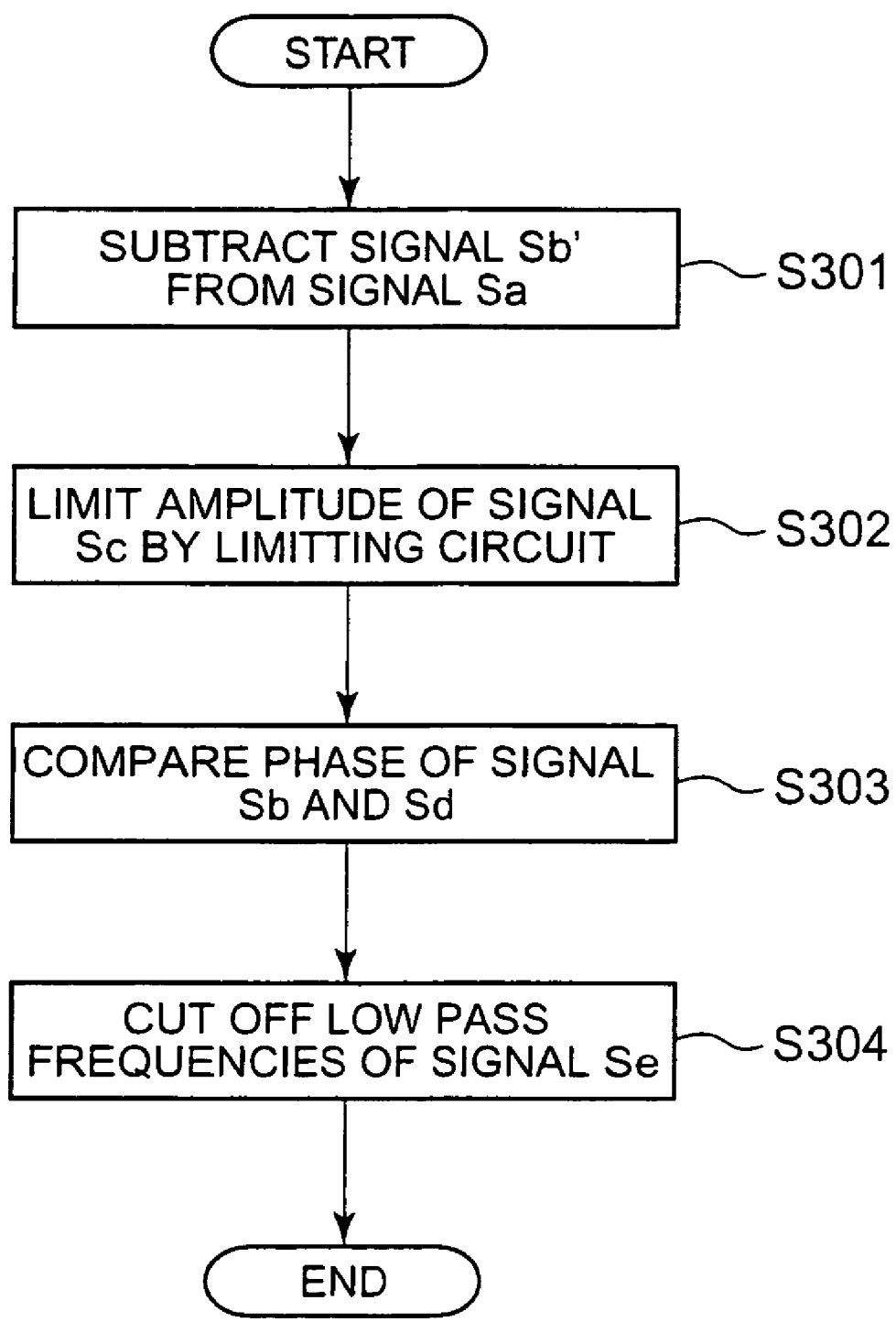
FIG. 26 is a flowchart showing the operations of the signal reproduction circuit of the eighth embodiment.

FIGS. 25A to 25F are diagrams showing the wave shape of each signal that goes through the signal reproduction circuit 3010. FIG. 26 is a flowchart showing the flow of processing of the signal reproduction circuit 3010. Below, the circuit operations of the signal reproduction circuit 3010 will be described.

First, the subtracter subtracts signal Sb' from signal Sa, and outputs signal Sc (Step S301). Here, the amplitude of signal Sa is detected by the level detection circuit 3101, and the amplifier 3102 amplifies the signal Sb based on the detection result, and outputs a signal Sb'. At this time, signal Sb' is amplified so that the amplitude of the signal Sb' is 55% of the maximum amplitude of signal Sa. By subtracting signal Sb' from signal Sa, in time zones A and C, where the modulation of amplitude of signal Sa is 10%, signal Sc has a reversed phase as signal Sb', and in a time zone B, where the modulation of amplitude of signal Sa is 100%, signal Sc has the same phase as signal Sb'.

Next, the limiting circuit 3104 cuts off amplitudes of signal Sc that are greater or equal to VH and smaller or equal to VL, and outputs a signal Sd (Step S302). The PD 3105 compares the phases of the signal Sb and signal Sd and outputs a signal Se (Step S303). Because signal Sb has the same phase as signal Sb', the wave shape of signal Sb will not be shown. In a case where signal Sb has the same phase as signal Sd (time A and C), the PD 3105 commutates signal Sb to a plus direction. In a case where the signal Sb has a revered phase of signal Sd, the signal Sd is commutated to a minus direction.

The LPF 3106 allows signal components relating to signal Se, having frequencies of a predetermined low frequency range (low pass) to pass through, i.e. outputs a signal SF, cutting off the frequency components that are out of the range.

In this way, the amplification modulation of signal Sa is converted to a phase modulation, and by determining whether that signal has the same phase or a reversed phase of signal Sb, a signal Sf that corresponds to the baseband signal of signal Sa can be gained. Therefore, even in a case where the wave shape changes, such as the amplitude of signal Sa becoming smaller, by receiving weak radio waves, because a detection is carried out placing the phase of the signal Sa as a standard, a stable detection can be carried out even when a weak radio wave is received.

Because the noise of signal Sc is eliminated by the limiting circuit 3104, a filter circuit hat has an extremely narrow band, does not have to be applied. Therefore, delay occurrence by the filter circuit can be prevented.

In the present embodiment, it is described that the amplitude of signal Sb' is 55% the maximum amplitude of signal Sa. However, the maximum amplitude of signal Sa may be 10%. Namely, when a signal that has amplitude that is 10% of the maximum amplitude of signal Sa, is subtracted from signal Sa, there is a signal at a modulation of 100%, but a signal at a modulation of 10% is erased. Therefore, by determining whether there is a signal or not by the subtraction result, it is possible to detect signal Sa.

Ninth Embodiment

In the first embodiment, the radio wave reception device included in the radio wave clock was described. In the present embodiment, a repeater will be described. A repeater is for example placed at the window of steel framed house, etc., where it is difficult to receive radio waves in the interior. The repeater receives a low-frequency standard radio wave and obtains correct time information, and sends this time information to the radio wave clock. The radio wave clock that is placed indoors, etc., receives the time information sent from the repeater, and conducts time correction.

FIG. 9 is a circuit structure of the repeater 2. The structure of the repeater in the present embodiment, is the same as the structure of the radio wave clock 1 of FIG. 1, except that a sending unit 90 is added. The structure of the radio wave reception device is the same as the radio wave reception device 3917 of FIG. 23.

The sending unit 90 sends the standard time code input from the CPU 10, by a predetermined carrier wave, as an intermediate radio wave, by an antenna, etc. The carrier wave may be the same as the low-frequency standard radio wave that is to be received, or a dedicated radio wave as an intermediate radio wave. In a case where the carrier wave is the same as the low-frequency standard radio wave, the radio wave clock placed indoors, etc., may be an ordinary radio wave clock. In a case where the carrier wave is a dedicated radio wave as an intermediate radio wave, it is necessary for the radio wave clock to comprise a means for receiving the radio wave.

By the above, because the repeater converts the amplitude modulation of the intermediate frequency signals to phase modulation, and detects by setting the phase as the standard, even when the wave shape of the intermediate frequency signals are changed by receiving weak radio waves, the standard time code can be detected, and stable repeater radio waves can be received at all times.

The eighth and ninth embodiments are not limited to the above embodiment, and various embodiments and changes may be made thereunto without departing from the broad spirit and scope of the invention.

Tenth Embodiment

Figure 27:
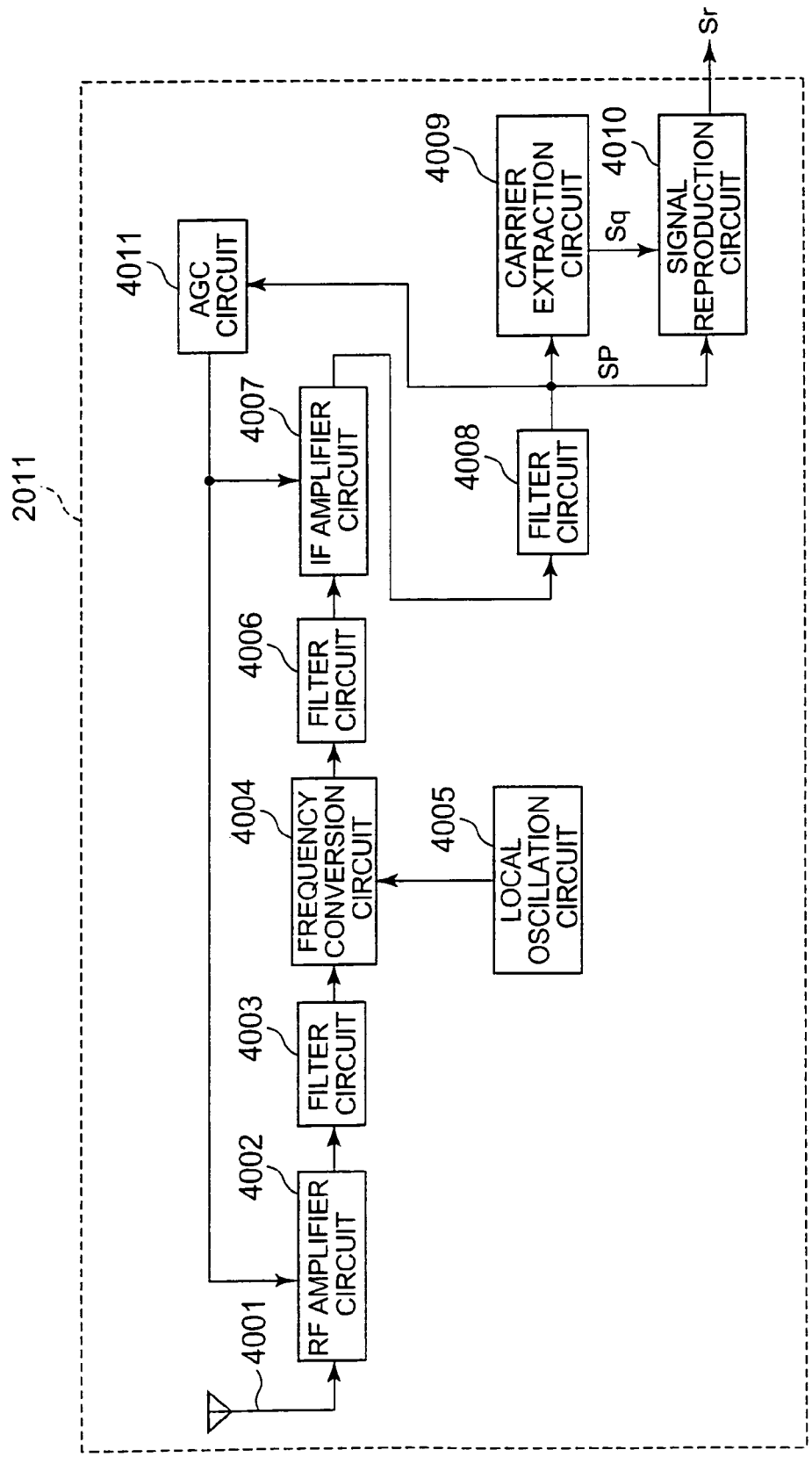
FIG. 27 is a circuit block diagram of the radio wave reception device of the tenth embodiment.

FIG. 27 is a block diagram showing a radio wave reception device 4917, employing a super heterodyne type, replacing the radio wave reception device 61 that comprises the radio wave clock 1 in the first embodiment. According to FIG. 27, the radio wave reception device 4917 is constituted comprising an antenna 4001, RF amplifier circuit 4002, filter circuits 4003, 4006, 4008, frequency conversion circuit 4004, local oscillation circuit 4005, IF amplifier circuit 4007, carrier extraction circuit 4009, signal reproduction circuit 4010, and an AGC (Auto Gain Control) circuit 4011.

The antenna 4001 can receive low-frequency standard radio wave, and is constituted by, for example, a bar antenna. A received radio wave is converted into an electric signal and then output. The RF amplifier circuit 4002 amplifies and outputs the signal input from the antenna 4001.

The filter circuit 4003 allows a predetermined range of signal components relating to the signal input from the RF amplifier circuit 4002 to pass through, i.e. outputs the signal, cutting off the frequency components that are out of the range. The frequency conversion circuit 4004 mixes the signal input from the filter circuit 4003 to the signal input from the local oscillation circuit 4005, and outputs the mixed signal, converting the signal to a signal of intermediate frequency. The local oscillation circuit 4005 generates a signal of local oscillation frequency, and outputs the signal to the frequency conversion circuit 4004.

The filter circuit 4006 allows signal components relating to the signal input from the RF amplification circuit 4002, having frequencies of a predetermined range to pass through, where the intermediate frequency of the intermediate frequency signal is placed in the center, i.e., the filter circuit 4006 outputs the signal cutting off the frequency components that are out of the range. The filter circuit 4008 allows signal components relating to the signal input from the IF amplification circuit 4007, having frequencies of a predetermined range to pass through, i.e. outputs a signal Sp, cutting off the frequency components that are out of the range.

The carrier extraction circuit 4009 is comprised by for example a PLL (Phase Locked Loop) etc., and outputs the signal Sq that has the same frequency and same phase as the carrier (carrier wave). The signal reproduction circuit 4010 inputs the signals Sp and Sq from the filter circuit 4008 and carrier extraction circuit 4009, and outputs the signals as a baseband signal Sr. The AGC circuit 4011 outputs the control signal that adjusts the amplification of the RF amplification circuit 4002 IF amplification circuit 4007, according to the intensity of the signal Sp input from the filter circuit 4008.

Figure 28:
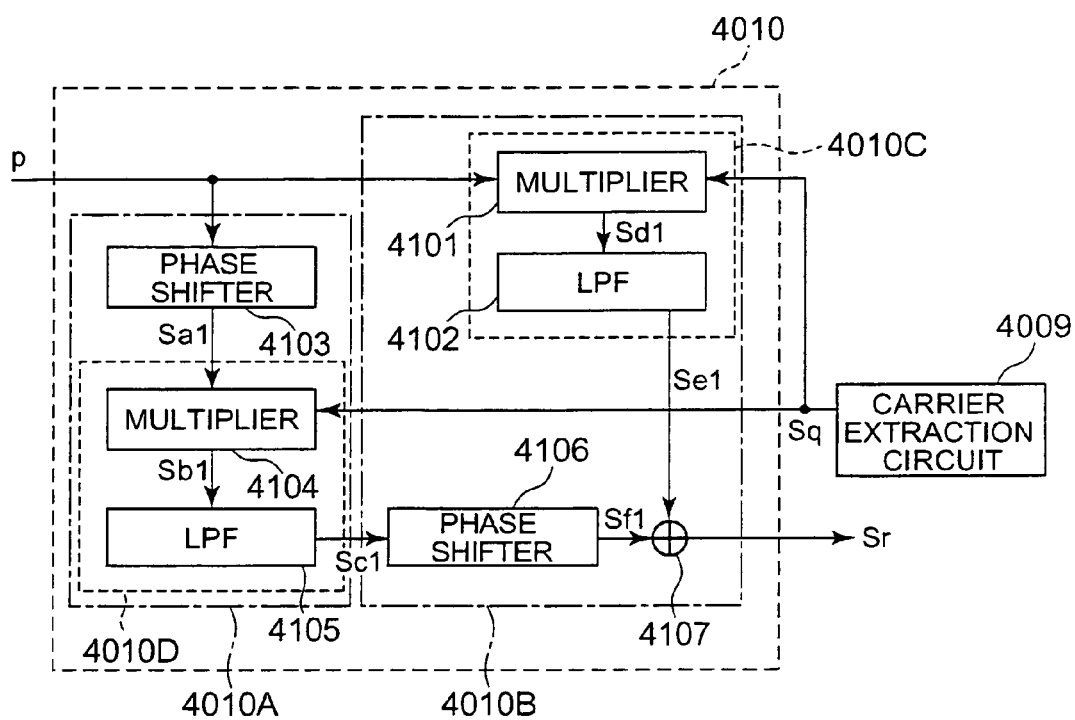
FIG. 28 is a circuit block diagram of the signal reproduction circuit of the tenth embodiment.

FIG. 28 is a circuit block diagram showing the structure of the signal reproduction circuit 4010. The signal reproduction circuit 4010 comprises multiplication circuits 4010C, 4010D, phase shifters 4103, 4106, and an adder 4107.

The multiplication circuit 4020C includes a multiplier 4101, and an LPF (Low Pass Filter) 4102. The multiplier 4101 multiplies the signal Sp input from the filter circuit 4008 and the signal Sq input from the carrier extraction circuit 4008, and outputs a signal Sd1. The LPF 4102 allows a predetermined range of frequency components relating to the signal Sd1 input from the multiplier 4101, i.e. outputs a signal Se1, cutting off the frequency components that are out of the range.

The phase shifter 4103 delays the phase 90 degrees of the signal Sc1 input from the LPF 4105, and outputs the signal as Sa1. The multiplication circuit 4010D includes a multiplier 4104 and an LPF 4105. The multiplier 4104 multiplies the signal Sa1 input from the phase shifter 4103 and the signal Sq input from the carrier extraction signal 4009, and outputs the signal Sb1. The LPF 4105 allows a predetermined range (low pass) of frequency components relating to the signal Sb1 input from the multiplier 4104, i.e. outputs a signal Sc 1, cutting off the frequency components that are out of the range.

The phase shifter 4106 delays the phase of the signal Sc1 input from the LPF 4105, and outputs the signal as Sf1. The adder 4107 adds the signal Se1 output from the LPF 4102 and the signal Sf1 output from the phase shifter 4106, and outputs a signal Sr.

Next, each signal will be described. The signal Sp output from the filter circuit 4008 includes a desired reception signal (a signal that has the desired frequency to be received), and noise. The frequency of the desired reception signal is assumed to be $\omega$, and the signal wave thereof $A \sin \omega t$. Here, amplitude A is a time function. However, the amplitude A changes at a long cycle (1/few seconds), at a low-frequency standard radio wave. Furthermore, because the modulation of amplitude A is 10% or 100%, the amplitude A is approximately a constant number. Therefore, as shown in expression (1), the signal Sp can be expressed by mixing the amplitude component A of the designated reception signal and noise amplitude component B.

[Expression 1]

$$Sp = A \sin \omega t + B[\sin\{(\omega+\Delta\omega)t+\phi\} + \cos\{(\omega+\Delta\omega)t+\phi\}] \quad (1)$$

The phase shifter 4103 inputs the signal Sp, and outputs a signal Sa1, delaying the phase of the signal 90 degrees. Therefore:

[Expression 2]

$$Sa1 = -A \cos \omega t + B[-\cos\{(\omega+\Delta\omega)t+\phi\} + \sin\{(\omega+\Delta\omega)t+\phi\}] \quad (2)$$

Because the signal Sq output from a carrier extraction signal 4009 is $\sin \omega t$, the signal Sb1 output from the multiplier 4104 is:

[Expression 3]

$$\begin{aligned}
Sa1 &= -A\cos\omega t + B[-\cos\{(\omega+\Delta\omega)t+\phi\} + \\
&\quad \sin\{(\omega+\Delta\omega)t+\phi\}]\sin\omega t \\
&= -(A/2)\sin 2\omega t + B[-\cos\omega t \cdot \cos(\Delta\omega t+\phi) + \sin\omega t \cdot \\
&\quad \sin(\Delta\omega t+\phi) + \sin\omega t \cdot \cos(\Delta\omega t+\phi) + \cos\omega t \cdot \sin(\Delta\omega t+\phi)]\sin\omega t \\
&= -(A/2)\sin 2\omega t + (B/2)[-\sin 2\omega t \cdot \cos(\Delta\omega t+\phi) + \\
&\quad (1-\cos 2\omega t) \cdot \sin(\Delta\omega t+\phi) + (1-\cos 2\omega t) \cdot \cos(\Delta\omega t+\phi) + \\
&\quad \sin 2\omega t \cdot \sin(\Delta\omega t+\phi)]
\end{aligned} \quad (3)$$

If it is assumed that cut off frequency f0 is f0<<$\omega$, in the LPF 4105, because the high frequency components are cut off, only the components shown in expression (4) are output as signal Sc1.

[Expression 4]

$$Sc1 = (B/2)[\sin(\Delta\omega t+\phi) + \cos(\Delta\omega t+\phi)] \quad (4)$$

The phase shifter 4106 inputs the signal Sc1, and outputs a signal Sf1, delaying the phase of signal Sc1 by 90 degrees. Therefore:

[Expression 5]

$$Sf1 = (B/2)[-\cos(\Delta\omega t+\phi) + \sin(\Delta\omega t+\phi)] \quad (5)$$

The multiplier 4101 multiplies signal Sp and signal Sq. Therefore signal Sd1 is:

[Expression 6]

$$\begin{aligned}
Sd1 &= [A\sin\omega t + B[\sin\{(\omega+\Delta\omega)t+\phi\}]]\sin\omega t \\
&= A\sin\omega t \cdot \sin\omega t + B[\sin\omega t \cdot \cos(\Delta\omega t+\phi) + \cos\omega t \cdot \\
&\quad \sin(\Delta\omega t+\phi) + \cos\omega t \cdot \cos(\Delta\omega t+\phi) - \sin\omega t \cdot \sin \\
&\quad (\Delta\omega t+\phi)]\sin\omega t \\
&= (A/2)(1-\cos 2\omega t) + (B/2)[(1-\cos 2\omega t) \cdot \cos(\Delta\omega t+\phi) + \\
&\quad \sin 2\omega t \cdot \sin(\Delta\omega t+\phi) + \sin 2\omega t \cdot \cos(\Delta\omega t+\phi) - \\
&\quad (1-\cos 2\omega t) \cdot \sin(\Delta\omega t+\phi)]
\end{aligned} \quad (6)$$

In LPF 4102, if the cut off frequency f0 is f0<<$\omega$, because the high frequency components are cut off, only the components shown in expression (7) are output as signal Se1.

[Expression 7]

$$Se1 = A/2 + (B/2)[\cos(\Delta\omega t+\phi) - \sin(\Delta\omega t+\phi)] \quad (7)$$

Figure 11:
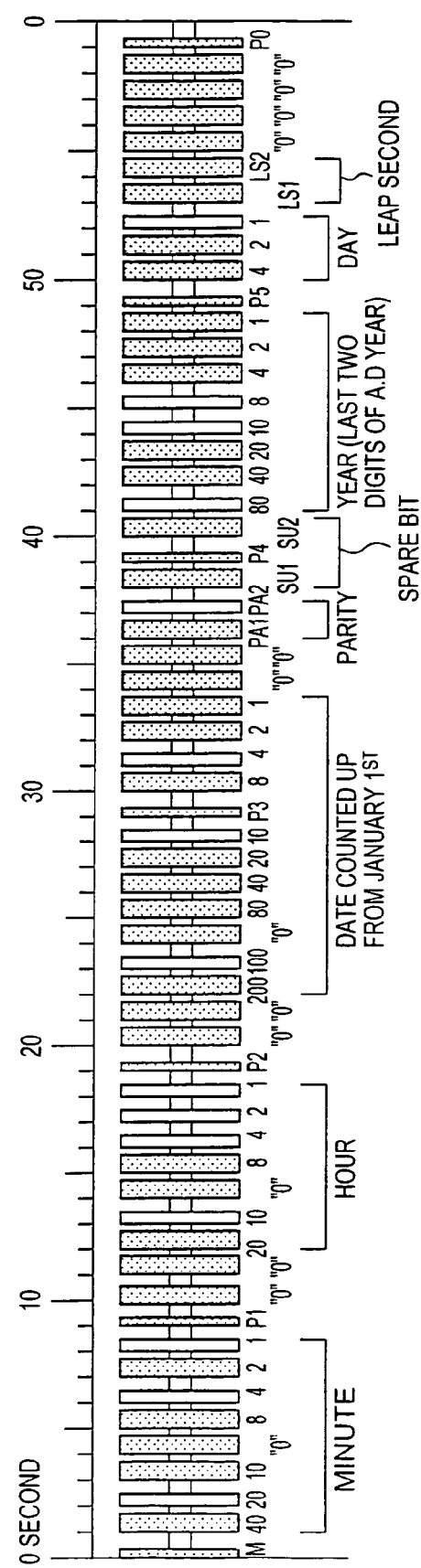
FIG. 11 is a diagram showing a time code of a low-frequency standard radio wave.

The adder 4107 inputs and adds the signal Se1 and Sf1, and outputs the signal as Sr. Therefore, signal Sr is obtained by expression (5) + expression (7):

[Expression 8]

$$Sr = Sf1 + Se1 = A/2 \quad (8)$$

and, a signal that has only the amplitude of the desired reception signal is output. As shown in FIG. 11, because the information included in the low-frequency standard radio wave is determined by binary amplitude and pulse width, there is no problem if signal Se is ½ the amplitude of the desired reception signal.

As the above, noise is eliminated from the received radio wave, and only the components of the desired reception signal can be output. The LPFs 4102 and 4105 are low pass filters for cutting of high frequency wave components, and it is not necessary for the band width to be particularly narrow. Therefore, because it is not necessary to apply a filter circuit with a particularly narrow band with, to separate noise from the received radio wave, time delay occurring by the filter circuit can be prevented. Additionally, because the noise near the frequency of the desired reception signal, such as signals included in the filter circuit can be eliminated, the reception performance of the radio wave reception device can be improved.

Eleventh Embodiment

In the tenth embodiment, the radio wave reception device comprising the signal reproduction circuit, applying the phase shifter is described. In the present embodiment, a radio wave reception device comprising a signal reproduction circuit, applying a differentiation circuit will be described. The structure of the radio wave clock of the eleventh embodiment has the same structure as the radio wave clock 1 of FIG. 1, in the first embodiment.

Figure 29:
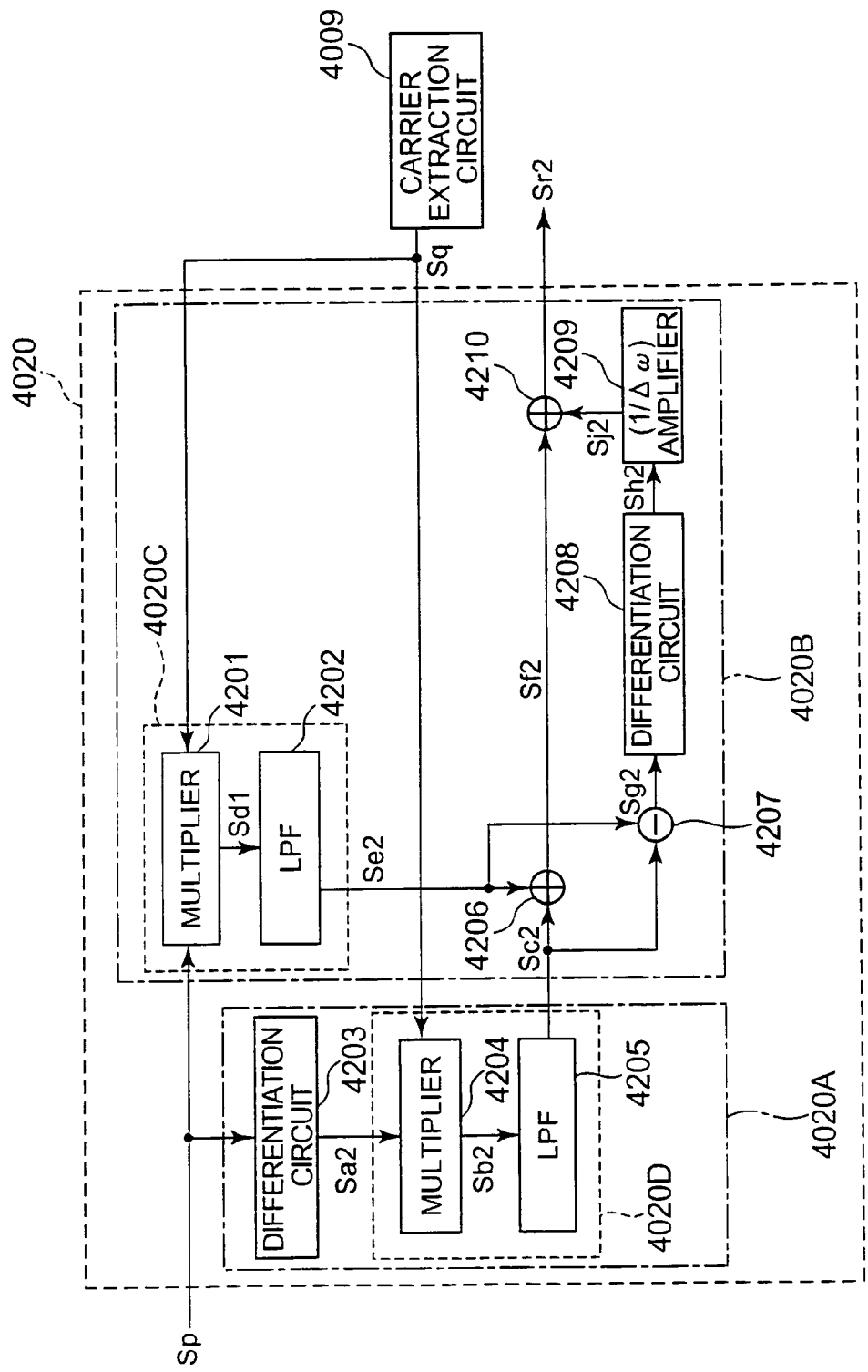
FIG. 29 is a circuit block diagram of the signal reproduction circuit of the eleventh embodiment.

The structure of the radio wave reception device is the same structure replacing the signal reproduction circuit 4010 that constitutes the radio wave reception device 4917 of FIG. 27 to a signal reproduction circuit 4020 of FIG. 29. Therefore, descriptions for the overlapping parts will be omitted by putting the same reference numerals.

FIG. 29 is a circuit block diagram showing the structure of the signal reproduction circuit 4020. The signal reproduction circuit 4020 comprises multiplication circuits 4020C, 4020D, differentiation circuits 4203, 4208, adders 4206, 4210, a subtracter 4207, and a (1/Δω) amplifier 4209.

The multiplication circuit 4020C comprises a multiplier 4201 and an LPF 4202. The multiplier 4201 multiplies the signal Sp input by the filter circuit 4008 and the signal Sq input by the carrier extraction circuit 4009, and outputs the signal as signal Sd2. The LPF 4202 allows a predetermined range (low pass) of frequency components relating to the signal Sd2 input by the multiplier 4202 to pass through, i.e. outputs a signal Se2, cutting off the frequency components that are out of the range.

The differentiation circuit 4203 carries out differentiation processing of the signal Sp input from the filter circuit 4008, and outputs the signal as Sa2. The multiplication circuit 4020D includes a multiplier 4204 and an LPF 4205. The multiplier 4204 multiplies the signal Sa2 input from the differentiation circuit 4203 and the signal Sq input from the carrier extraction circuit 4009, and outputs the signal as Sb2. The LPF 4205 allows signal components having low frequencies, relating to the signal Sb2 input from the multiplier 4204, i.e. outputs the signal Sc2, cutting off the frequency components that are out of the range. The adder 4206 adds the signal Se2 output from the LPF 4202 and the signal Sc2 output from the LPF 4205, and outputs the signal as Sf2.

The subtracer 4207 subtracts the signal Sc2 output from the LPF 4205 from the signal Se2 output from the LPF 4202, and outputs the signal as Sg2. The differentiation circuit 4208 carries out differentiation processing of the signal Sg2 input from the subtracter 4207, and outputs the signal as Sh2. The (1/Δω) amplifier 4209 multiplies the signal Sh2, which is input from the differentiation circuit 4208, by (1/Δω), and outputs the signal as Sj2. The adder 4210 adds the signal Sf2 input from the adder 4206 and the signal Sj2 input from the (1/Δω) amplifier 4209, and outputs the signal as Sr2.

The signal Sp output from the filter 4008 includes desired reception signal and noise components. The frequency of the desired reception signal is assumed to be ω, and the signal wave thereof A sin ωt. Here, amplitude A is a time function. Signal Sp can be expressed as expression (9) by mixing the amplitude component A of the desired reception signal and noise amplitude component B.

[Expression 9]

$$Sp = A\sin\omega t + B[\sin\{(\omega+\Delta\omega)t+\phi\} + \cos\{(\omega+\Delta\omega)t+\phi\}] \quad (9)$$

The differentiation circuit 4203 carries out differentiation processing of signal Sp, and outputs the signal as Sa2. Therefore:

[Expression 10]

$$Sa2 = \frac{d}{dt}(Sp)$$
$$= (A\omega)\cos\omega t + B[\cos\{(\omega+\Delta\omega)t+\phi\} - \sin\{(\omega+\Delta\omega)t+\phi\}](\omega+\Delta\omega) \quad (10)$$

Because Δ<<ω, the expression can be simplified as:

[Expression 11]

$$Sa2 = (A\omega)\cos\omega t + (B\omega)[\cos\{(\omega+\Delta\omega)t+\phi\} - \sin\{(\omega+\Delta\omega)t+\phi\}] \quad (11)$$

Because the signal Sq output from the carrier extraction signal 4009 is sin ωt, he signal Sb2 output from the multiplier 4204 is:

[Expression 12]

$$\begin{aligned}Sb2 &= [(A\omega)\cos\omega t + (B\omega)[\cos\{(\omega+\Delta\omega)t+\phi\} - \\ &\quad \sin\{(\omega+\Delta\omega)t+\phi\}]]\sin\omega t \\ &= \{A\omega/2\}\sin 2\omega t + (B\omega)[\cos\omega t \cdot \cos(\Delta\omega t+\phi) - \\ &\quad \sin\omega t \cdot \sin(\Delta\omega t+\phi) - \sin\omega t \cdot \cos(\Delta\omega t+\phi) - \\ &\quad \sin(\Delta\omega t+\phi)]\sin\omega t \\ &= \{A\omega/2\}\sin 2\omega t + (B\omega/2)[\sin 2\omega t \cdot \cos(\Delta\omega t+\phi) - \\ &\quad (1-\cos 2\omega t)\cdot\sin(\Delta\omega t+\phi) - (1-\cos 2\omega t)\cdot \\ &\quad \cos(\Delta\omega t+\phi) - \sin 2\omega t \cdot \sin(\Delta\omega t+\phi)]\end{aligned} \quad (12)$$

In the LPF 4205, if it is assumed that the cut off frequency f0 is f0<<ω, because the high frequency components are cut off, only the components shown in expression (13) are output as signal Sc2.

[Expression 13]

$$Sc2 = (B\omega/2)[-\sin(\Delta\omega t+\phi) - \cos(\Delta\omega t+\phi)] \quad (13)$$

The multiplier 4201 multiplies signal Sp and signal Sq. Therefore, signal Sd2 is:

[Expression 14]

$$\begin{aligned}Sd2 &= [A\sin\omega t + B[\sin\{(\omega+\Delta\omega)t+\phi\} + \cos\{(\omega+\Delta\omega)t+\phi\}] \\ &\quad \sin\omega t] \\ &= A\sin\omega t \cdot \sin\omega t + B[\sin\omega t \cdot \cos(\Delta\omega t+\phi) + \cos\omega t \cdot \sin \\ &\quad (\Delta\omega t+\phi) + \cos\omega t \cdot \cos(\Delta\omega t+\phi) - \sin\omega t \cdot \sin(\Delta\omega t+\phi)] \\ &\quad \sin\omega t \\ &= (A/2)(1-\cos 2\omega t) + (B/2)[(1-\cos 2\omega t)\cdot\cos(\Delta\omega t+\phi) + \\ &\quad \sin 2\omega t \cdot \sin(\Delta\omega t+\phi) + \sin 2\omega t \cdot \cos(\Delta\omega t+\phi) - \\ &\quad (1-\cos 2\omega t)\cdot\sin(\Delta\omega t+\phi)]\end{aligned} \quad (14)$$

In the LPF 4202, if it is assumed that the cut off frequency f0 is f0<<ω, because the high frequency components are cut off, only the components shown in expression (15) are output as signal Se2.

[Expression 15]

$$Se2 = A/2 + (B/2)[\cos(\Delta\omega t+\phi) - \sin(\Delta\omega t+\phi)] \quad (15)$$

The adder 4206 adds the signal Sc2 and signal Se2, and outputs the signal as Sf2. The subtracter 4207 subtracts signal Sc2 from signal Se2, and outputs the signal as Sg2. Here, because ω is a constant number, signal Sf2 and Sg2 can be simplified as the below expression.

[Expression 16]

$$Sf2 = \frac{Sc2}{\omega} + Se2 = A/2 - B\sin(\Delta\omega t+\phi) \quad (16)$$

-continued

[Expression 17]

$$Sg2 = Se2 - \frac{Sc2}{\omega} = A/2 - B\cos(\Delta\omega t + \phi) \quad (17)$$

The differentiation circuit 4208 carries out differentiation processing of signal Sg2, and outputs the signal as Sh2. Therefore, if expression (17) is differentiated:

[Expression 18]

$$Sh2 = \frac{d}{dt} \cdot \{A/2 - B\cos(\Delta\omega t + \phi)\} = B \cdot \Delta\omega \cdot \sin(\Delta\omega t + \phi) \quad (18)$$

Signal Sh2 is multiplied by (1/Δω), by the (1/Δω) amplifier 4209, and the adder 4210 adds signal Sf2 and signal Sj2. Therefore:

[Expression 19]

$$Sr2 = Sf2 - \frac{Sh2}{\omega} = A/2 \quad (19)$$

and, a signal that has the amplitude of only the desired reception radio wave is output. Here, as shown in FIG. 11, because the information included in the low-frequency standard radio wave is determined by binary amplitude and pulse width, there is no problem if signal Sr2 is ½ the amplitude of the desired reception signal.

As the above, noise is eliminated from the received radio wave, and only the components of the desired reception signal can be output. The LPFs 4202 and 4205 are low pass filters for cutting of high frequency wave components, and it is not necessary for the band width to be particularly narrow. Therefore, because it is not necessary to apply a filter circuit with a particularly narrow band with, to separate noise from the received radio wave, time delay occurring by the filter circuit can be prevented. Additionally, because the noise near the frequency of the desired reception signal, such as signals included in the filter circuit can be eliminated, the reception performance of the radio wave reception device can be improved.

Twelfth Embodiment

In the tenth embodiment, a radio wave reception device comprising a signal reproduction circuit employing a phase shifter is described, and in the eleventh embodiment, a radio wave reception device comprising a signal reproduction circuit employing a differentiation circuit is described. In the present embodiment, a radio wave reception device comprising a signal reproduction circuit employing a phase shifter and a differentiation circuit will be described. The structure of the radio wave clock in the twelfth embodiment, is the same as the structure of the radio wave clock 1 of FIG. 1. The structure of the radio wave reception device is the same, except that the signal reproduction circuit 4030 shown in FIG. 30 replaces the signal reproduction circuit 4010 that constitutes the radio wave reception device 4917 shown in FIG. 27. Therefore, descriptions for the overlapping parts will be omitted by putting the same reference numerals.

Figure 30:
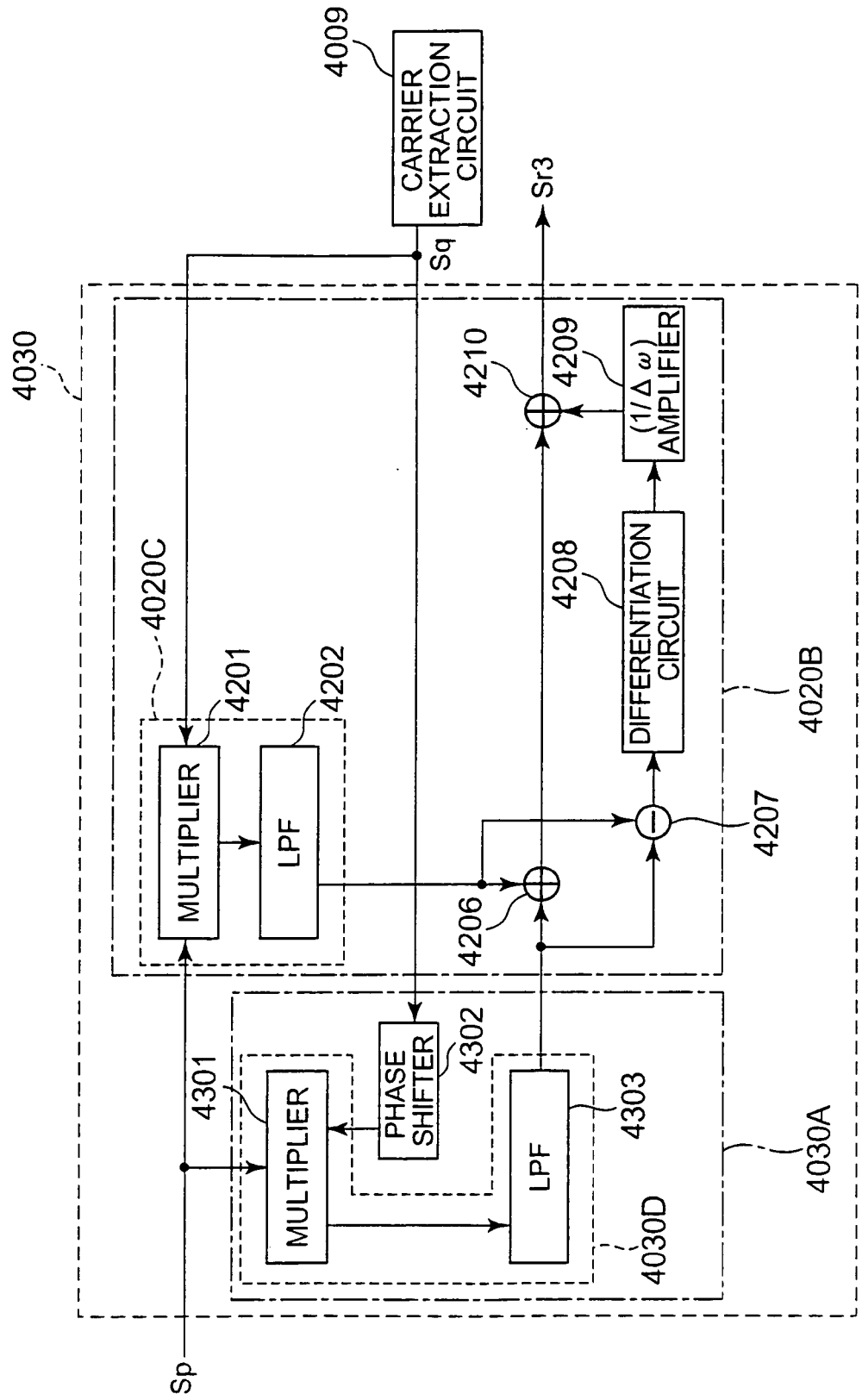
FIG. 30 is a circuit block diagram of the signal reproduction circuit of the twelfth embodiment.

FIG. 30 is a circuit block diagram showing the structure of a signal reproduction circuit 4030. The signal reproduction circuit 4030 comprises the multiplication circuit 4020C, 4030D, phase shifter 4302, adders 4206, 4210, subtracter 4207, differentiation circuit 4208 and (1/Δω) amplifier 4209. The structure of a block 4020B that includes the multiplication circuit 4020C, adders 4206, 4210, subtracter 4207, differentiation circuit 4208 and (1/Δω) amplifier 4209, is the same structure as block 4020B of the signal reproduction circuit 4020 of FIG. 29.

Block 4030A that includes a multiplication circuit 4030D and phase shifter 4302, is a modification example of block 4010A of the signal reproduction circuit 4010, shown in FIG. 28. The multiplication circuit 4030D comprises a multiplier 4301 and an LPF 4303. Concretely, in block 4010A, signal Sa1, where the phase of signal Sp is delayed 90 degrees, and signal Sq output from the carrier extraction circuit 4009 are multiplied by the multiplier 4104. However, in block 4030A, signal Sp and a signal, where the phase of signal Sq is delayed 90 degrees, is multiplied by the multiplier 4301. Here, the signal output from the multiplier 4104 and the signal output from the multiplier 4301 is the same. A signal delaying the phase 90 degrees of either the signal Sp or Sq, and the other signal Sp or Sq may be multiplied.

Because the expressions showing each signal can be calculated by the same method as described in the tenth embodiment and the eleventh embodiment, the descriptions will be omitted. However, a signal that does not include noise components, and the amplitude is ½ the amplitude of the desired reception signal, is output from the adder 4210 as signal Sr3.

As the above, noise is emitted from the received radio wave, and only the components of the desired reception signal can be output. Therefore, because it is not necessary to apply a filter circuit with a particularly narrow band with, to separate noise from the received radio wave, time delay occurring by the filter circuit can be prevented. Additionally, because the noise near the frequency of the desired reception signal, such as signals included in the filter circuit can be eliminated, the reception performance of the radio wave reception device can be improved.

Thirteenth Embodiment

In the tenth embodiment, a radio wave reception device comprising a signal reproduction circuit employing a phase shifter is described, and in the eleventh embodiment, a radio wave reception device comprising a signal reproduction circuit employing a differentiation circuit is described. In the present embodiment, a radio wave reception device comprising a signal reproduction circuit employing a phase shifter and a differentiation circuit will be described. The structure of the radio wave clock in the thirteenth embodiment, is the same as the structure of the radio wave clock 1 of FIG. 1. The structure of the radio wave reception device is the same, except that the signal reproduction circuit 4040 shown in FIG. 31 replaces the signal reproduction circuit 4010 that constitutes the radio wave reception device 4917 shown in FIG. 27. Therefore, descriptions for the overlapping parts will be omitted by putting the same reference numerals.

Figure 31:
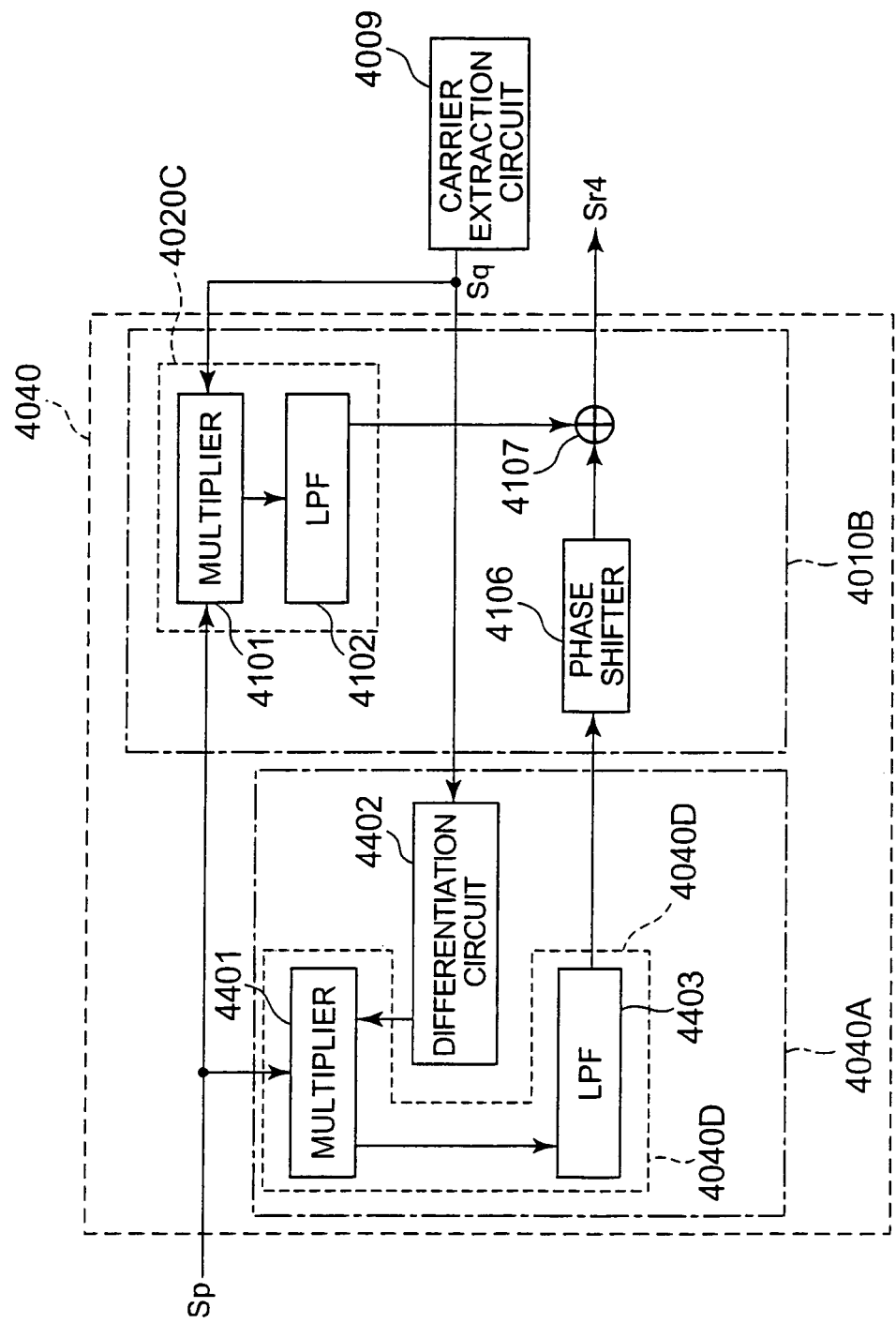
FIG. 31 is a circuit block diagram of the signal reproduction circuit of the thirteenth embodiment.

FIG. 31 is a block circuit diagram showing the structure of the signal reproduction circuit 4040. The signal reproduction circuit 4040 comprises multiplication circuits 4010C and 4040D, phase shifter 4106, adder 4107, and a differentiation circuit 4402. The structure of block 4010B that includes the multiplication circuit 4010C, phase shifter 4106, and adder 4017 is the same as the block 4010B of the signal reproduction circuit 4010, shown in FIG. 28.

Block 4040A that includes a multiplication circuit 4040D and phase shifter 4402, is a modification example of block 4020A of the signal reproduction circuit 4020, shown in FIG. 29. The multiplication circuit 4040D comprises a multiplier 4401 and an LPF 4403. Concretely, in block 4020A, signal Sa2, where signal Sp is differentiated, and signal Sq output from the carrier extraction circuit 4009 are multiplied by the multiplier 4204. However, in block 4040A, signal Sp and a signal, where the signal Sq is differentiated, are multiplied by the multiplier 4401. Here, the signal output from the multiplier 4204 and the signal output from the multiplier 4401 is the same. A signal differentiating either the signal Sp or Sq, and the other signal Sp or Sq may be multiplied.

Because the expressions showing each signal can be calculated by the same method as described in the tenth embodiment and the eleventh embodiment, the descriptions will be omitted. However, a signal that does not include noise components, and the amplitude is ½ the amplitude of the desired reception signal, is output from the adder 4107 as signal Sr4.

As the above, noise is emitted from the received radio wave, and only the components of the desired reception signal can be output. Therefore, because it is not necessary to apply a filter circuit with a particularly narrow band with, to separate noise from the received radio wave, time delay occurring by the filter circuit can be prevented. Additionally, because the noise near the frequency of the desired reception signal, such as signals included in the filter circuit can be eliminated, the reception performance of the radio wave reception device can be improved.

Various embodiments and changes may be made thereunto without departing from the broad spirit and scope of the invention. The above described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No.2002-301897 filed on Oct. 16, 2002, Japanese Patent Application No.2002-309733 filed on Oct. 24, 2002, Japanese Patent Application No.2002-343534 filed on Nov. 27, 2002, Japanese Patent Application No.2003-30857 filed on Feb. 7, 2003, and Japanese Patent Application No.2003-30868 filed on Feb. 7, 2003. The disclosure of the above Japanese Patent Applications is incorporated herein by reference in it entirety.

The invention claimed is:

1. A radio wave reception device comprising:
radio wave reception means which receives an amplitude modulation signal;
gain control means which outputs gain control signals;
amplitude modulation signal amplification means which amplifies the amplitude modulation signal received from said radio wave reception means, according to a first gain control signal output from said gain control means;
oscillation means which outputs a signal of a predetermined frequency;
frequency conversion means which mixes the signal output from said amplitude modulation signal amplification means with the signal output from said oscillation means, and outputs an intermediate frequency signal;
intermediate frequency signal amplification means which amplifies the intermediate frequency signal output from said frequency conversion means, according to a second gain control signal output from said gain control means; and
detection means which detects the signal output from said intermediate frequency signal amplification means, and outputs a detection signal,
wherein:
said detection means includes extraction means which extracts a modulation signal from the signal output by said intermediate frequency signal amplification means;
said gain control means includes gain control signal generating means which generates a third gain control signal based on a comparison of the modulation signal extracted by said extraction means with a predetermined voltage level;
said detection means further includes detection signal output means which generates and outputs said detection signal, based on the modulation signal extracted by said extraction means and the third gain control signal generated by said gain control signal generating means; and
said detection signal output means includes:
multiplication means which multiplies the modulation signal and the third gain control signal, and output means which outputs the signal multiplied by said multiplication means as said detection signal.

2. A radio wave clock comprising:
the radio wave reception device according to claim 1;
time code generating means which generates a standard time code based on a standard radio wave signal included in the amplitude modulation signal received by said radio wave reception means of said radio wave reception device;
timekeeping means which time keeps a present time; and
correction means which corrects the present time, time kept by said timekeeping means, based on the standard time code generated by said time code generating means.

3. A repeater comprising:
the radio wave reception device according to claim 1;
time code generating means which generates a standard time code based on a standard radio wave signal included in the amplitude modulation signal received by said radio wave reception means of said radio wave reception device; and
sending means which sends the standard time code generated by said time code generating means.

4. A radio wave reception device comprising:
radio wave reception means which receives an amplitude modulation signal;
gain control means which outputs gain control signals;
amplitude modulation signal amplification means which amplifies the amplitude modulation signal received from said radio wave reception means, according to a first gain control signal output from said gain control means;
oscillation means which outputs a signal of a predetermined frequency;
frequency conversion means which mixes the signal output from said amplitude modulation signal amplification means with the signal output from said oscillation means, and outputs an intermediate frequency signal;
detection means which detects the signal output from said frequency conversion means, and outputs a detection signal,
wherein:
said detection means includes extraction means which extracts a modulation signal from the signal output by said frequency conversion means;

said gain control means includes gain control signal generating means which generates a second gain control signal based on a comparison of the modulation signal extracted by said extraction means with a predetermined voltage level;

said detection means further includes detection signal output means which generates and outputs said detection signal, based on the modulation signal extracted by said extraction means and the second gain control signal generated by said gain control signal generating means; and said detection signal output means includes: adding means which adds the modulation signal and the second gain control signal, and output means which outputs the signal added by said adding means as said detection signal.

5. A radio wave clock comprising:

the radio wave reception device according to claim 4;

time code generating means which generates a standard time code based on a standard radio wave signal included in the amplitude modulation signal received by said radio wave reception means of said radio wave reception device;

timekeeping means which time keeps a present time; and correction means which corrects the present time, time kept by said timekeeping means, based on the standard time code generated by said time code generating means.

6. A repeater comprising:

the radio wave reception device according to claim 4;

time code generating means which generates a standard time code based on a standard radio wave signal included in the amplitude modulation signal received by said radio wave reception means of said radio wave reception device; and sending means which sends the standard time code generated by said time code generating means.

7. A radio wave reception device comprising:

radio wave reception means which receives an amplitude modulation signal;

gain control means which outputs gain control signals;

oscillation means which outputs a signal of a predetermined frequency;

frequency conversion means which mixes the amplitude modulation signal received from said radio wave reception means with the signal output from said oscillation means, and outputs an intermediate frequency signal;

intermediate frequency signal amplification means which amplifies the intermediate frequency signal output from said frequency conversion means, according to a first gain control signal output from said gain control means; and detection means which detects the signal output from said intermediate frequency signal amplification means, and outputs a detection signal, wherein:

said detection means includes extraction means which extracts a modulation signal from the signal output by said intermediate frequency signal amplification means;

said gain control means includes gain control signal generating means which generates a second gain control signal based on a comparison of the modulation signal extracted by said extraction means with a predetermined voltage level;

said detection means further includes detection signal output means which generates and outputs said detection signal, based on the modulation signal extracted by said extraction means and the second gain control signal generated by said gain control signal generating means; and said detection signal output means includes: selection means which selects either the modulation signal or the second gain control signal, and output means which outputs the signal selected by the selection means as said detection signal.

8. A radio wave clock comprising:

the radio wave reception device according to claim 7;

time code generating means which generates a standard time code based on a standard radio wave signal included in the amplitude modulation signal received by said radio wave reception means of said radio wave reception device;

timekeeping means which time keeps a present time; and correction means which corrects the present time, time kept by said timekeeping means, based on the standard time code generated by said time code generating means.

9. A repeater comprising:

the radio wave reception device according to claim 7;

time code generating means which generates a standard time code based on a standard radio wave signal included in the amplitude modulation signal received by said radio wave reception means of said radio wave reception device; and sending means which sends the standard time code generated by said time code generating means.

* * * * *